United States Patent
Bayindir et al.

(10) Patent No.: US 7,292,758 B2
(45) Date of Patent: Nov. 6, 2007

(54) OPTOELECTRONIC FIBER PHOTODETECTOR

(75) Inventors: Mehmet Bayindir, Somerville, MA (US); Fabien Sorin, Cambridge, MA (US); Ayman F. Abouraddy, Boston, MA (US); Dursen Saygin Hinczewski, Cambridge, MA (US); Ofer Shapira, Cambridge, MA (US); Jerimy Arnold, Cambridge, MA (US); Jean F. Viens, Boston, MA (US); Yoel Fink, Brookline, MA (US); John D. Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/173,827

(22) Filed: Jul. 1, 2005

(65) Prior Publication Data

US 2007/0019917 A1      Jan. 25, 2007

Related U.S. Application Data

(63) Continuation-in-part of application No. 10/890,948, filed on Jul. 14, 2004.

(60) Provisional application No. 60/584,954, filed on Jul. 2, 2004, provisional application No. 60/539,470, filed on Jan. 27, 2004, provisional application No. 60/487,125, filed on Jul. 14, 2003.

(51) Int. Cl.
*G02B 6/26* (2006.01)
*G02B 6/44* (2006.01)
*G02B 6/02* (2006.01)
*G02B 6/036* (2006.01)

(52) U.S. Cl. ............... 385/101; 385/39; 385/127

(58) Field of Classification Search .......... 385/39, 385/101, 127
See application file for complete search history.

(56) References Cited

U.S. PATENT DOCUMENTS 4,890,898 A    1/1990  Bentley et al.

(Continued)

FOREIGN PATENT DOCUMENTS

WO    WO 02/061467 A2    8/2002

(Continued)

OTHER PUBLICATIONS

El-Sayed, S.M. "Far-infrared Studies of the Amorphous SbxGe28-xSe72 Glassy Semiconductor." Semiconductor Science and Technology. vol. 18, Mar. 3, 2003, pp. 337-341.*

(Continued)

*Primary Examiner*—Michelle Connelly-Cushwa
*Assistant Examiner*—Rhonda S. Peace
(74) *Attorney, Agent, or Firm*—Theresa A. Lober

(57) ABSTRACT

The invention provides an optical fiber photodetector including a photoconductive element, such as a semiconducting element, having a fiber length. The semiconducting element is characterized as a non-composite material in at least one fiber direction. At least one pair of conducting electrodes is in contact with the semiconducting element along the fiber length, and an insulator is provided along the fiber length. An optical resonator can be disposed along the fiber length and along a path of illumination to the semiconducting element. The resonator is dimensioned to substantially reflect all illumination wavelengths except for a prescribed range of wavelengths transmitted to the semiconducting element. The fiber photodetector can be arranged in a photodetecting fiber grid, photodetecting fiber fabric, or other configuration for detecting incident illumination.

77 Claims, 22 Drawing Sheets

U.S. PATENT DOCUMENTS

| | | | |
|---|---|---|---|
| 5,042,903 | A | 8/1991 | Jakubowski |
| 5,557,698 | A | 9/1996 | Gareis et al. |
| 5,815,627 | A | 9/1998 | Harrington |
| 6,078,707 | A * | 6/2000 | Yamamoto et al. ............ 385/14 |
| 6,239,422 | B1 * | 5/2001 | Vang et al. ............... 250/208.2 |
| 6,418,248 | B1 * | 7/2002 | Hayes ......................... 385/24 |
| 6,573,813 | B1 | 6/2003 | Joannopoulos et al. |
| 6,756,576 | B1 * | 6/2004 | McElroy et al. .......... 250/208.1 |
| 6,856,733 | B2 * | 2/2005 | Zheng .......................... 385/39 |
| 6,984,598 | B1 * | 1/2006 | Hilton, II .................... 501/37 |
| 7,054,513 | B2 * | 5/2006 | Herz et al. .................... 385/12 |
| 2002/0081714 | A1 * | 6/2002 | Jain et al. ................. 435/287.2 |
| 2002/0185968 | A1 * | 12/2002 | Ohkubo ..................... 313/504 |
| 2003/0049003 | A1 | 3/2003 | Ahmad et al. |
| 2004/0179796 | A1 | 9/2004 | Jakobsen et al. |
| 2004/0179806 | A1 * | 9/2004 | Block et al. ................. 385/146 |
| 2004/0258376 | A1 | 12/2004 | Fokine et al. |
| 2005/0024512 | A1 * | 2/2005 | Moini et al. ................. 348/294 |
| 2005/0040374 | A1 | 2/2005 | Chittibabu et al. |
| 2005/0081913 | A1 * | 4/2005 | Ebbesen et al. ............ 136/291 |
| 2005/0157997 | A1 * | 7/2005 | McCarthy et al. .......... 385/123 |
| 2005/0211294 | A1 * | 9/2005 | Chittibabu et al. ......... 136/263 |

FOREIGN PATENT DOCUMENTS

| | | |
|---|---|---|
| WO | WO 03/079073 A1 | 9/2003 |
| WO | WO 03/093884 A2 | 11/2003 |
| WO | WO 2004/052078 A2 | 6/2004 |

OTHER PUBLICATIONS

Lide, David. Handbook of Chemistry and Physics. 79th Edition. CRC Press. New York, NY. 1998. pp. 12-127.*

Miyagi et al., "Fabrication of germanium-coated nickel hollow waveguides for infrared transmission," Appl. Phys. Lett., V. 43, N. 5, pp. 430-432, Sep. 1, 1983.

Matsuura et al., "Hollow glass waveguides with three-layer dielectric coating fabricated by chemical vapor deposition," J. Opt. Soc. Am. A, V. 14, N. 6, pp. 1255-1259, Jun. 1997.

Van Eijkelenborg et al., "Recent progress in microstructured polymer optical fibre fabrication and characterisation," Optical Fiber Tech., V. 9, pp. 199-209, 2003.

Large et al., "Microstructured optical fibres: why use polymers?" Proc. 29th European Conf. on Opt. Comm. (ECOC '03 Rimini) 2003.

Bayindir et al., "Metal-insulator-semiconductor optoelectronic fibres," Nature, V. 431, pp. 826-829, Oct. 14, 2004.

Patent Abstracts of Japan, vol. 005, No. 154, P-082, Sep. 29, 1981.

Szukwei et al., "Crystallization behaviour of chalcogenide glasses containing Sn," Jnl. of Non-Crystalline Solids, vol. 112, Nos. 1/3, pp. 204-206, Oct. 1, 1989.

Popescu, "STRUCTURE Modeling of CHalcogenide vitreous films by computational chemistry program," Internet Article, Online! 2002, XP002360983, URL: http://www.mir.acad.md/abstract/mjps20.

Kanamori et al., "Chalcogenide Glass Fibers for Mid-Infrared Transmission," Jnl. of Lightwave Technology, vol. LT-2, No. 5, Oct. 1984.

Monro et al., "Chalcogenide Holey Fibers," Electronic Letts. Online, vol. 36, No. 24, Nov. 2000.

Croitoru et al., "Mechanical and Optical Properties of the Chalcogenide Glass System $As_2Se(3-x)Te_x$," Jnl. of Lightwave Technology, vol. LT-5, No. 11, Nov. 1987.

Hogan, "A lighter approach to computer control," New Scientist and http://www.newscientist.com, Oct. 13, 2004.

Dume, "Composite fibres light up," http://www.physicsweb.org, Oct. 13, 2004.

Venema, "A light fabric," Nature, vol. 431, p. 749, Oct. 14, 2004.

Thomson, "MIT's novel fabrics see the light," MIT Tech Talk, p. 5, Oct. 20, 2004.

Sealy, "Shedding light on smart fabrics," Materials Today, p. 9, Dec. 2004.

Overton, "Optoelectronic fibers transmit photons and electrons," Laser Focus World, pp. 15 & 18, Dec. 2004.

Bayindir et al., "Fiber Photodetectors Codrawn From Conducting, Semiconducting, and Insulating Materials," Optics in 2004, Optics & Photonics News, p. 14 & 24, Dec. 2004.

Sorin et al., "Metal-insulator-semiconductor optoelectronic fibers," American Ceramic Society, Baltimore, MD, Apr. 12, 2005.

"Photodetecting Fiber Webs," MIT RLE Progress Report, No. 146, pp. 31-1-31-2, Feb. 2005.

* cited by examiner

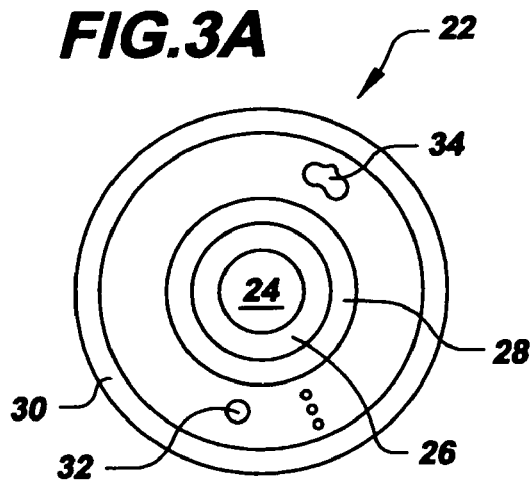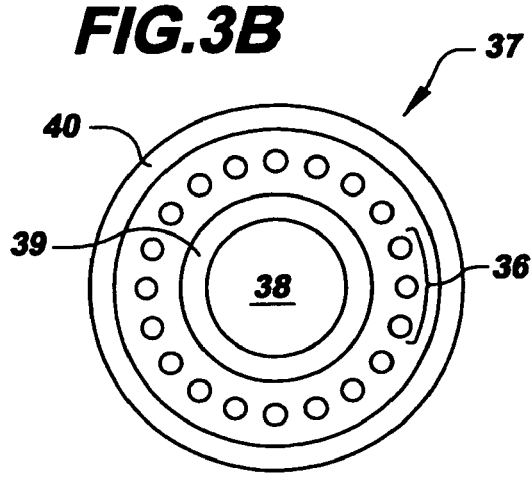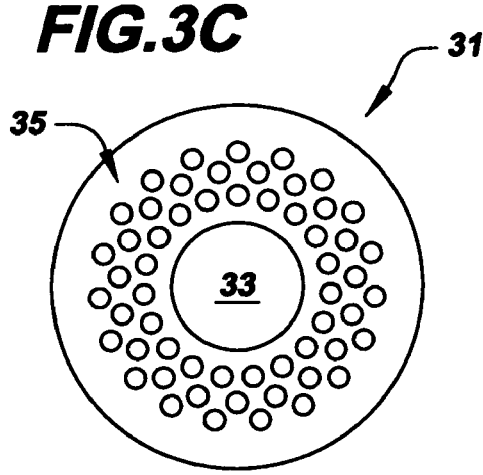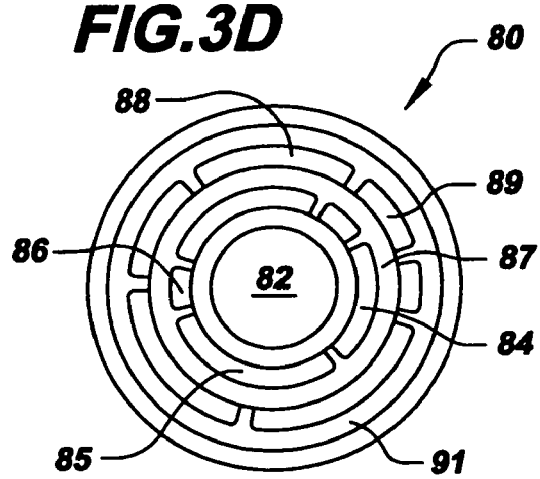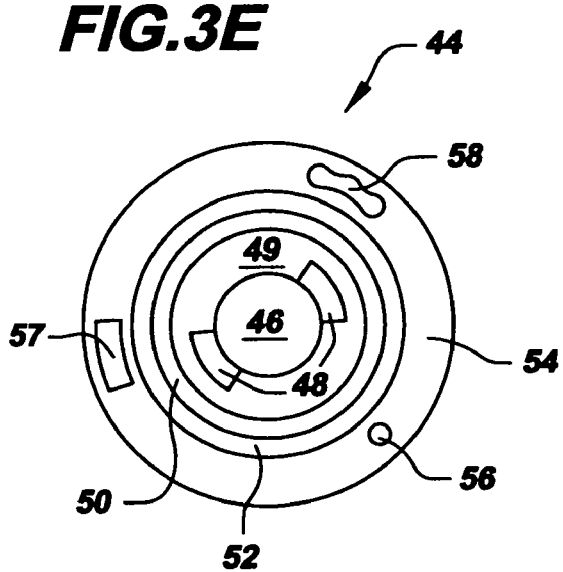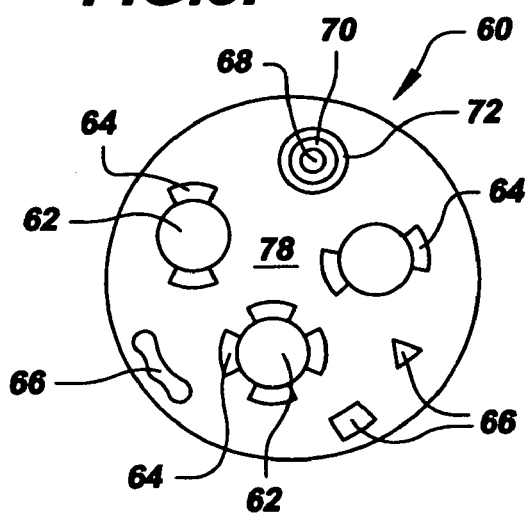

OBJECT PLANE — $d_1$ — $f$ — $d_2$ — IMAGE PLANE
235
T

INCOHERENT LIGHT SOURCE
238
236
220
d

OBJECT

1 × 1

'IMAGE' INTENSITY AT $d=8$

N=1

N=2

N=3

N=4

N=5

N=10

RECONSTRUCTED IMAGES   DETECTED IMAGES

OBJECT

NEAR FIELD PLANE

FAR FIELD PLANE

OPTOELECTRONIC FIBER PHOTODETECTOR

This application claims the benefit of U.S. Provisional Application No. 60/584,954, filed Jul. 2, 2004, the entirety of which is hereby incorporated by reference. The application is a continuation in part of copending U.S. application Ser. No. 10/890,948 filed Jul. 14, 2004, which in turn claims the benefit of U.S. Provisional Application No. 60/487,125, filed Jul. 14, 2003, and U.S. Provisional Application No. 60/539,470, filed Jan. 27, 2004, the entirety of both of which are hereby incorporated by reference.

STATEMENT REGARDING FEDERALLY SPONSORED RESEARCH

This invention was made with Government support under Contract No. DAAD19-01-0647, awarded by DARPA, under Contract No. ECS-0123460, awarded by the NSF, under Contract No. DMR 02-13282 awarded by the NSF, under contract N00014-02-1-0717 awarded by ONR, under Contract No. Y77011 awarded by AFOSR, and under Contract No. DE-FG02-99ER45778 awarded by DOE. The Government has certain rights in the invention.

BACKGROUND OF INVENTION

This invention relates generally to optical fibers, optical devices, electronic devices and optoelectronic devices and in particular relates to fiber materials selection, fiber structure design, and fiber drawing techniques for producing a fiber with desired functionality.

A combination of conducting, semiconducting, and insulating materials in well-defined geometries, prescribed micro- and nano-scale dimensions, and with intimate interfaces is essential for the realization of virtually all modern electronic and optoelectronic devices. Historically, such devices are fabricated using a variety of elaborate microfabrication technologies that employ wafer-based processing. The many wafer-based processing techniques currently available enable the combination of certain conducting, semiconducting, and insulating materials in small feature sizes and high device packing densities. But in general, microfabrication techniques are restricted to planar geometries and planar conformality and limited device extent and/or materials coverage area. Microfabricated devices and systems also in general require packaging and typically necessitate very large capital expenditures.

Conversely, modern preform-based optical fiber production techniques can yield extended lengths of material and enable well-controlled geometries and transport characteristics over such extended lengths. In further contrast to wafer-based processing, fiber preform drawing techniques are in general less costly and less complicated. But in general, preform-based optical fiber production has been restricted to large fiber feature dimensions and a relatively small class of dielectric materials developed primarily for enabling optical transmission. A wide range of applications therefore remain to be addressed due to the limitations of both conventional fiber preform-based drawing technologies and conventional microfabrication technologies.

SUMMARY OF THE INVENTION

The invention provides fiber configurations and manufacturing processes that enable optical detection as well as imaging with a single fiber, a woven mat, grid, fabric, or web of fibers, or multiple arrangements of such. The optical fiber photodetector of the invention includes a photoconductive element, such as a semiconducting element, having a fiber length. The semiconducting element can be characterized as a non-composite material in at least one fiber direction. At least one pair of conducting electrodes is in contact with the semiconducting element along the fiber length, and an insulator is provided along the fiber length. An optical resonator can be disposed along the fiber length and along a path of illumination to the semiconducting element. The resonator is dimensioned to substantially reflect all illumination wavelengths except for a prescribed range of wavelengths transmitted to the semiconducting element.

The fiber photodetector can be arranged in a photodetecting fiber grid having a plurality of rows of fiber photodetectors and a plurality of columns of fiber photodetectors. Each fiber photodetector is connected to a sensing circuit for detecting fiber grid coordinates of illumination incident on the fiber grid. Similarly, the fiber photodetector can be arranged in a photodetecting fiber fabric having a plurality of fiber photodetectors woven together, with each fiber photodetector connected to a sensing circuit for detecting illumination incident on the fiber fabric.

The fiber photodetector configurations of the invention provide the ability to interface of materials with widely disparate electrical and optical properties in a fiber while achieving submicron-scale features and arbitrary geometries over extended fiber lengths. Thus is provided by the invention the ability to produce a wide range of optoelectronic functionality at fiber-optic length scales and cost. Other features and advantages of the invention will be apparent from the following description and accompanying figures, and from the claims.

DESCRIPTION OF THE DRAWINGS

FIGS. 3A-3G are schematic cross-sectional views of example fiber geometries enabled by the processes of the invention;

DETAILED DESCRIPTION OF THE INVENTION

Figure 1A:
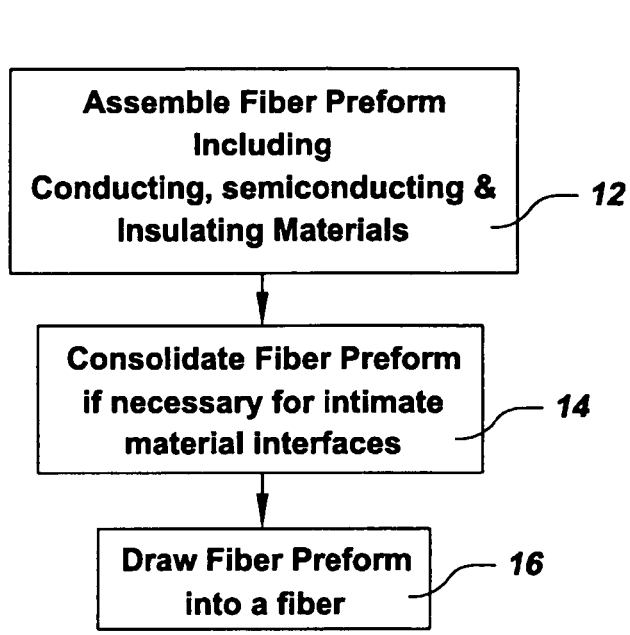
FIGS. 1A-1B are flow charts of processing steps of the fiber preform assembly and draw processes provided by the invention.

Fibers produced in accordance with the invention are three-dimensional, unsupported physical objects for which one dimension, defined as the longitudinal dimension, is substantially larger than the other two dimensions, defined as the cross sectional dimensions, and are fabricated by, e.g., the production sequence 10 outlined in the flow chart of FIG. 1A. In a first example sequence step 12, conducting, semi-conducting, and insulating materials are assembled into a fiber preform. The preform includes the selected materials arranged in a macroscopic geometric configuration corresponding to, though not necessarily equivalent to, the desired geometry of the fiber. The preform is characterized by a ratio of longitudinal to cross sectional dimensions that is typically between about 2 and about 100. Once assembled, the preform can be consolidated 14 in a next process step. The consolidation process, carried out under selected temperature and pressure conditions as described below, is employed when necessary for producing intimate material interfaces in the preform and to ensure element shape integrity throughout the draw process. The preform is then drawn 16 into a fiber that preserves the cross sectional geometric configuration of the macroscopic preform while reducing preform feature sizes to smaller scales and producing extended fiber lengths of uniform cross section.

Figure 2:
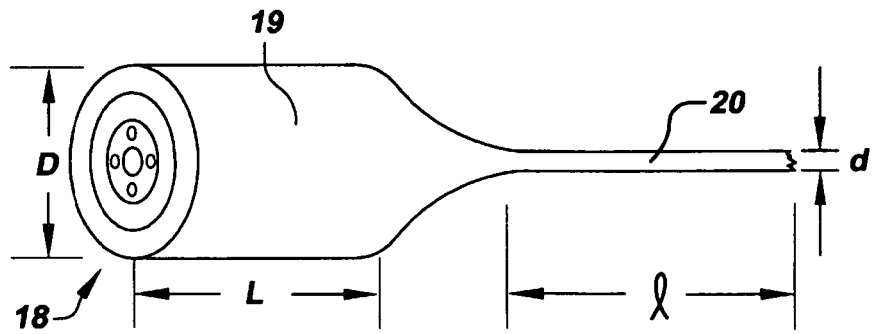
FIG. 2 is a schematic representation of a fiber preform and the corresponding fiber produced by drawing the preform in accordance with the invention.

These striking dimensional shifts produced by the fiber drawing process are schematically illustrated in FIG. 2. A macroscopic assembly 18 of conducting, semiconducting, and insulating materials is arranged as a preform 19 having a diameter, D on the order of about 10 mm to about 100 mm and a length, L, on the order of centimeters, e.g., less than 100 cm or less than 50 cm. The structured preform 19 is then subjected to heating and deformation under fiber drawing conditions to produce a fiber 20.

The resulting fiber 20 has a length, l, on the order of meters, e.g., 10 m, 20 m, 50 m, 100 m, or longer, and a diameter, d, on the order of between about 50 µm and about 2000 µm, resulting in a longitudinal-to-cross sectional ratio that can be above 1000, a length that can be more than 100 times greater than that of the preform, and a diameter that can be 10 times less than the diameter of the preform. Within the fiber, feature sizes on the order of 10's of nanometers can be produced. The fiber drawing process of the invention thereby preserves the preform's element organization along its length while forming intimate material interfaces and reducing element sizes to the micro- and nano-scale along extended fiber lengths.

As a result, the invention enables the production of extended-length fiber for combined optical and electrical transmission, as well as micro-scale microelectronic and optoelectronic device operation along the fiber axial length and/or across the fiber's cross-section, without employing wafer based microfabrication techniques. Macroscopic assembly of a preform is in general convenient and does not require exotic process techniques or equipment. The invention is not limited to a particular preform configuration or preform assembly technique. Any preform configuration and preform assembly techniques that employ conducting, semiconducting, and insulating materials that are compatible for co-drawing, as explained below, can be utilized.

FIG. 3A is a cross-sectional view of a first example fiber configuration 22 that can be produced in accordance with the invention. While this example fiber is shown having a circular cross section, such is not required; any suitable cross sectional geometry, e.g., rectangular, can be employed for the fiber as well as the elements included in the cross-sectional fiber arrangement. In the example fiber there is provided a fiber core region 24 around which are provided a number of layers 26, 28 ranging in number from one to any selected number, with a final layer 30 at the surface. The fiber core region 24 can be provided as an air core or as a solid of conducting, semiconducting, or insulating material. For example, the core region can be provided as a semiconducting or insulating material for optical transmission, with one or more outer layers 26, 28 provided as conducting materials for electrical transmission. One or more outer layers can also or alternatively be provided as semiconducting and insulating, for optical transmission, electrooptical device operation, and for electrical and optical isolation, and the core region, in concert with one or more outer layers, can provide optoelectronic device operation.

Also as shown in FIG. 3A, there can be included in the fiber 22 one or more strands 32, and other geometric elements 34 of conducting, semiconducting, or insulating materials provided along the axis of the fiber. Such elements can be incorporated in one or more layers of the fiber and can be arranged around the fiber circumference. This arrangement can be extended as shown in the example configuration 37 shown in FIG. 3B, with an array of strands 36 provided around a portion or the entire circumference of the fiber, and arranged in a desired configuration with other fiber elements, e.g., surrounding a core region 38, and optionally including one or more layers 39, 40 surrounding the core and the strands 36. The invention is not limited to a particular configuration of strands or other elements. As shown in the example fiber 31 of FIG. 3C, a multi-dimensional array of strands 35 can be provided about a core region 33 or other selected preform element. Each of the strands can be provided as conducting, semiconducting, or insulating materials.

As shown in the example fiber configuration 80 of FIG. 3D, the material layers provided about a core region 82 or other fiber geometry can be discontinuous, i.e., multiple distinct layer regions 84, 85, 86, 88, 89 can be provided as an alternative to a continuous layer. Such distinct layer regions can be provided adjacent to continuous layer regions 87, 91, and can be provided at multiple locations across the fiber cross section, and can be provided as any of conducting, semiconducting, or insulating materials.

The invention contemplates fiber geometries in which arrangements of conducting, semiconducting, and insulating elements are provided in intimate interfacial contact that enables optoelectronic device operation. For example, as shown in FIG. 3E, there can be provided a fiber configuration 44 in which a core region 46 is adjacent to and in contact with one or more regions that can be provided as conducting electrodes 48. While the illustrated example shows two electrodes, it is to be recognized that any number of electrodes can be included. In this example, discussed in detail below, the core region 46 can be provided of a material, such as a insulator or semiconductor, that is selected for interaction with and/or control by the adjacent electrodes 48. The core region 46 and adjacent regions 48 thereby are provided as optoelectronic device elements within the fiber.

The region 49 directly surrounding the electrodes can be provided as a suitable material, e.g., an insulating material. Indeed, the various preform regions and elements 46, 48, 49 can be provided of any of conducting, semiconducting, and insulating materials. As shown in FIG. 3E, additional layers of material 50, 52, 54 can be included around the core region and electrodes. Additionally, one or more strands 56 of material can be incorporated in one or more of the layers, and one or more electrodes 57 and/or other elements 58 can similarly be incorporated in the layers.

Turning to FIG. 3F, in a further example fiber configuration 60 provided by the invention, multiple cores 62 and/or strands and other elements 66, 68, of arbitrary geometry, can be included in the fiber in a desired arrangement across the fiber cross-section. Multiple core regions 62 and/or strands can be provided with adjacent regions 64, e.g., electrodes, in any desired arrangement, e.g., as one or more pairs of electrodes. The fiber strands 68 as well as the core regions can also be individually axially surrounded by additional material layers 70, 72 or by other fiber elements. Finally, if desired, the fiber can include one or more material layers that surround a material region 78 in which the various elements are provided. No particular symmetry is required between the various cores, strands, and other elements included in the fiber.

The examples of FIGS. 3A-3F demonstrate several particular advantages of the fiber and fiber drawing processes of the invention. Conducting, semiconducting, and insulating materials can be disposed in selected configurations that enable the production of optical and electronic functional elements, e.g., optoelectronic device elements, within the fiber cross section. The fiber can include hollow regions or can be characterized by an all-solid cross section, i.e., a cross section having no hollow regions. The fiber elements do not need to display the symmetry of the fiber outer perimeter or if hollow, the fiber inner perimeter. The fiber can further be characterized by cylindrical asymmetry. The fiber can include elements that have a perimeter that is a closed loop which does not contain a characteristic center of a cross section of the fiber.

There is no requirement as to the ordering of materials within the fiber of the invention, with the caveat that metal regions be geometrically confined in the manner described below. Having no such ordering requirement, the fiber of the invention can provide one or more material interfaces and/or material composition discontinuities along a path, around a cross section of the fiber, that conforms to a fiber perimeter. In other words, along a path around the fiber cross section that is a fixed distance from the fiber periphery at all points of the path, material interfaces and/or material composition discontinuities can be provided. For specific geometries, such a path can be considered a circumferential path. This condition enables a wide range of fiber geometries, including, e.g., conducting electrodes at locations of the fiber cross section, across which can be sustained an applied voltage.

Figure 3G:
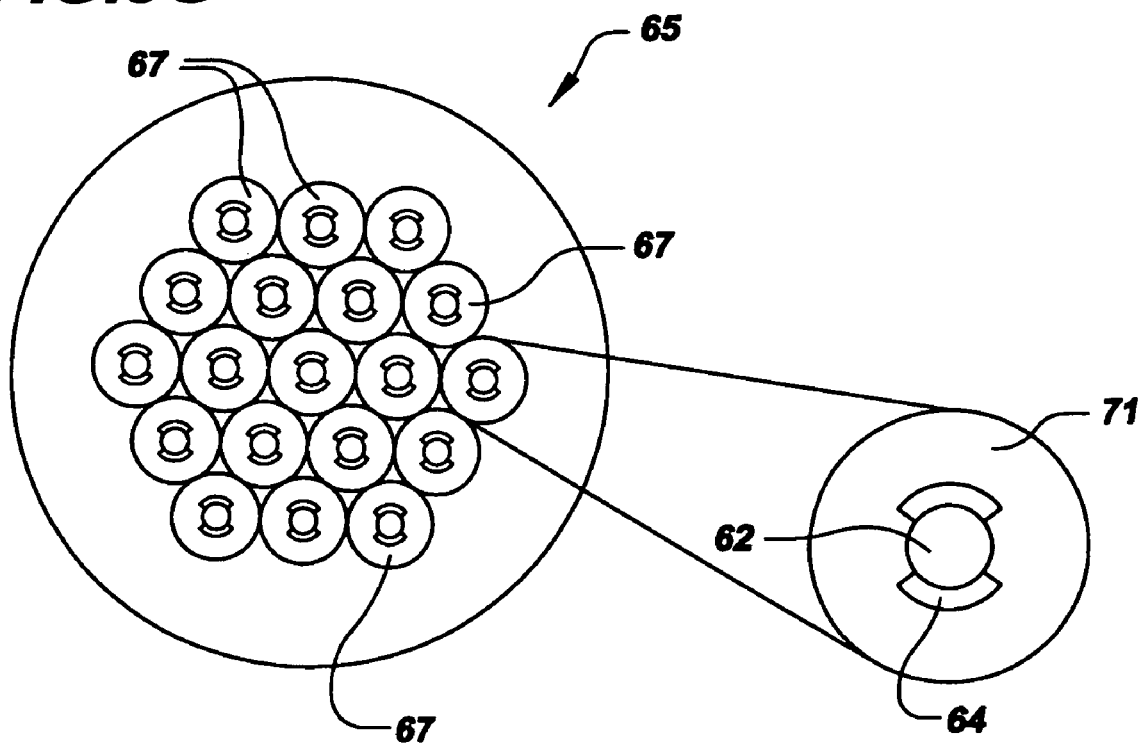

The fiber configuration of FIG. 3F can be adapted, however, with a selected symmetry and fiber element configuration. For example, as shown in the fiber configuration 65 of FIG. 3G, fiber elements can be arranged with a particular symmetry, e.g., in a two-dimensional sub-fiber array that can incorporate previously drawn fiber elements. In the example fiber of FIG. 3G, a number, e.g., 1000, of individually drawn sub-fibers 67, each having a selected cross section geometry that can be substantially similar or dissimilar from the other sub-fibers, are arranged as a hybrid fiber. In the example shown, each sub-fiber 67 in the hybrid fiber 65 is provided with a core region 62 and electrodes 64 adjacent to and in contact with the core region, and having an outer region 71 about the electrodes and core region. It is to be recognized that any geometry can be selected for each individual sub-fiber in the hybrid fiber, however. Additionally, the functionality of each sub-fiber in the hybrid fiber array can be selected to complement that of the other sub-fibers, and elements of the sub-fibers can be electrically or otherwise interconnected to form an integrated circuit hybrid fiber in which devices are provided across the various sub-fibers in the array.

The example fibers of FIGS. 3A-3G are provided to demonstrate the wide range of fiber configurations contemplated by the invention. Features shown in one or more of the example fibers can be selectively included in a customized fiber configuration that provides desired functionalities of optical transmission, electrical transmission, and/or optoelectronic device operation. Because the fiber configuration enables isolated arrangement of selected materials as well as intimate contact between materials, optical and electrical transmission can occur simultaneously yet separately, and in parallel with optoelectronic device operation. The materials selected for various fiber elements can be customized for a given application, with conductor-semiconductor, conductor-insulator, and semiconductor-insulator interfaces occurring throughout the fiber cross section and around the fiber circumference.

The direction of electron transmission, if such is accommodated by the fiber geometry, can coincide with or be counter to a direction of photon transmission through the fiber, if such is also accommodated by the fiber geometry. In general, the direction of electron and photon transmission can be longitudinal, i.e., along the fiber axial length, and/or radial, from a center region radially outward or from an outward region radially inward. The thicknesses of the materials included in a given fiber configuration are therefore preferably selected based on the particular fiber application and the desired direction of electronic and photonic transmission, as discussed in detail below.

Whatever fiber configuration is selected, in accordance with the invention the configuration includes conducting, semiconducting, and insulating materials arranged as layers, regions, and/or elements, with selected material interfaces, that enable desired optical and/or electrical functionality for the fiber. The conductivity of each material can be selected based on the functionality specified for that material. For example, suitable conducting materials can be characterized by a conductivity greater than about $10^2$ $1/\Omega \cdot cm$; suitable semiconducting materials can be characterized by a conductivity less than about $10^2$ $1/\Omega \cdot cm$ but greater than about $10^{-12}$ $1/\Omega \cdot cm$; and insulating materials can be characterized by a conductivity less than $10^{-12}$ $1/\Omega \cdot cm$. This example characterization of materials highlights the particular advantage of the invention in its ability to intimately incorporate materials having over ten orders of magnitude disparity in conductivity. It is to be recognized that there does not exist a well-defined, i.e., absolute, boundary in conductivity values between conductors, semiconductors, and insulators. These example values are provided as a general aid in characterizing suitable conducting, semiconducting and insulating materials for optical and electrical fiber functionality.

As explained above, the various selected materials are first assembled in a macroscopic preform and then drawn to a final fiber geometry. The thermal deformation conditions inherent in the fiber drawing process require that the conducting, semiconducting, and insulating materials selected for a given fiber configuration be compatible for co-drawing.

For clarity of discussion, it is convenient to first describe the properties of compatible semiconductor and insulating materials to be co-drawn in accordance with the invention. In general, it is recognized that materials which are amorphous and glassy are particularly well suited to be drawn from a preform into a fiber structure. The term amorphous here refers to a material morphology that is a continuous atomic network in which there is no repeating unit cell or crystalline order; a glassy material typically is not easily crystallized at high processing temperatures. For many applications, it can be preferred to select semiconducting and insulating fiber materials that are glassy to enable fiber drawing at a reasonable speed while self-maintaining structural integrity and regularity. Such can be achieved with glassy materials because the viscosity of a glassy material varies quasi-continuously between solid and liquid states, in contrast to a crystalline material. By employing a glassy material, it is ensured that the fiber structure will remain amorphous, i.e., not crystallize, when cycled through softening and drawing temperatures.

Considering the viscosities of candidate glassy semiconducting and insulating materials, suitable materials for co-drawing are those having compatible viscosities at the fiber drawing temperatures of interest. More specifically, the materials should both be above their respective softening points at an overlapping draw temperature to enable their co-drawing. Precise viscosity matching between fiber materials is not required; specifically, the materials need not have the same viscosity at the draw temperature, but rather all should flow at that common temperature. It is further understood that for some material combinations, high viscosity in one or more materials that comprise the majority of the volume of the fiber preform is sufficient to enable structural integrity of all co-drawn materials. Suitable materials additionally are preferably characterized by good surface adhesion and wetting in the viscous and solid states without cracking even when subjected to thermal quenching.

There have been identified in accordance with the invention a class of insulating materials, namely, amorphous thermoplastic polymeric insulating materials, that are particularly well-suited to the fiber co-drawing process of the invention. High glass-transition-temperature polymeric insulators are an example of such; a wide variety of amorphous high glass-transition-temperature polymer materials are available and can be processed with a range of techniques to form various material configurations that are characterized by excellent mechanical toughness. Examples of high glass-transition-temperature polymers that can be employed include poly-ether imide (PEI), poly-sulfone (PS), poly-ether ether ketone (PEEK), and poly-ether sulfone (PES).

There also can be employed as an insulating material liquid crystal polymers (LCP's), low glass transition polymers such as poly-methyl methacrylate (PMMA), polycarbonate (PC), poly-ethylene (PE) and other such thermoplastic polymers. Poly-tetrafluoroethylene (PTFE or Teflon™) and other fluorinated polymers or copolymers can also be employed in configurations in which their characteristically poor surface adhesion properties can be accommodated. While it is preferred that amorphous polymer materials be employed, it is also recognized that some semicrystalline polymers, e.g., branched PTFE, can be employed. A necessary condition for any suitable polymeric material is that there exist a fiber draw temperature at which the polymer can be drawn into a fiber at a reasonable speed, e.g., greater than about 1 mm/minute, without decomposition.

Considering candidate semiconductor materials for the fiber co-drawing process of the invention, amorphous semiconductors are preferred, given their low glass transition temperatures and stability with respect to oxidation. Amorphous semiconductors are also preferred for their good wetting properties, defined by the contact angle between the semiconductor and polymer materials at the draw temperature; a contact angle of less than about 150 degrees can be preferred. Further, amorphous semiconductors generally are characterized by a viscosity value that is similar to that of the polymers described above at polymer draw temperatures. Both organic semiconductors, such as PPV, or poly thiophene, as well as inorganic semiconducting materials can be employed.

The class of semiconducting chalcogenide glasses are particularly well-suited to the co-drawing process of the invention. Chalcogenides are high-index inorganic glasses that contain one or more of the chalcogen elements of sulfur, selenium, and tellurium. In addition to the chalcogen element, chalcogenide glasses can include one or more of the following elements: boron, aluminum, silicon, phosphorus, sulfur, gallium, germanium, arsenic, indium, tin, antimony, lithium, thallium, lead, bismuth, cadmium, lanthanum, and the halides fluorine, chlorine, bromide, and iodine. There is a very wide variety of different compositions within the family of chalcogenide glasses and thus the properties of a given composition can be tailored through compositional adjustment. For example, a composition of $(As_{40}Se_{60})_{1-x}Sn_x$ can be employed to obtain a desired characteristic.

For many applications, the semiconducting material is best selected based on its material characteristics for enabling photonic conduction and optoelectronic device operation. For example, the amorphous semiconducting material can be compositionally tailored to achieve desired optical, thermal, and/or mechanical properties. In one example scenario, the semiconducting material is selected in combination with the insulating material to produce a multilayer photonic bandgap structure for conduction of photons through a hollow fiber core around which are provided alternating semiconducting and insulating layers. Such a configuration is described in U.S. patent application Ser. No. 10/733,873, entitled "Fiber Waveguides and Methods of Making Same," filed Dec. 10, 2003, now U.S. Patent Application Publication US20040223715A1, published Nov. 11, 2004, the entire contents of which are hereby incorporated by reference. In this example, chalcogenide semiconducting materials such as $As_2Se_3$; $(As_2Se_3)_xM_{1-x}$, where M is In, Sn, or Bi; $(As_2Se_3)_{1-x}Sn_x$; As—Se—Te—Sn, or other chalcogenide materials are employed with PES, PEI, or other suitable amorphous polymer to produce the desired bandgap structure. It is to be recognized that a wide range of polymers can be paired for co-drawing with a chalcogenide material; e.g., both high and low glass-transition-temperature polymers can be employed in conjunction with low glass-transition-temperature chalcogenide glasses.

The conducting material to be employed in the fiber of the invention is selected based on its compatibility for co-drawing with the selected semiconducting and insulating materials. At a selected fiber draw temperature, the selected conducting material should be molten or sufficiently ductile to enable thermal deformation. For many applications, it can be preferred to employ a conducting material having a melting temperature that is below a desired fiber draw temperature. It additionally is preferred that the conducting material sufficiently wet the surfaces of the semiconductor and insulating materials such that the contact angle between the conducting material and these materials is less than about 150 degrees, at the fiber draw temperature, for the case of a bare-surfaced conducting material, without inclusion of an adhesion promotor.

Given a selection of a high glass-transition-temperature polymeric insulating material and a chalcogenide semiconducting material, a low melting-temperature metal or metal alloy can be a preferable conducting material selection. For example, tin, indium, bismuth, cadmium, lithium, or other low melting-temperature metal is particularly well suited for the material trio, as well as Sn-based or other selected alloys. In addition, a selected metal alloy can be synthesized to provide desired melting temperature, electrical conductivity, and other properties. For example, Sn—Ag, Sn—Sb, Sn—Cu, and other alloys can be employed. Further, there can be employed suitable amorphous glassy metals, o other suitable metal composition.

With these considerations and examples, it is to be understood that some experimental verification may be required to confirm the co-drawing compatibility of various candidate materials. Once the drawing temperature of each material of interest is determined, and assuming that the materials can be drawn within a common temperature range, it can be prudent to examine the viscosities of the materials across the selected drawing temperature range to ensure that the viscosities are compatible. As stated above, it is not required that the viscosities of the various materials be the same at the fiber draw temperature, but rather that all materials should at least flow at the draw temperature, with conducting materials preferably molten at the draw temperature. Also, as stated previously, it is understood that it can be preferred that the material which comprises the majority of the volume of the fiber preform be characterized by the highest viscosity.

For example, a reasonable criteria for a material trio including a high glass-transition-temperature polymer, a chalcogenide semiconductor, and a metal is that all materials have viscosities lower than about $10^8$ Poise at the selected draw temperature, with metals preferably being molten at the selected draw temperature. If, e.g., the polymer material constitutes the majority of the fiber preform volume, then a polymer viscosity of between about $10^1$ Poise and about $10^8$ Poise can be acceptable, with a viscosity of between about $10^4$ Poise and about $10^7$ Poise preferred, all at the fiber draw temperature. In this example scenario, a viscosity of less than about $10^8$ can be acceptable for the semiconducting and conducting materials included in the fiber preform, with a viscosity of less than about $10^6$ preferred.

It is to be recognized that the fiber of the invention is not limited to a single conducting material selection, a single semiconducting material selection, or a single insulating material selection. Rather, any number of co-drawing compatible materials from the three material classes can be employed as necessary for a given fiber configuration and application. In addition, distinct material layers, regions, and elements can be included all of distinct thicknesses, dimensions, and composition. For example, various materials can be included to tailor optical signal transmission rates. In one such scenario, the inclusion of optical defect layers adjacent to optical transmission layers, and the tailoring of the thicknesses of such layers, can be employed to achieve a photonic propagation rate that is commensurate with the rate of electron propagation through other elements of a fiber.

Similarly, various conducting materials can be included with their dimensions tailored for a specific operation. For example, given a metal layer or strand incorporated into a fiber for electron conduction, the metal is preferably of sufficient thickness to achieve meaningful electrical conductivity for a given application, at reasonable applied voltage biases. The thickness of the metal is preferably selected based on a given application and the direction of required electronic conductivity. Recall that the resistance, R, in ohms, of a conductor is proportional to the conductor resistivity, $\rho$, length, l, and is inversely proportional to the conductor cross sectional area, A, as $R=\rho l/A$. Thus if an electrical potential difference is applied across a metal layer of the fiber in the radial direction, for radial conduction, a very thin metal layer can be sufficient to conduct large currents, while if conduction is to be in the axial direction, along the fiber length, then a metal layer as thick as 25 microns may be required for reasonable conduction along, e.g., a 10 m fiber section. In general, whatever conductor configuration is selected, it preferably is characterized by a resistance per unit length of less than about 1 K$\Omega$/cm to enable effective electronic conduction. Various conducting material compositions and geometric combinations can be employed to tailor the conducting properties for a given application.

Assembly of materials into a fiber preform is carried out employing processes that are compatible with the selected materials to produce desired material configurations based on the considerations described above. No particular preform assembly technique is required by the invention. Rather, a range of techniques can be employed to produce a preform having a configuration corresponding directly to the desired post-draw fiber.

In accordance with the invention a variety of preform elements can be provided and/or produced separately for incorporation together into a preform arrangement. Considering first conductive materials, commercially available rods, strands, foils, sheets, and other articles of conducting material can be employed. Thermal evaporation, E-beam evaporation, sputtering, chemical vapor deposition (CVD) and other physical deposition techniques can be employed for coating preform elements with a conducting material layer or layers. It is to be recognized, however, that depending on a particularly selected deposition technique and the deposition parameters, not all deposited films may be compatible with a fiber co-drawing process; e.g., the deposited conducting material must be sufficiently thick as well as ductile to accommodate the drawing process.

Whatever conducting material geometry is employed, if the conducting material is a metal or metal alloy that will melt at fiber draw temperatures, then in accordance with the invention, the metal or alloy is arranged in the preform such that it is confined geometrically by materials in the preform that will not melt at the draw temperatures. This metal confinement ensures that the draw process retains the desired metal configuration in the fiber even while the metal is in a fluid state.

In addition, it is recognized in accordance with the invention that conducting materials can oxidize readily at elevated temperatures, including preform consolidation and fiber draw temperatures. Oxidized conducting materials may not melt or may flow nonuniformly, resulting in nonuniform or even inoperable conducting elements in the drawn fiber. To eliminate this condition, it can be preferred in accordance with the invention to inhibit and/or remove oxide from conducting element surfaces for various preform geometries.

The invention provides a range of techniques for inhibiting oxidized conducting materials in a drawn fiber. In a first example technique, an antioxidizing, or oxide inhibiting, agent that preferably is a surface wetting promoter is incorporated into the preform at interfaces surrounding the conducting material, e.g., surrounding metal elements in the preform. This can be achieved by, e.g., physically applying an oxidation inhibitor to the conducting material surfaces during the preform assembly. A particularly well-suited oxidation inhibitor is a flux; fluxes in general are synthetic carboxylic acid-containing fluids or natural rosin fluxes. These compounds serve to enhance and promote the wetting of the preform materials by the metal or other conducting material so as to prevent capillary breakup of the conducting material. This enables the use of conducting materials that may not normally exhibit the required surface wetting condition. Example suitable fluxes include Superior No. 312 flux, or Superior 340 flux, both from Superior Flux and Mfg. Co., Cleveland, Ohio. The flux can be applied directly to the conducting material surfaces, and can alternatively or in addition be applied to surfaces of other materials that in the preform configuration are to be adjacent to conducting material surfaces.

In a further technique for inhibiting oxidized conducting elements in a drawn fiber, an oxidation inhibitor can be applied to one or more preform elements by adding it to the elements. For example, an oxidation inhibitor can be added to a polymer material that is to be located adjacent to a conducting material element. The oxidation inhibitor constituent preferably segregates to or is naturally located at the surface of the polymer for application interaction with adjacent conducting materials. Alternatively, a polymer, semiconductor, or other material that itself has oxidation inhibition or oxide growth suppression properties can be selected for use in the preform adjacent to conducting elements. Oxidation inhibiting and/or growth suppression buffer layer materials can also be included between a conducting element and an adjacent material. Whatever oxidation inhibition technique is employed, it is preferred that the oxide inhibitor does not decompose at the preform consolidation temperature or the fiber draw temperature.

Considering the need to encapsulate metal preform elements and inhibit oxide of such elements, in one example for encapsulating metal strands, polymer-coated metal strands are produced from commercially-available metal wires. In one such scenario, Sn wires, e.g., 5 mm in diameter are coated with a layer of flux, such as that described above, and then wrapped with a layer of PES film, e.g., 7.5 mm-thick PES film commercially available, e.g., from Westlake Plastics Co., Lenni, Pa. Alternative wire coating techniques can be employed, such as dip coating. The ends of the wrapped wires are then coated with a polymer material, e.g., by dip-coating. For this application, a polymer solution, e.g., 20% PES, 80% N,N-Dimethylacetamide, can be employed. The polymer solution is then solidified on the wire by heating the structure, e.g., at 180° C., or by subsequent consolidation of the structure. Consolidation of the polymer-wrapped wires can be preferred for ensuring intimate contact between the metal and polymer materials, and can be carried out in a vacuum oven at, e.g., 260° C.

The heating step or consolidation process results in the polymer solution being solidified and the wires thereby encapsulated with a polymer layer. The polymer-wrapped wires can at this point be drawn to form metal strands of a desired diameter, if a reduced diameter is desired for a given application. For the example of PES-coated Sn wires, a draw temperature of about 305° C. in a vertical tube furnace produces polymer-coated metallic strands having an outer diameter between about 500 µm and about 1.5 mm, depending on draw conditions. The metallic strands can then be incorporated in a fiber preform arrangement in the manner described below. It is to be recognized, however, that if desired for some applications, as described below, metallic wires or other elements can be drawn to a desired diameter without encapsulating the elements in a polymer or other insulating material.

Considering insulating fiber preform elements, due to the relative ease of preform assembly and drawing of polymer materials, compared with other glassy insulating materials, polymeric insulating materials can be preferred for many fiber applications. Polymeric insulating materials can be readily obtained commercially or produced in a desired configuration. For example, commercially available polymer rods, tubes, sheets, and films from, e.g., Westlake Plastics Co., can be employed. Polymer rods and tubes can also be produced by thermal consolidation of a rolled polymer film. Polymer layers can be produced by chemical vapor deposition techniques such as plasma enhanced chemical vapor deposition, by spin-coating, dip-coating, as described above, by roll-casting, extrusion, and other techniques. Liquid polymer can be applied, as described above, for coating preform core materials, strands, wires, rods, layers of other material, and preform elements.

Chemical and physical deposition techniques can be employed for producing non-polymeric insulating material preform elements. The invention does not limit insulating materials to polymeric materials. So long as a candidate insulating material is characterized by a morphology that is compatible with fiber drawing, such can be employed in addition to or as an alternative to polymeric materials.

Similarly, chemical and physical deposition techniques can be employed for producing amorphous semiconducting material preform elements. As explained above, for many applications, chalcogenide glass semiconductors can be preferred for their co-drawing compatibility with polymeric insulators. Rods, tubes, sheets, films, and other semiconducting structures can be employed in the fiber preform. A wide range of semiconducting glass structures can be obtained commercially, e.g., from Alfa Aesar, Ward Hill, Mass., and also can be synthesized as a particularly desired composition and geometry.

For example, in accordance with the invention, chalcogenide glass structures can be chemically synthesized using sealed-ampoule melt quenching techniques. In one example scenario, pure elements such as As and Se are placed in a quartz tube under a nitrogen atmosphere. The tube is initially maintained open at one end. A vacuum line is connected to the open end of the tube and the tube is preheated under vacuum to melt the elements and remove trapped gasses and surface oxide. Heating to 330° C. for one hour at a heating ramp rate of about 1° C./min and thereafter cooling to room temperature at a ramp down rate of 1° C./min is sufficient. An oxygen gettering agent such as Mg can be added to the tube to reduce the partial pressure of oxygen within the tube.

The tube is then sealed under a vacuum of, e.g., $10^{-5}$ Torr, using, e.g., a high-temperature torch. The sealed tube is then heated in a rocking furnace for physically mixing the elements during a prescribed heating schedule corresponding to the elements included. For example, the As—Se mixture can be heated to 800° C. at a rate of about 2° C./min, while held vertical, for twenty four hours, and then rocked for six hours to increase mixing and homogenization. The glass liquid is then cooled, e.g., to 600° C. in the furnace, and then quenched in water. Subsequently, the mixture is annealed for one half hour to the glass transition temperature, e.g., about 180° C., before being cooled gradually to room temperature. Using this synthesis technique, mechanically strong semiconducting structures can be fabricated as, e.g., rods, tubes, and other structures. Once the glass is synthesized, it is no longer sensitive to oxygen at room temperature. It therefore can easily be handled in ambient atmosphere for incorporation into a preform or employed for further processing.

In addition to conducting, semiconducting, and insulating preform elements, sacrificial elements can be included in a preform to aid in defining a preform shape, and then removed prior to drawing of the preform into a fiber. For example, quartz tubes or rods can be included in a preform at locations for which a hole is desired, and then chemically etched away after consolidation of the preform. Similarly, Teflon™ rods or tubes can be included in a preform and mechanically removed from the preform after consolidation. This technique provides a particularly elegant method for defining gaps and spaces in a preform assembly prior to fiber drawing.

With preform building blocks like the examples described above, and with suitable fabrication processes, like those described above, a wide range of preform geometries can be assembled for enabling optical and electrical functionality, including transmission and device operation, in a final fiber structure. Semiconducting, insulating, or conducting rods, strands, and other geometric elements can be coated with selected material layers. Various material layers can be applied in any order, with the caveat that metals be geometrically confined by materials that will not melt at the draw temperature. Drilling, casting, injection molding, or other techniques can also be employed for defining the geometric relationship between material elements in a preform layer or region.

Considering now specific preform assemblies for producing fiber geometries like those corresponding to FIGS. 3A-3G, as described above, wires, strands, or rods of conducting material can be arranged in a preform. The conducting elements can be positioned on preform layers by employing, e.g., a liquid polymer solution that operates to "glue" the elements, particularly polymer-coated elements, to a layer or other element. Referring to FIGS. 3A-3C, individual strands or an array of strands can be positioned around an inner layer or other element by this technique. Given a PES insulating layer composition, a polymer solution of 20% PES, 80% N,N-dimethylacetamide, available from Alfa Aesar, as described above, can be employed as both an end-coating strand medium and the liquid attachment medium. As explained above, during a heating step or a thermal consolidation process, the liquid polymer solution solidifies to a solid PES region that is an integral part of the preform and fiber.

It is to be recognized that conducting strands, wires, rods, or other elements are not required to be covered with a polymer coating, but such can be a convenient technique for geometrically confining the conducting material within the preform assembly. Alternatively, uncoated conducting strands can be positioned around a layer, e.g., a polymer layer, with pieces of polymer film cut and fit between each strand, and a layer of polymer applied over the array of strands. Other materials can be employed for confining the metal so long as the materials cooperate with a desired fiber functionality and can geometrically confine the metal during a draw process.

For many applications, where a high glass-transition-temperature polymer is employed as an insulating material, it can be particularly advantageous to employ layers of polymer material in assembly of a preform structure. For example, for the photonic bandgap structure described previously, alternating layers of semiconducting and insulating materials can be produced by depositing a semiconductor layer on one or both sides of a polymer film and then rolling the film into a cylindrical multilayer structure. In addition, a polymer film can be rolled around individual preform elements, such as conducting strands, as described above, and further can be rolled around assemblies of elements like those shown in FIGS. 3A-3G to produce insulating fiber regions and outer layers.

Deposition of a semiconductor layer on one or both sides of a polymer film can be accomplished by thermal evaporation, chemical vapor deposition, sputtering, or other suitable deposition technique. Where a semiconductor such as a chalcogenide glass has been synthesized, e.g., by the chemical synthesis process described above, conventional thermal evaporation of a synthesized source material onto a polymer film can be a particularly convenient deposition technique. It is preferred that the polymer film be highly uniform in surface quality and thickness and be cleaned, e.g., with an alcohol, prior to the deposition process. Thermal evaporation can be carried out with conventional hot filament evaporation techniques, preferably at a pressure below, e.g., about $10^{-4}$ Torr. A conventional vacuum evaporator, e.g., a Ladd Research Industries Model 30000, can be employed. If desired, both sides of a polymer film can be coated with a selected material.

In order to assemble a layered preform structure of the polymer film and a material deposited on the film in the manner just described, the coated polymer film can be wrapped, or rolled, around a mandrel or other preform structure a number of times to produce a desired number of layers. For example, in production of a photonic bandgap structure for optical transmission, a PES film coated with $AS_2Se_3$ can be rolled a number of times to produce a structure with 20 or more alternating semiconducting and insulating layers. In this scenario, the PES film and the $As_2Se_3$ layer thicknesses are selected specifically to achieve a maximal photonic bandgap at a desired wavelength of photon transmission. The desired thicknesses of the layers in the final fiber structure dictate the thicknesses of the materials in the preform, based on the selected draw conditions, as explained in detail below.

Where the photonic bandgap structure is to conduct photons through a central hollow core surrounded by the bandgap materials, the semiconductor-coated polymer film can be rolled around a sacrificial preform such as a glass rod, hollow glass tube, or Teflon™ rod or tube, or other structure that can be removed from the preform prior to the fiber drawing step. Where the coated polymer film is to be employed in an alternative configuration, the coated film can be rolled around other selected preform elements, e.g., polymer, semiconductor, or conducting rods, or other layers of preform materials, including metallic foils, semiconducting layers, or other preform elements. This enables the layered structures shown in FIGS. 3A-3G.

Also as shown in FIGS. 3A-3G, conducting elements can be configured in a preform directly adjacent to semiconducting elements, e.g., as electrodes 48 adjacent to a semiconducting core 46 shown in FIG. 3E. In one example preform assembly technique, the use of polymer films can be particularly advantageous for producing this structure. Considering a scenario in which a semiconductor core is to be contacted by metal electrodes, the semiconductor core can be obtained commercially or be chemically synthesized in the manner described above.

A PES or other polymer film is then provided, having any desired length, a width that corresponds to the length of the semiconductor rod, preferably slightly longer than the rod, and a desired thickness, e.g., 125 μm in thickness. It is preferred to clean the film, e.g., with alcohol, and bake the film, e.g., at 150° C. for 3 hours, to remove the alcohol.

The electrodes can be formed in conjunction with the polymer film using, e.g., tin foil, of a desired thickness, e.g., between about 25 μm and about 1 mm in thickness. Suitable foils can be commercially obtained, e.g., from Goodfellow Corporation, Devon, Pa., or can be produced by, e.g., pressing a metal rod to the desired foil thickness. The foil is preferably cleaned and dried in the manner of the polymer film. Additionally, it can be preferred to coat the foil with an oxide inhibitor, e.g., a flux, as described above.

The conducting electrodes are shaped by cutting the foil into desired electrode geometries. If, e.g., the electrodes are to be configured as rectangles extending along the fiber longitudinal axis, then rectangular tin foil pieces are correspondingly cut. It can be preferred to cut foil pieces that are slightly shorter than the semiconductor rod length to enable geometric confinement of the foil in the preform in the manner described below. The width of the foil pieces is set based on the particular functionality desired for the electrodes, e.g., a 5 mm-wide foil piece can be employed.

The foil pieces are assembled in a preform configuration by removing sections of the polymer film at film locations corresponding to the electrode geometry and the desired placement of the electrodes. The film sections can be removed through their entire thickness or a portion of the film thickness. Considering the placement of two electrodes equally spaced around a semiconductor rod, and given an electrode width, w, and the rod perimeter, $P=\pi d$, where d is the rod diameter, then the two electrodes are to be spaced a distance $(P-2w)/2$ apart on the film. Similar computations can be made to position any number of electrodes in a film to achieve a desired electrode configuration in a final fiber geometry. The foil electrodes are inserted into the film at the locations at which the film was removed, and if desired, an additional layer of film can be overlayed. The film-electrode assembly is then rolled around the rod or other element, taking care that the electrode foil material is contacting the rod.

If the polymer film is thinner than the metal foil or other conducting element, then it can be preferred to employ several layers of polymer film, with each of the layers having an appropriate amount of material removed at desired electrode locations. Alternative to the use of a polymer film, one or more polymer tubes or other structures can be employed for supporting electrode elements to be incorporated into a preform. For example, sections of a polymer tube can be removed for positioning foil pieces in the tube, with the tube then slid over a rod or other preform element. For many applications, the use of a polymer tube can be preferred for ease in positioning the metal electrodes and assembling the polymer-electrode configuration on another preform element.

Extended sections of foil or other conducting material can be applied to polymer films or other materials to be wrapped around preform elements in any geometry so long as confinement of conducting materials is achieved by the arrangement. For example, in the semiconductor-metal-insulator arrangement just described and shown in FIG. 3E, the electrodes 48 are radially confined between a semiconducting material 46 and an insulating material 49. In the example fiber of FIG. 3D, discrete conducting layer segments 84, 85, 86,88, 89 are confined between adjacent material layers 87,91, as well as material regions located between each conducting segment. Such confinement can be enabled by the polymer film-foil assembly described above, with regions of polymer film removed at desired conduction segment locations and metal foil inserted into the film regions.

Further, it was suggested just above that the electrode foil not extend the entire length of a polymer film to ensure that the polymer confines the foil at the longitudinal ends of the electrodes. If this is not the case, then it is preferred that an encapsulating material be applied at the preform ends. As described previously, a particularly convenient technique for such encapsulation can be the application of a liquid polymer solution that is dried during a subsequent heating or thermal consolidation step.

Beyond conducting elements, additional preform elements can be added and arranged. For example, as shown in FIG. 3E, additional material layers 50, 52, 54, possibly including strands or other elements 56, 57, 58, 66, 68, cores 62, or other elements, can be incorporated in the preform. As shown in FIG. 3F, this arrangement can be extended to produce a preform that includes multiple rods 62 in a selected configuration, e.g., having a selected number of adjacent electrodes 64. Layers of polymer film can be wrapped around each rod-electrode combination, and employing, e.g., a liquid polymer solution like that described above, can be attached together and to, e.g., a central polymer support structure.

This preform assembly process can be extended to the arrangement of fiber elements in a preform for producing a hybrid fiber array like that shown in FIG. 3G. In this process provided by the invention, one or more preforms are assembled and drawn into one or more sub-fibers. The sub-fibers are then cut into fiber sections that are arranged in a desired array or other hybrid arrangement. This hybrid arrangement is then drawn into a hybrid fiber including the array elements.

Each of sub-fiber elements included in the hybrid fiber array can be produced in the manner described above, with various conducting, semiconducting, and insulating material elements arranged in a variety of selected preforms. The preforms are then drawn to sub-fibers, in the manner of the drawing processes described below. For the example fiber shown in FIG. 3G, a preform including a rod, e.g., a semiconducting rod, such as an $As_2Se_3$ rod, is arranged with metallic electrodes 64, e.g., Sn elements, provided adjacent to and in contact with the rod, with polymeric material 71, e.g., PES, about the rod and electrodes. The process described above for assembling Sn foil into apertures cut in a polymer film can here be employed. With the preform complete, such is then drawn into a sub-fiber of e.g., about several meters in length and cut into a number of sub-fiber sections, e.g., 1000 sections, each section having a length of, e.g., 15 cm.

In assembly of a preform for the hybrid fiber, each of the cut sub-fiber sections is arranged, e.g., in an array. In one example technique for producing such an array, the sub-fiber sections are inserted inside a hollow sacrificial tube element, e.g., a quartz or Teflon™ tube. Because in this example each sub-fiber section includes electrodes that extend to the end of the sub-fiber section, it can be preferred dip the tube of sub-fibers into, e.g., a liquid polymer solution to coat the ends of the electrodes such that they will be geometrically confined when the hybrid fiber is drawn. The arrangement is then consolidated, in the manner described below, if necessary, and the sacrificial quartz tube removed or etched from the preform by, e.g., a liquid HF etch process. As a result of a consolidation process, the arrangement of sub-fiber sections are fused together as a unitary hybrid structure and the electrodes are coated with a polymer at the sub-fiber ends.

The hybrid preform structure can then be drawn into a hybrid fiber structure under the draw conditions described below. In the current example of sub-fiber elements, each sub-fiber section in the fiber array is, e.g., about 400 μm in diameter after its first drawing. The hybrid fiber drawing process further reduces the diameter of each sub-fiber; for example, given a drawdown reduction factor of 20, the diameter of each 400 μm-diameter sub-fiber section is reduced to 20 μm. Thus, as a result of the dual draw processes employed in this method, very minute fiber features are produced in each of the sub-fiber sections included in the hybrid fiber.

In addition to the preform assembly techniques described above, the invention contemplates drilling, casting, molding, and other techniques for producing a preform. For example, holes can be drilled in a polymer body and conducting or semiconducting strands or other elements fitted into the drilled regions. Any preform assembly technique that accommodates all of conducting, semiconducting and insulating materials in an arrangement that enables co-drawing of the three materials can be employed.

Depending on the selected preform assembly technique and resulting arrangement, it can be preferred to thermally consolidate an assembled preform prior to the fiber drawing process. Consolidation is a process whereby under heat and vacuum conditions one or more of the preform materials are caused to fuse together, with air pockets in the preform being substantially eliminated. This results in a preform assembly that can produce intimate interfacial contact between adjacent material layers in the final fiber, and provides the preform with self-maintaining structural stability during the fiber draw process.

The specific conditions of the consolidation process are selected based on the particular materials incorporated into a given preform. If, e.g., a high glass-transition-temperature polymer is employed in the preform, then the consolidation temperature preferably is above the glass transition temperature of the polymer. The preform is maintained at the elevated temperature for a time sufficient to cause the polymer to fuse to adjacent elements included in the preform; the temperature is selected based on the preform diameter and its materials. Given a preform including PES polymer elements, $As_2Se_3$ semiconducting elements, and Sn metal elements, a consolidation temperature of between 250° C.-280° C., e.g., about 260° C., at a pressure of about $10^{-3}$, sufficiently consolidates the structure.

For most consolidation temperatures, metal preform elements will be melted during the consolidation process but confined to their intended geometries by the arrangement of confinement layers described above. Depending on the consolidation temperature, semiconducting preform elements may soften or may remain solid. The inclusion of at least one material that can fuse to adjacent materials during consolidation is all that is required. In the PES-$As_2Se_3$—Sn example given above, the consolidation temperature is set to enable softening and fusing of the PES polymer to adjacent preform elements.

It can be preferred to carry out the consolidation process in a vertical rotating zone refinement furnace. In such a furnace, the preform longitudinal axis is held vertically and a zone refining heating process is carried out along the preform length. Preferably the consolidation is conducted from the preform bottom upward through the preform to its top. The heating time for each incrementally consolidated preform section along the preform length is determined based on the preform diameter and material elements as explained above.

As explained above, in construction of a preform there can be included one or more sacrificial elements that are incorporated in the preform solely to define spaces to be provided in a final fiber geometry. For example, a mandrel, rod, or tube can be included in a preform where a hollow fiber core or other region is desired. If a sacrificial element is included in a preform, it is preferred that the consolidation process be carried out at a temperature below the glass transition temperature of that element, so that structural integrity of the sacrificial element is maintained during the consolidation process and the preform does not collapse on itself.

For many preform material arrangements, a sacrificial element can be constructed that can withstand reasonable consolidation temperatures and pressures and can easily be removed from the preform after consolidation. For example, Teflon™ tubes, rods, or other elements can be readily incorporated into and removed from a preform. Any material that exhibits poor surface adhesion and can withstand the consolidation process is a good sacrificial element material. It is preferable to remove the Teflon™ or other sacrificial element immediately after the consolidation process, while the preform is hot and slightly expanded. This enables ease of removal. Once the preform cools and correspondingly shrinks, it can be difficult, if not impossible, to remove the element by simple mechanical force.

Alternatively, sacrificial elements which can be removed from a consolidated preform by chemical etching can be employed. For example, glass, quartz, or other etchable materials that can withstand the consolidation process can be employed. In such a scenario, after the consolidation process, the preform is exposed to a chemical etchant that selectively attacks the sacrificial elements. For example, hydrofluoric acid or other acid bath can be employed for wet chemical etching of sacrificial elements. Dry etch techniques, e.g., plasma etch techniques, can also be employed if such can be adapted to contact and selectively attack the sacrificial materials in a preform.

Once a preform has been consolidated, if necessary, and sacrificial elements removed from the preform, drawing of the preform into a fiber can proceed. Fiber drawing can be carried out in a fiber draw tower or other suitable draw apparatus. In such an apparatus, a top preform downfeed mechanism is provided for holding an end of the preform and lowering the preform into a furnace. It can be preferred to employ a vertical draw furnace enabling three temperature zones, namely, top, middle, and bottom temperature zones. Below the furnace is provided a capstan with spooler for spooling the drawn fiber. Measurement equipment, e.g., a laser diameter monitor, from Beta LaserMike, Dayton, Ohio; fiber tension measurement devices, e.g., Model SM9649P, from Tension Measurement, Inc., of Arvada, Colo., and other monitoring equipment can be included.

The draw furnace temperature zones, preform downfeed speed, and capstan speed are selected based on the preform materials and configuration to enable co-drawing of preform conducting, semiconducting, and insulating material elements into a desired fiber configuration. The top furnace zone temperature is selected to cause the preform materials to soften but not flow. The middle furnace zone temperature is selected as the draw temperature, to cause the preform to flow into a fiber form. As explained above, the draw temperature is selected to be above the glass transition temperature of the insulating and semiconducting materials, and for most material combinations, will be above the melting temperature of the conducting material. If an excessively high draw temperature is employed, the preform will catastrophically deform, while an excessively low draw temperature will cause preform distortion and expansion. The structural arrangement of the preform must be preserved at the draw temperature.

It is therefore to be recognized that some experimental testing of draw temperatures can be required for a given preform assembly. As explained above, a reasonable criterion for polymer, metal, and chalcogenide material draw temperatures is that all materials have a viscosity lower than about $10^8$ Poise at the draw temperature and that the metal be molten at the draw temperature. Given a preform of PES polymeric insulating elements, $As_2Se_3$ semiconducting elements, and Sn conducting elements, a top zone temperature of between about 180° C.-250° C., e.g., 190° C.; a drawing zone temperature of between about 280° C.-315° C., e.g., 300° C.; and a bottom zone temperature that is unregulated, and therefore at, e.g., about 100° C., due to proximity to the draw zone, can be employed for successfully drawing the preform into a fiber.

For many applications, it can be preferred to ensure uniform heating of the preform during the drawing process. A uniformly heated furnace employing, e.g., distributed filament heating, is particularly well suited for the drawing process. It is further preferred that the preform be maintained laterally centrally in the drawing temperature zone. If the preform temperature distribution becomes nonuniform due to lack of furnace temperature control or lateral misalignment of the preform as it passes downward through the drawing zone, there could be produced local preform regions of differing temperature and differing viscosity. Local viscosity fluctuations in the preform could produce a capillary effect in which material, particularly molten metal, flows to other preform regions, and distorts the intended fiber geometry. The physical confinement of metal elements described above can be important for inhibiting such a condition, but in general, uniform preform heating is preferred for preserving an intended fiber geometry.

The combination of preform downfeed speed and capstan drawing speed determine the diameter of fiber produced by the drawing process for a given drawing temperature. A diameter monitoring system can be configured in a feedback loop to enable control of, e.g., the capstan speed, by the diameter monitors based on a diameter setpoint and control algorithm. For the drawing furnace zone temperatures recited above for drawing a PES-$As_2Se_3$—Sn preform of 20 cm in diameter and 30 mm in length, a downfeed speed of between about 0.002 mm/sec-0.004 mm/sec and a capstan speed of between about 0.7 m/sec-3 m/sec produces a fiber of a diameter between about 1200 μm and 500 μm and a length of several hundred meters. As can be recognized, a reduction in draw speed increases the resulting fiber diameter. Within the fiber, layers of the preform are reduced in thickness by a factor of ~20-100. In accordance with the invention, a preform can be drawn multiple times to reduce the final resulting fiber geometry correspondingly.

The drawdown ratio between a fiber preform and the resulting fiber is not precise; specifically, the preform layer thickness drawdown ratio does not always correspond precisely to the fiber's outer diameter drawdown ratio. This can be due to a number of factors, including, e.g., reduction of hollow core or other hollow spaces within the preform. The relationship between the layer and outer diameter drawdown ratios is found to be closer to 1:1 for large-diameter, low-tension draw procedures. High-temperature, low-tension draw procedures can tend to produce fibers having layers thicker than predicted by the outer diameter reduction ratio, due, e.g., to partial collapse of hollow regions. It is found, however, that such effects are fairly reproducible and can be predicted based on experimental history.

Upon completion of the fiber drawing operation, there is produced a fiber that can enable optical transmission, separate and independent electrical transmission, and optoelectronic device operation. The conducting and semiconducting fiber elements therefore are provided to be functional in at least one aspect of transmission or device operation and the insulating fiber elements can be provided for electrical and/or optical isolation as well as for functionality in at least one aspect of transmission or device operation.

It is to be recognized that while it can be preferred to employ conducting, semiconducting and insulating preform materials, the fiber that results from the draw process can exhibit altered material conductivities given the scale of feature sizes and cross-sectional element dimensions of the drawn fiber. For example, the conditions of the fiber drawing and/or the structural and dimensional changes that result from the drawing could render a semiconducting or metal preform material insulating, or an insulating preform material conducting. Further, the energy band structure of materials provided in a preform can be altered by the fiber drawing and/or resulting dimensional changes, and can change their conductivity correspondingly, given the scale of fiber feature sizes. In addition, it is recognized that one or more constituents can be incorporated into preform materials that adjust the materials' conductivity upon fiber drawing. For example, conducting filaments, such as carbon fibers, can be included in a preform material such as polymer whereupon drawing, the spacing between the fibers is reduced, leading to a change in polymer conductivity.

Figure 1B:
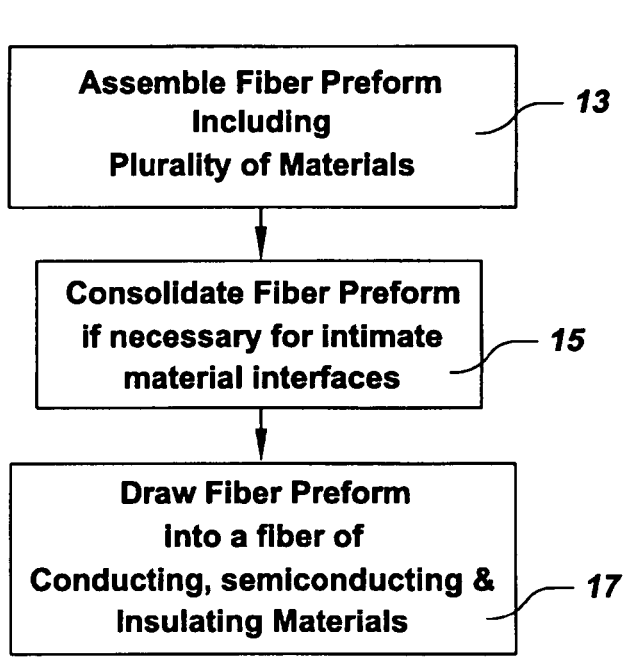

The invention contemplates employing these and other phenomena to produce a drawn fiber of conducting, semiconducting and insulating materials from a preform of materials that may not be conducting, semiconducting and insulating. A corresponding process flow 11 is described in the flow chart of FIG. 1B. In a first process step 13, a fiber preform is assembled to include a plurality of distinct materials. Then the assembled fiber preform is consolidated 15 if necessary for producing intimate interfaces as explained previously. Finally, the fiber preform is drawn 17 into a fiber of conducting, semiconducting, and insulating materials. In accordance with the invention, it is the conducting, semiconducting and insulating material properties of the drawn fiber that are to be achieved; and it is recognized that the preform need not provide a one-to-one correspondence in material conductivity with the fiber while still enabling this desired result. Shifts in the energy band structure of preform materials, dimensional, structural, and other changes in preform material constituents, and other such phenomena impacted by the fiber draw process can be employed to produce a conducting, semiconducting and insulating fiber geometry in accordance with the invention.

EXAMPLES

Figure 4:
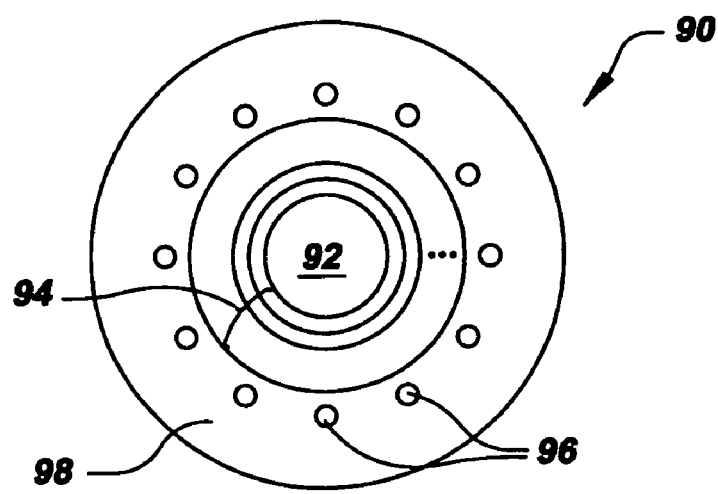
FIG. 4 is a schematic cross-sectional view of a fiber provided by the invention for optical and electrical transmission.

Referring to FIG. 4, a fiber 90 for conducting both photons and electrons was produced in accordance with the invention. A photon conducting region was provided as a hollow fiber core 92 around which was provided a multilayer photonic bandgap structure 94 of alternating semiconducting and insulating material layers. The bandgap structure exhibited a photonic bandgap at the wavelength corresponding to photon transmission. Sixty cylindrical strands 96 each having an Sn core and polymer cladding were provided around the bandgap structure, and additional polymer reinforcement material 98 was provided around the strands.

While this example bandgap structure is an omnidirectional reflecting mirror, fibers of the invention are not limited to such; the bandgap structure need not be a multilayer or 1D photonic bandgap structure and instead can exhibit a 2D or 3D photonic bandgap employing structures having periodicities in more than one direction. In the bandgap structure shown, the wavelengths at which photons are transmitted are controlled by the period length of the dielectric mirror of the structure. A change in the period length thereby changes the transmission wavelength.

The fiber preform for this geometry was assembled by wrapping a PEI film, coated on both sides with a layer of $As_2Se_3$, around a pyrex tube. Specifically, a 2.6 µm-thick layer of $As_2Se_3$ was evaporated onto both sides of a PEI film of 8 µm in thickness. The semiconducting material was chemically synthesized in the manner described previously. High purity As and Se elements were placed into a quartz tube under a nitrogen atmosphere. The tube was heated to 330° C. for one hour at a rate of 1° C./min under vacuum to remove surface oxide, $As_2O_3$, and then cooled to room temperature at 1° C./min. The tube was then sealed under vacuum of about $10^{-5}$ Torr. The resulting ampoule was heated to 700° C. at a rate of 2° C./min in a rocking furnace, held vertical for 10 hours, and then rocked for 12 hours to increase mixing and homogenization. The liquid was then cooled to 550° C., and quenched in air and water. It was then annealed for one half hour to about 180° C. and then gradually cooled to room temperature. The synthesized chalcogenide semiconductor was thermally evaporated onto both sides of the PEI film, the two semiconducting layers being ¼ the polymer film thickness.

The coated polymer film was then rolled around a pyrex tube having an outer diameter of 16 mm. The diameter of the tube was selected in concert with the polymeric insulator and semiconductor layer thicknesses, the required fiber inner core diameter, and the desired bandgap wavelength. A PEI layer was provided as the outermost layer of the material pair. Eight pairs of $As_2Se_3$/PEI layers were wrapped around the tube. Polymer-coated Sn strands were then produced in the manner described above. 5 mm diameter Sn wires were each wrapped with a layer of 7.5 mm-thick PEI film. The ends of the wrapped wires were coated with a polymer solution of 20% PES, 80% N,N-Dimethylacetamide.

Each of the polymer-coated metal strands was then attached to the PEI layer by applying a polymer solution of 20% PES, 80% N,N-dimethylacetamide on the PEI film and sticking the strands to the film. Additional layers of PEI film were then wrapped around the metal strands. The resulting preform was then consolidated at a temperature of 260° C. and a pressure of $10^{-3}$ Torr. After consolidation, the preform was immersed in a liquid HF bath or 3 hours to selectively etch away the pyrex tube.

With the sacrificial pyrex tube removed, the finalized preform was then drawn under conditions with a top zone temperature of 192° C., a draw temperature of 302° C., a downfeed speed of 0.003 mm/min and a capstan speed of 1 m/min. This resulted in the preform being drawn down to a fiber including an $As_2Se_3$ layer thickness of 150 nm, a PEI layer thickness of 280 nm, and a Sn metal wire diameter of about 8 µm.

Figure 5:
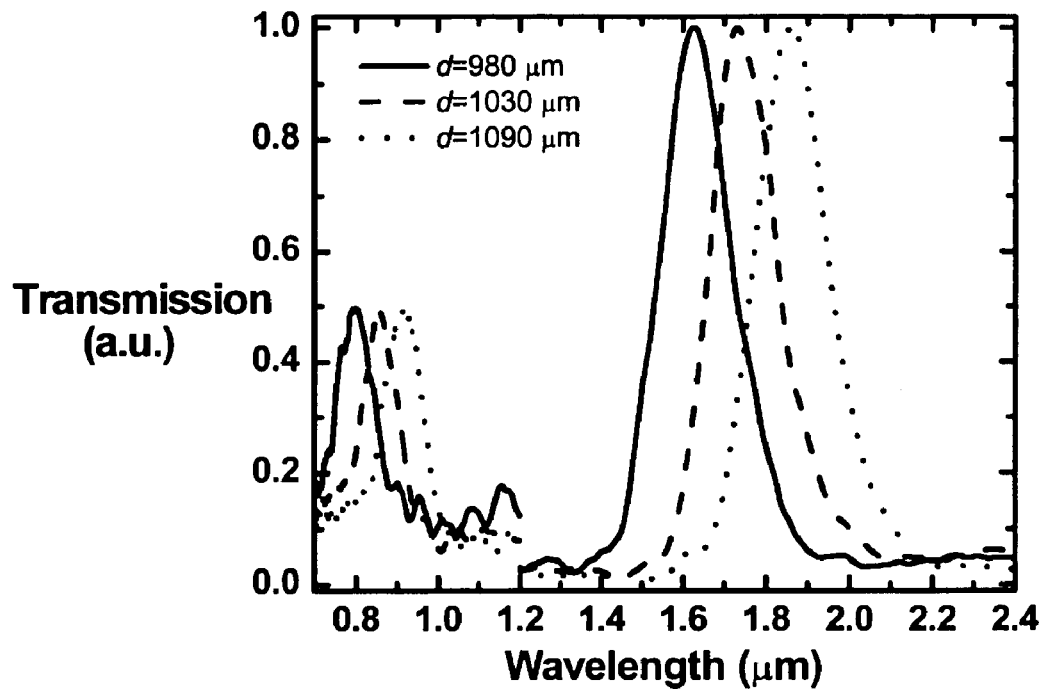
FIG. 5 is a plot of measured optical transmission as a function of transmitted wavelength for the fiber of FIG. 4.

FIG. 5 is a plot of experimentally measured optical transmission spectra of the dual electron-photon conducting fiber configuration of FIG. 4 for three different fiber outer diameters, namely, 980 µm, 1030 µm, and 1090 µm. Optical transmission measurements were performed using a Bruker Tensor 37 FTIR spectrometer with an InGaAs detector, in the near infrared region. Both ends of the fiber were coated with a thick layer of gold to ensure light coupling to the hollow core only, as well as to facilitate electrical conduction experiments. The fibers exhibited transmission peaks corresponding to the fundamental and second-order photonic bandgaps, which for the 980 µm-diameter fiber were located at 1.62 µm and 0.8 µm, respectively. As explained previously, the positions of the photonic bandgaps are determined by the lattice period of the layered mirror structure, which is in turn controlled by the final fiber diameter.

Figure 6:
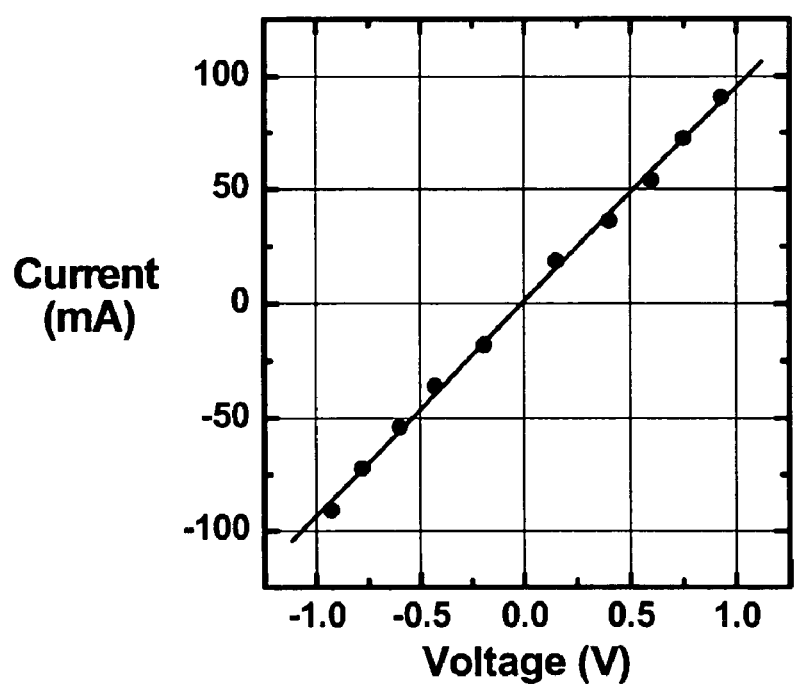
FIG. 6 is a plot of measured conducted electrical current as a function of applied voltage for the fiber of FIG. 4.

FIG. 6 is a plot of electrical current as a function of voltage applied across the metal strands of the fiber of FIG. 4. The electrical current of the strands was measured directly under the applied voltage. The electron transport properties of the fiber were found to be ohmic over the range of measurement. It was also found that electrical contact to the fiber could be achieved using conventional solder due to the high glass transition temperature of the PEI and PES polymers employed in the fiber structure.

Figure 7A:
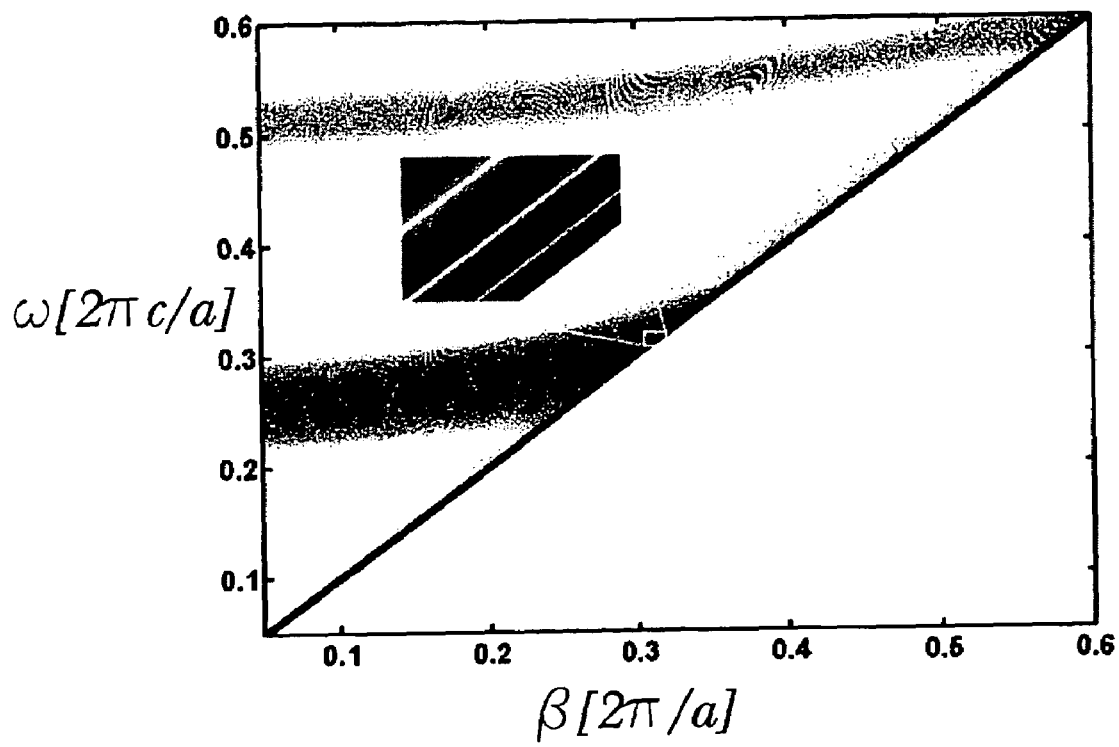
FIG. 7A is a plot of the calculated photonic band structure for the fiber of FIG. 4.

The photonic band structure and theoretical optical transmission of the fiber of FIG. 4 was predicted using a general expression for the radial outgoing flux from the cylindrical fibers. The plot of FIG. 7A represents the resulting band diagram. Darker shaded areas correspond to bandgap regions having decaying solutions for outgoing flux. Lighter shaded areas outside the bandgaps correspond to regions where light couples to radiating modes that are transmitted through the mirror structure and are therefore not localized for transmission within the hollow fiber core.

The optical transmission properties of these high overmoded fibers is set by the small intermodal separation, which is inversely proportional to the square of the fiber radius. Thus, a fiber core radius of 250λ, or 400 µm, is expected to have ~$10^5$ modes, making it difficult to observe the individual dispersion curves of the propagating modes in a full scale band structure. The inset image of the plot is a magnified segment of the guided modes near the light line, where the dispersion curves of the first three propagating fiber modes with angular momentum of 1 can be observed by the light colored stripes that indicate local minima in the outgoing flux, and therefore a strong confinement of the field within the hollow core.

Figure 7B:
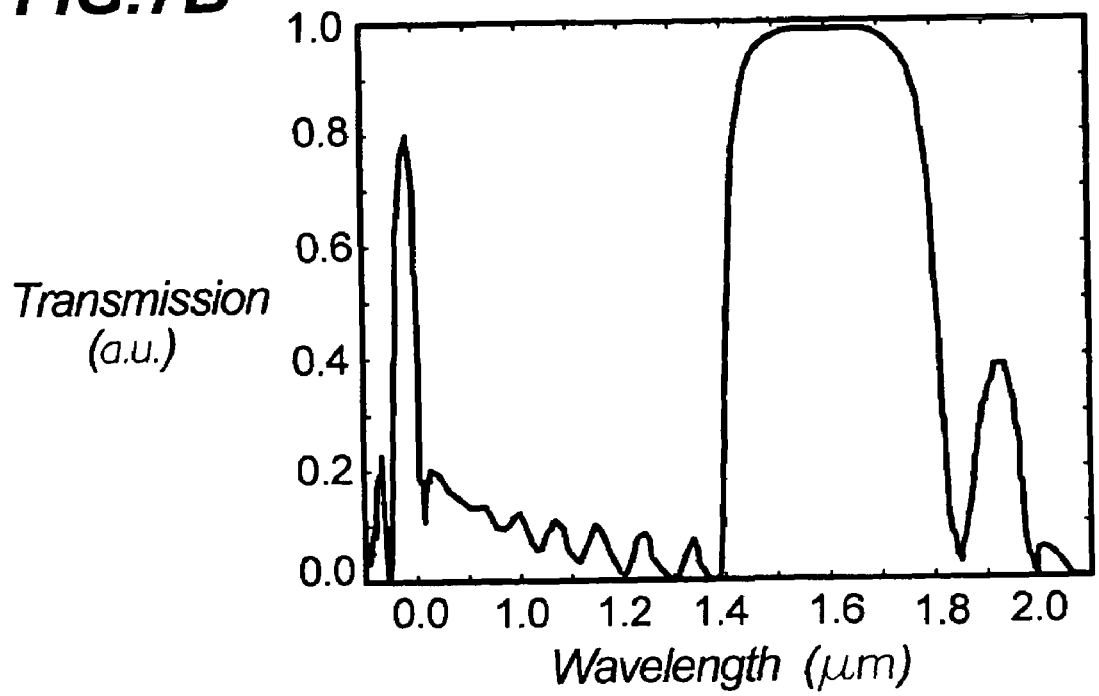
FIG. 7B is a plot of the calculated $HE_{11}$ mode transmission spectrum as a function of wavelength for the fiber of FIG. 4.

FIG. 7B is a plot of the calculated transmission spectrum for the fiber, based on the leaky mode technique. This calculated spectrum compares well with the measured spectra of the plot of FIG. 5, demonstrating high transmission at wavelengths corresponding to the first and second order photonic bandgaps.

Figure 8A:
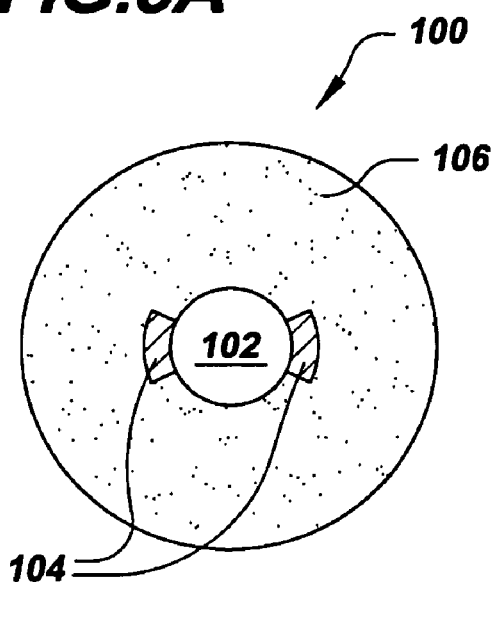
FIGS. 8A-8C are schematic cross-sectional views of three example fiber photodetectors provided by the invention for photodetection.
Figure 8B:
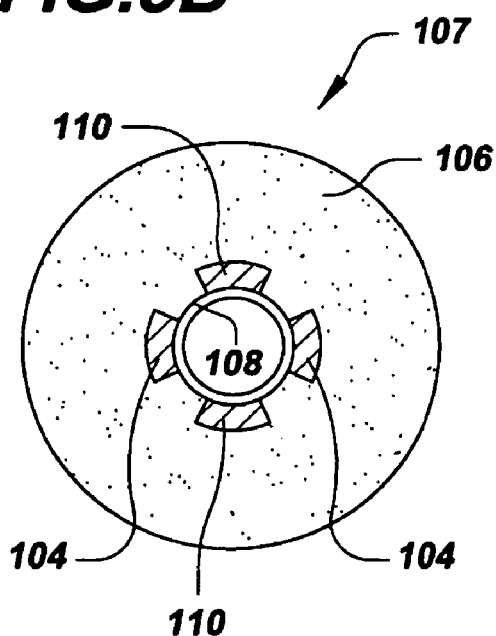
Figure 8C:
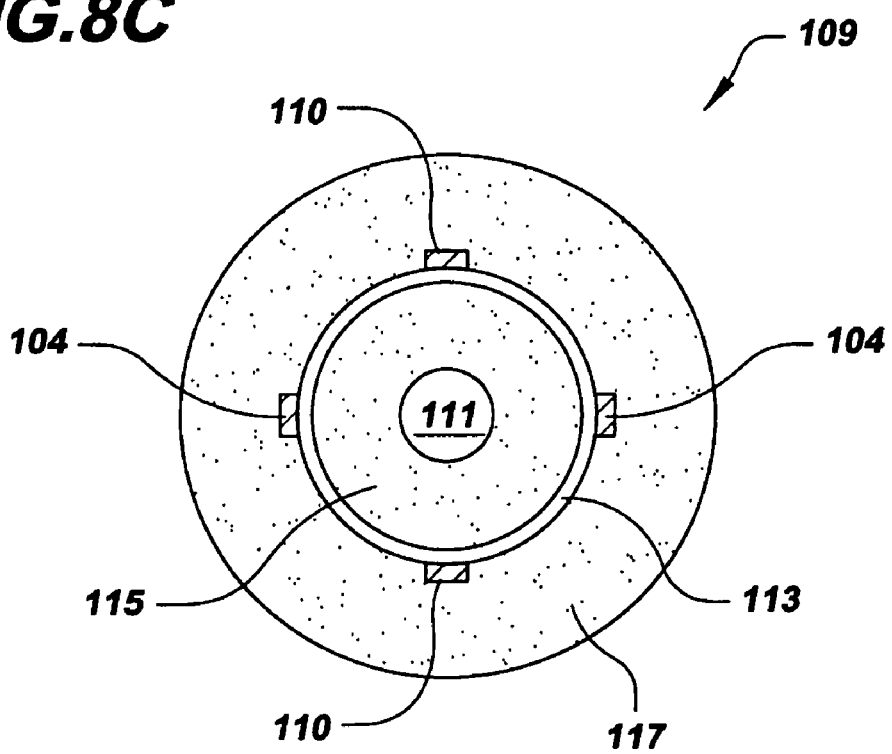

The invention provides fiber configurations and manufacturing processes that enable the detection of various properties of electromagnetic waves including: intensity, wavelength composition, phase and direction of propagation using a single fiber or an assembly of such fibers, in a woven mat, grid, fabric, or three dimensional assemblies of fibers, or multiple arrangements of such. Each of these configurations provided by the invention will be described in detail below. Turning first to FIGS. 8A-8C, three example single-fiber photodetector configurations provided by the invention are shown in cross section. In a first example fiber photodetector configuration 100 there is provided a solid photoconductive core 102, e.g., a semiconducting core such as one of the chalcogenide glasses described above. A pair of metal electrodes 104 is provided in direct contact with the core along the full length of the core 102. An insulating layer 106 that preferably is substantially transparent to an illumination wavelength or wavelengths of interest coaxially covers the electrodes and core. In a second example fiber photodetector configuration 107 shown in FIG. 8B there is provided a hollow photoconductive core 108, e.g., a hollow glass core as described above. Two pairs 104, 110 of conducting electrodes are provided in direct contact with and along the length of the hollow core 108. An insulating layer 106 coaxially covers the electrodes and core.

Turning to FIG. 8C there is shown a third example fiber photodetector configuration 109. Here is provided a hollow core 111 around which is disposed a first insulating layer 115. A photoconductive layer 113 is bound between the inner insulating layer 115 and an outer insulating layer 117. Two pairs 104, 110 of conducting electrodes are provided in direct contact with and along the length of the thin film photoconductive layer 113. These three examples illustrate some of the features that can be selectively incorporated into a fiber photodetector of the invention. The invention is not limited to a particular number of electrode pairs or the combining of those pairs with a particular photoconductive element such as a solid or hollow core or layered region. Any suitable arrangement of electrode pairs and photoconductive element configurations can be employed, as shown below. For example, the electrodes can be positioned internal to a semiconducting tube or positioned on an inner surface of a semiconducting layer. No particular electrode location is required so long as contact with the semiconducting element is achieved.

Turning to the materials employed in the fiber photodetector, the photoconductive element of the photodetector, e.g., the fiber core, whether solid or hollow, or other layered or bulk photoconductive fiber element, is provided as a photoconductive material that can be codrawn with a metal and an insulating material into fiber form. As described in detail above, noncrystalline amorphous and glassy materials, as defined previously, are particularly well-suited to be co-drawn from a preform into fiber form using high speed drawing techniques. A non-composite, non-particulate, continuous, amorphous semiconductor, and in particular any of the semiconducting chalcogenide glasses described above, can for many applications be a preferred photoconductive element material. It is here meant that the continuity and/or non-composite characteristic of the semiconductor be provided in at least one fiber direction, e.g., the circumferential or axial fiber direction. Homogeneous, inorganic photoconductive materials, and in particular semiconductors of this character, are particularly preferred. A wide range of such materials can be co-drawn with conducting and insulating materials.

It is recognized, that amorphous semiconductors of the chalcogenide family can be crystallized by illumination, application of electrical pulse, or by heat treatment. Therefore, once a fiber photoconductor is drawn, the semiconducting element can be induced to crystallize, if such is desirable for a given application. Chalcogenide materials have the key characteristic of changing phase from the amorphous to crystalline state when subject to laser heating or electrical pulsing. The transition of the material is accomplished by forming a crystalline filament between the electrodes. A current pulse with a long duration is supplied to the bi-stable material to transition it to a polycrystalline state, while a pulse with a high amplitude and short duration is used to place the material back into an amorphous structure, removing the formed crystalline filament if desired. With this technique, there can be obtained regions of the semiconducting element that are glassy and regions that are crystalline.

For many applications, it can be preferred that the semiconductor be characterized by a bandgap structure that inherently enables hole and electron charge generation and corresponding photocurrent generation in response to incident illumination and without specialized processing such as a dye application. A semiconductor having a band gap of less than about 3 eV, or more particularly less than about 2.5 eV or 2 eV can therefore be preferred. The semiconducting property of the material is preferably homogeneous and continuous along a given line and not in a composite or matrix form. With these characteristics, the semiconducting element can be provided in a selected geometry and configuration within the fiber while producing photogenerated charge.

The insulating layer or layers can be provided as any suitable insulating material that similarly can be co-drawn with the photoconductive element and the conducting electrodes. Amorphous, polymeric insulating materials as defined above, e.g., PEI and PES, can for many applications be preferred. The insulating material is preferably transparent to a selected wavelength or band of wavelengths for which the fiber photodetector is configured if the insulating material is disposed along a path of illumination to the photoconductive material. The insulator need not be provided covering the electrodes unless such is required for process and/or handling considerations.

The photodetector electrodes can be provided as any suitable conducting material that can be co-drawn with the photoconductive and insulating materials, as explained previously. For many applications, a metal including Sn is well-suited for ease of preform assembly and drawing. Whatever conducting material is selected, such preferably is tailored to accommodate the drawing temperatures of the selected photoconductive and insulating materials. For example, a metallic composition of about 95% Sn and 5% Ag can be preferred for matching chalcogenide glass and polymeric insulting draw temperatures. The fiber photodetector can be fabricated in accordance with the invention by configuring a preform with the selected photoconductive material, electrode material, and insulating layer. The preform is then drawn in the manner described above to produce the fiber photodetector.

In one experimental example in accordance with the invention, the fiber photodetector configuration of FIG. 8A was formed with a 500 µm-diameter semiconducting core region of $As_2Se_3$ chalcogenide glass directly contacted by two Sn metal electrodes each of 65 µm in radial thickness and 180 µm in circumferential length, along the longitudinal length of the fiber. A layer of PES was provided around the metal electrodes. The fiber preform was produced in the manner described previously, with the $As_2Se_3$ chalcogenide glass core chemically synthesized to produce a solid glass core. The metal electrodes were formed of Sn foil cut into rectangles and inserted into corresponding regions cut into a PES film. The Sn-PES structure was then wrapped around the glass core, and additional PES layers were wrapped around the assembly.

The preform was consolidated at a pressure of $10^{-3}$ Torr and a temperature of 260° C. The preform was then drawn under conditions with a top zone temperature of between 190° C.-230° C. and a draw zone temperature of between 290° C. and 295° C. A downfeed speed of 0.003 mm/min and a capstan speed of 1 m/min were employed.

Figure 11:
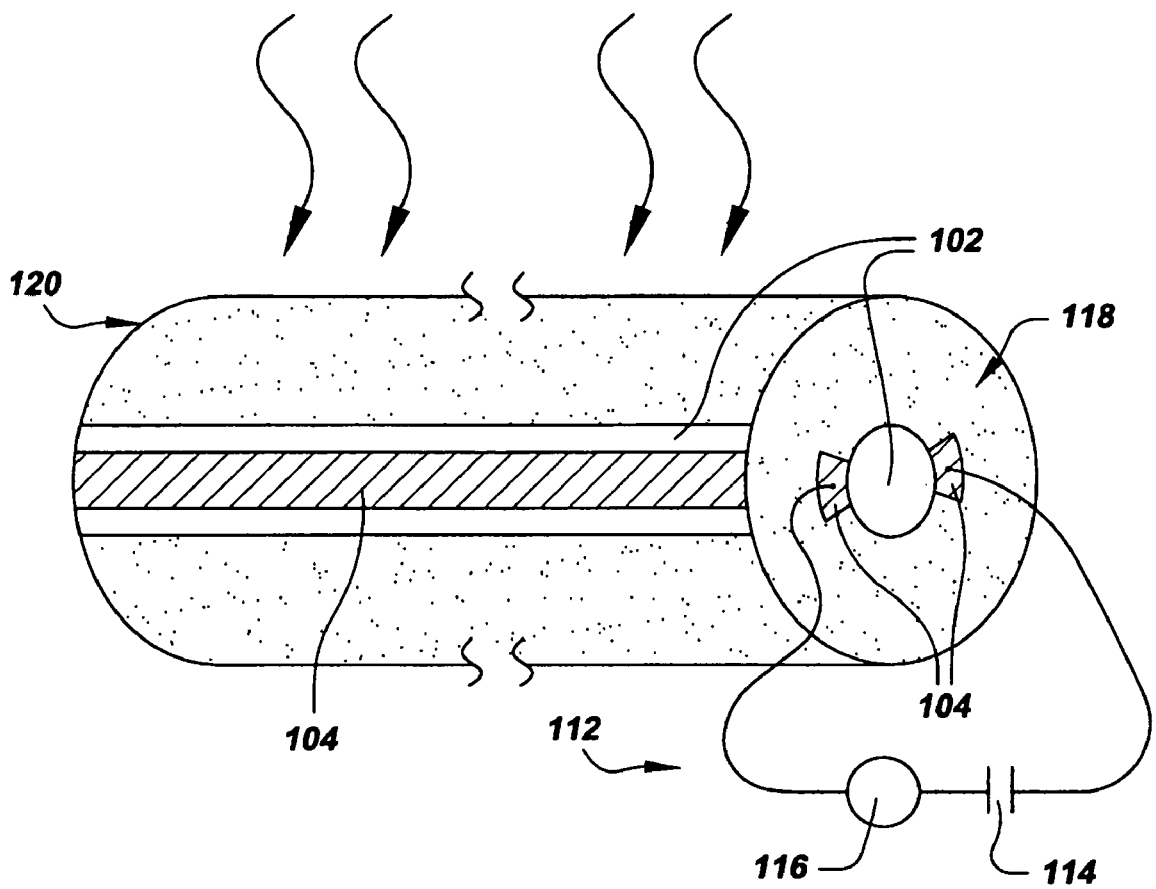
FIG. 11 is a schematic view of a fiber photodetector of the invention shown connected in a photodetection circuit.

Referring to FIG. 11, in operation of the fiber photodetector, the electrodes are connected in a circuit configured to apply a selected bias voltage between the electrodes. The electrodes thereby support a bias voltage across the photoconductive element, e.g., a core region, along the core length. Once the fiber photodetector is drawn, electrical connection to the electrodes can be made by first removing any insulating or other materials covering an edge of the electrodes at the end of the fiber and then, e.g., bonding wires to the electrodes with a conducting paint such as silver paint, by thermal bonding, or by other suitable technique, either manual or automated. As shown in FIG. 11, the electrodes are connected in a circuit 112 with, e.g., a voltage source 114 provided for supplying the bias voltage. Any suitable voltage generation means can be employed. Also included in the circuit is an ammeter 116 or other device for enabling a measurement of current in the circuit.

As shown in FIG. 11, each electrode in the electrode pair can be connected to the circuit 112 at a common side 118 of the fiber. Alternatively, one electrode can be connected in the circuit at a first fiber side 118 and the second electrode connected in the circuit at a second fiber side 120. Such a multi-sided connection can be preferred to enable continued device operation after the occurrence of a mechanical break in one of the electrodes; even with a break the voltage bias and circuit connections are maintained in this connection. The fiber photodetector has no voltage polarity in this example, i.e., the voltage bias can be applied in either a positive or a negative sense to either of the electrodes in the pair.

With a bias voltage applied between the electrodes, illumination of the fiber causes the generation of photo-induced electron-hole pairs at the surface of the fiber's photoconductive element. Once such charges are generated, they are separated by an electric field produced between the electrodes by the bias voltage, with holes and electrons swept towards opposing electrodes. The charge carriers then are conducted by the electrodes to the connected circuit. The electrodes thereby function simultaneously as sensing elements as well as signal transduction elements.

The invention does not require that the illumination to be detected be incident externally from the fiber. Alternatively, illumination can be directed internally through the fiber, e.g., through the fiber core, to be detected by a photoconductive element positioned in the fiber. This configuration is illustrated in FIG. 3F described above, where the photoconductive elements 62 are provided in a fiber distributed through the fiber cross section with a region 68, 70, 72 for guiding illumination. In this way, internal illumination, external illumination, or both, can be detected and processed.

Figure 9A:
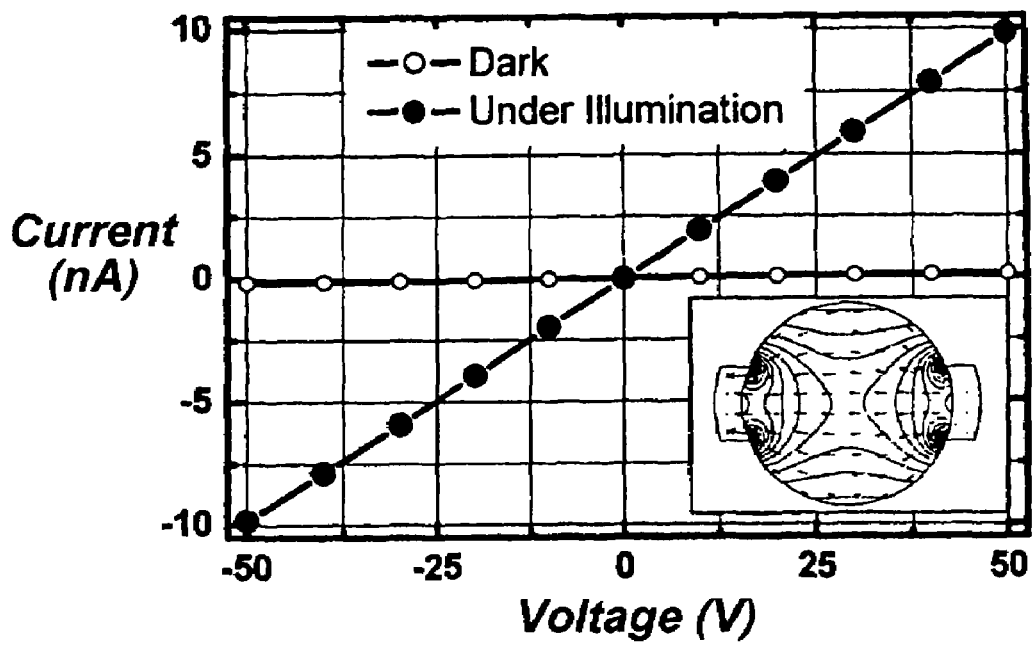
FIG. 9A is a plot of experimentally measured current-voltage characteristics of the fiber photodetector configuration of FIG. 8A.

The photo-response of the experimentally manufactured fiber photodetector described just above was measured using a Yokagawa pico-ampere meter, from Yokagawa of America, Atlanta, Ga., and a HP4140B DC voltage source from Hewlett Packard, Palo Alto, Calif. For ease of measurement, a high input-impedance operational amplifier can be employed for measuring the current in the circuit, e.g., with a precision low power JFET amplifier, AD8625 from Analog Devices, Norwood, Mass. To test the photodetector, the fiber was illuminated using white light from a quartz-tungsten-halogen lamp. The illumination resulted in a conductivity enhancement of up to two orders of magnitude, dramatically decreasing the electrical resistance of the fiber and verifying the operation of the fiber as a photodetector device. FIG. 9A is a plot of the photo-response of the fiber photodetector. For a selected bias voltage application, the measured current is proportional to the resistance of the fiber, which in turn is proportional to the collected illumination power. The linear behavior of the I-V plot of FIG. 9A is indicative of ohmic behavior in the structure; no Schottky effects at the metal-semiconductor junction were observed over the range of measurement. It is to be noted that the photodetector fiber could alternatively be operated in a capacitive rather than resistive detection mode.

Figure 9B:
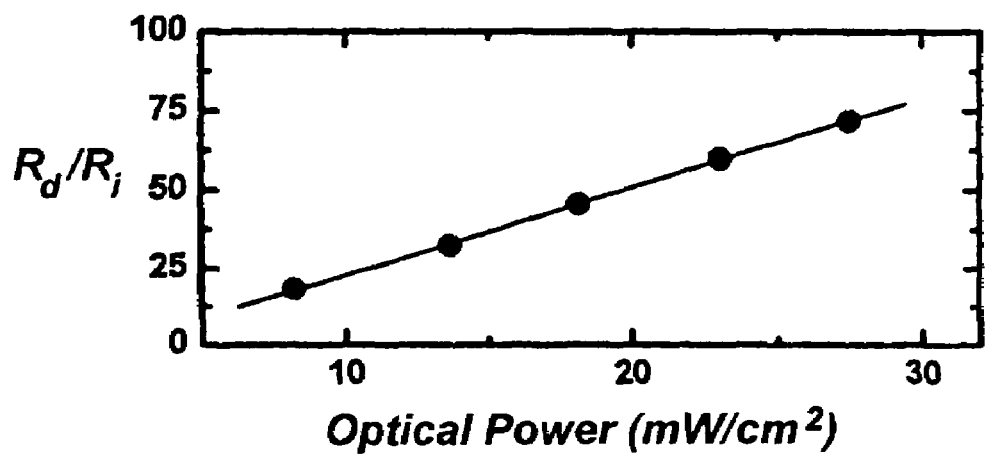
FIG. 9B is a plot of experimentally measured fiber resistance as a function of illumination intensity for the fiber photodetector configuration of FIG. 8A.

FIG. 9B is a plot the dependence of the fiber photodetector's conductivity on optical illumination intensity, which was found to be linear over the range of measurement. This parameter is plotted as the ratio of the dark resistance, $R_d$, of the fiber under dark, i.e., non-illuminated, conditions and the illuminated resistance, $R_i$, of the fiber under illumination. The electric field lines produced by the applied voltage one the electrodes across the core were simulated using finite element techniques and are shown in the inset of FIG. 9A.

Figure 10A:
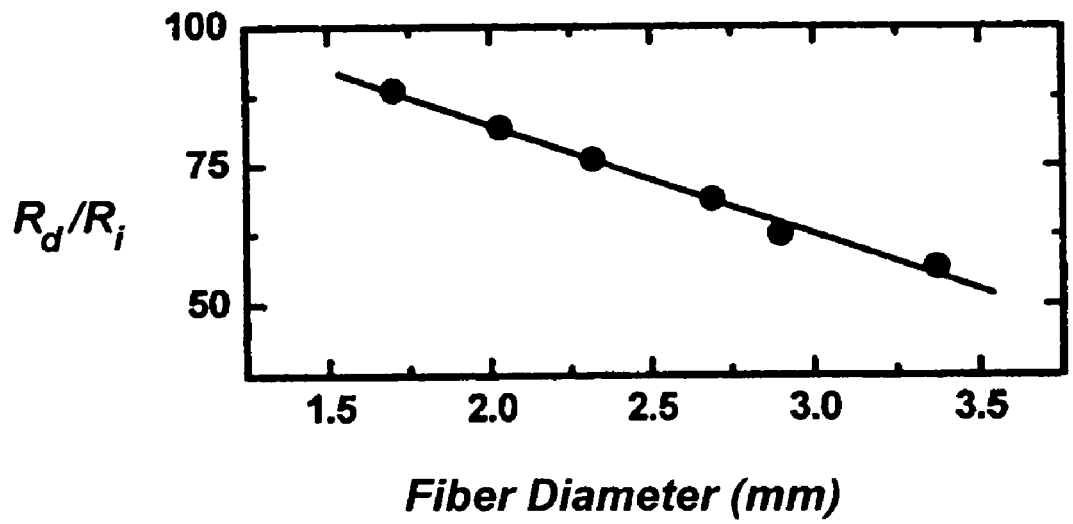
FIG. 10A is a plot of experimentally measured fiber resistance as a function of fiber diameter for a given fiber illumination, for the fiber photodetector configuration of FIG. 8A.

The photosensitivity of the fiber photodetector scales inversely with its diameter, and thus fibers with smaller diameters are understood to exhibit increased photosensitivity. FIG. 10A is a plot of fiber photodetector resistance under illumination, $R_i$, as a function of fiber diameter. It can be shown from simple scaling arguments that a reduction in fiber dimensions will not change the dark resistance, $R_d$. However, upon illumination, a conducting layer is formed along the circumference of the fiber having a thickness that is determined solely by the penetration depth of the illuminated light, which is independent of diameter. The resistance of this layer scales linearly with fiber length, which in turn is proportional to the fiber diameter, resulting in the observed linear dependence of the illuminated fiber's resistance diameter.

Figure 10B:
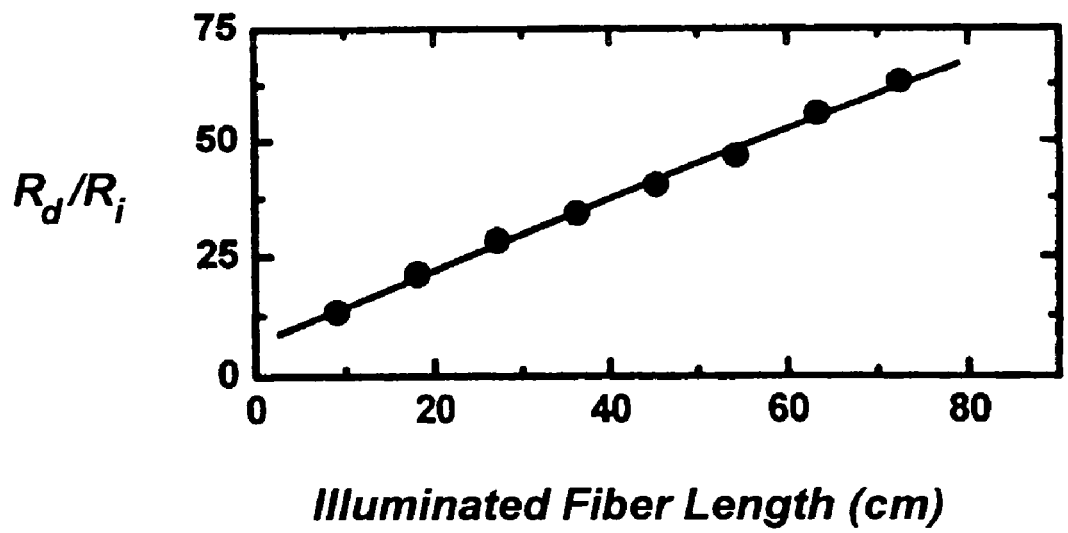
FIG. 10B is a plot of experimentally measured fiber resistance as a function of illuminated fiber length for a given fiber illumination, for the fiber photodetector configuration of FIG. 8A.

The fiber photodetector's photogenerated current also depends on the length of the illuminated portion of the fiber. FIG. 10B is a plot of fiber resistance under illumination, $R_i$, as a function of illuminated fiber length. This result demonstrates that the fiber photodetector exhibits truly distributed characteristics. The photodetection functionality is continuous along the fiber length, in contrast to conventional photodetecting elements that typically are point-like sensors having a sensing ambient that is limited to the micron scale.

The fiber photodetector response is reminiscent of a metal-semiconductor-metal photodetector (DMSM), but provides particular advantages over that structure. Being sensitive to light along the entire fiber length, the fiber photodetector can collect a considerable amount of optical power. The collected optical power is transferred efficiently by the electrodes provided along the fiber length for charge collection; the electrodes provide dual charge collection and charge transport functions, resulting in a particularly elegant device design. The fiber photodetector is mechanically tough, yet very flexible, facilitating its configuration into various geometric arrangements, as described below. Indeed, the fiber photodetector is particularly robust in that it can maintain photodetection properties even when subjected to elevated temperatures, e.g., greater than 150° C. or 200° C. for 24 hours. Finally, the fiber photodetector is essentially transparent, whereby an optical beam incident on the fiber is only slightly perturbed. As described in detail below, these various attributes enable adaptation of the fiber photodetector for a range of applications. For example, the hybrid fiber array of FIG. 3G can be configured as an array of fiber photodetectors. Other configurations can also be arranged to enhance and/or exploit the photoresponse of the photodetector fiber as described in detail below.

For example, the fiber photodetector configurations of FIGS. 8B and 8C, employing a photoconductive region layer rather than a solid core photoconductive region, as in the configuration of FIG. 8A, can be preferred for various applications. The dark current and dark resistance of a thin film or hollow-core photoconductive region can be many times less than that of a solid photoconductive core. A bulk photoconductive core thickness is in general orders of magnitude greater than the light penetration depth of a typical photoconductive material such as a chalcogenide glass. As a result, a photoconductive bulk core contributes substantial component of dark current to a photoconductive signal. Conversely, a hollow photoconductive core or layered element in the fiber photodetector produces a relatively low level of dark current, and produces substantially the same level of photogenerated current as a solid photoconductive element. As a result, the signal-to-noise ratio of a thin film or hollow-core photoconductive element is in general much larger than that of a solid-core photoconductive element, and thus this configuration can be preferred for applications in which such is a desirable.

Figure 12A:
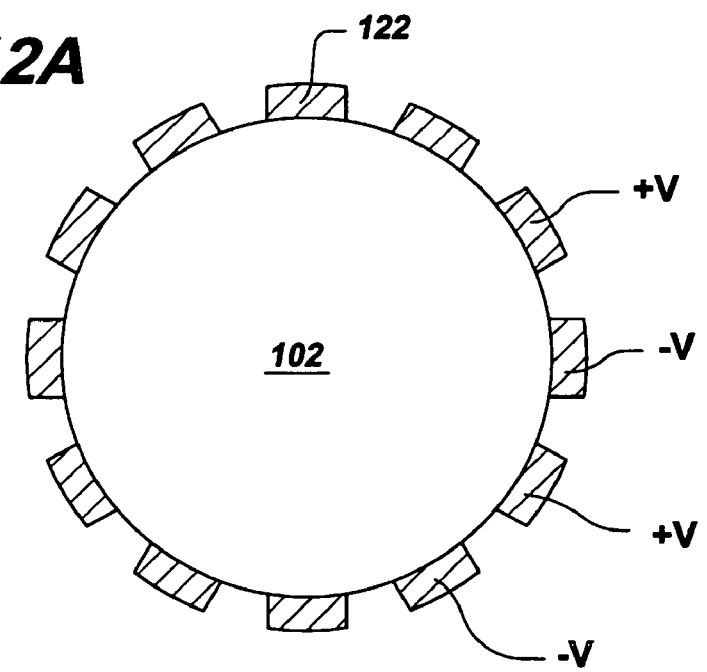
FIGS. 12A-12C are schematic cross-sectional views of example configurations for electrodes for the fiber photodetector of the invention.

Turning to FIG. 12A, there is shown a further example of a fiber photodetector electrode configuration, here shown in cross section with a photoconductive solid core 102. In direct contact with the core and extending along the length of the core is an array of electrodes 122. The electrodes are configured in corresponding circuit arrangements enabling photo-generated charge collection at the circumferential region local to each electrode. For example, the electrodes can be grouped into pairs, with each electrode in a pair connected to either the positive or negative polarity of a detection circuit like that shown in FIG. 11. Alternatively three electrodes can be grouped with a central one of the three electrodes set at ground potential and the other two electrodes connected to respective detection circuits.

With this configuration, the full circumference of the photoconductive core can be partitioned into angular detection regions. Illumination of a given detection region can be identified by a change in detection current in the corresponding detection circuit. As a result, directional photodetection can with this arrangement be accomplished with a single fiber photodetector. Any number of electrodes can be employed to produce a desired resolution in the partitioning of angular detection regions.

Figure 12B:
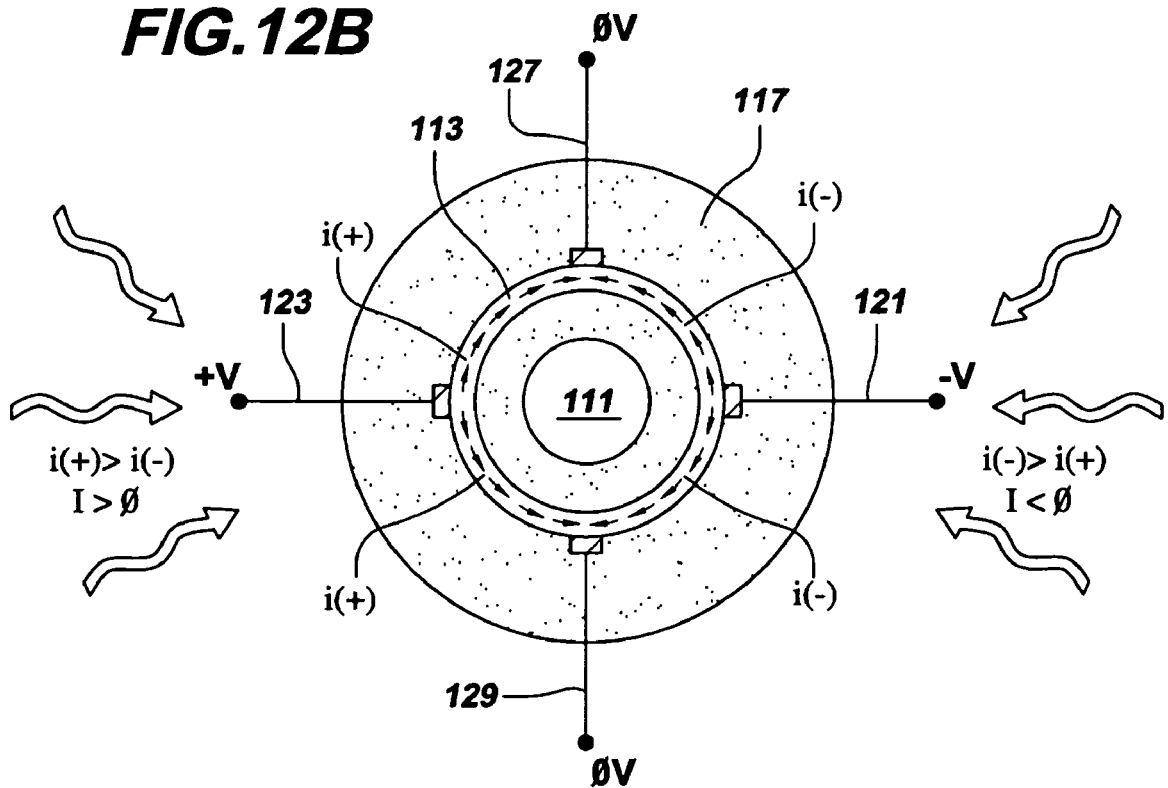

A more specific example of employing angular detection regions is shown in FIG. 12B. Here is employed a thin film photoconductive element 113 having four electrodes contacting the element, with a first electrode 121 connected to a negative bias voltage, −V, a second electrode 123 connected to a positive bias voltage, +V, and two electrodes 127, 129 connected to ground, 0 V. This configuration enables distinguishing illumination incident on the right side of the fiber photodetector from that incident on the left side of the fiber photodetector.

Illumination incident on the right side of the photodetector causes negative charge generated in the photoconductive layer 113 to migrate from the negative polarity electrode 121 to the grounded electrodes 127, 129. Illumination incident on the left side of the photodetector causes positive charge generated in the photoconductive layer to migrate from the positive polarity electrode 123 to the grounded electrodes 127, 129. As a result, right-sided incident illumination produces a net photocurrent, I, that is negative, while left-sided incident illumination produces a net photocurrent, I, that is positive. This example electrode placement and biasing arrangement can of course be adapted to adjust the angles of incident illumination that produce positive or negative net photocurrent.

Figure 12C:
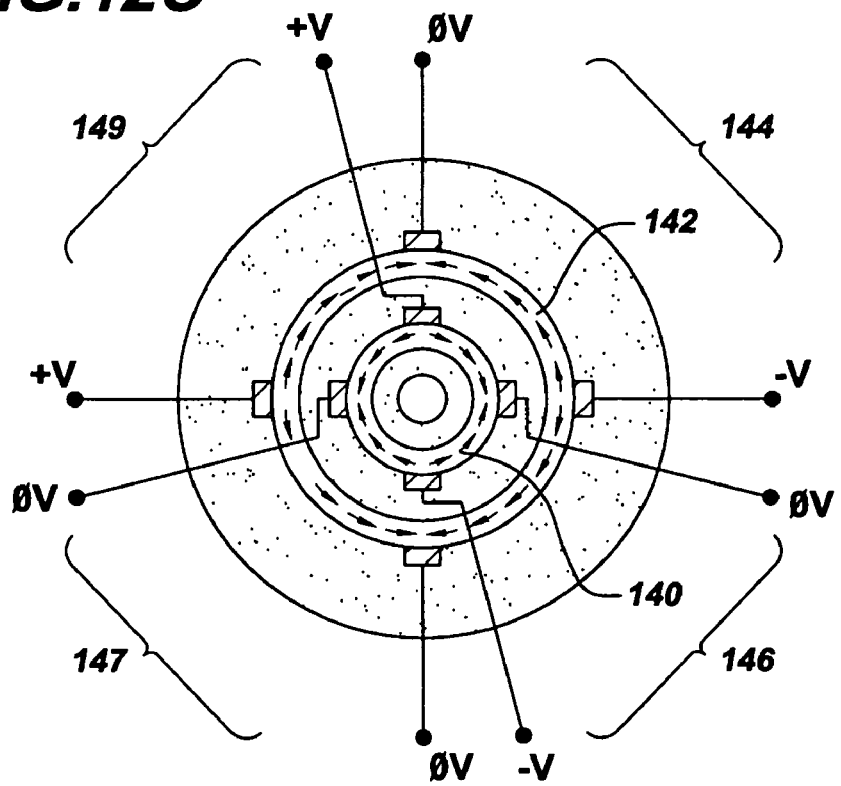

For example, referring to FIG. 12 C, there is provided a fiber photodetector having two thin film photoconductive elements 140, 142. Four electrodes are disposed contacting the inner photoconductive element 140 and four electrodes are disposed contacting the outer photoconductive element 142. The outer photoconductive element 142 and its associated electrodes are configured as in FIG. 12B, with two electrodes grounded, one electrode at a more positive bias voltage, and one electrode at a more negative bias voltage. The inner photoconductive element 140 and its associated electrodes are similarly configured, but rotated by 90°. This double-photoconductive element configuration produces the direction of current flow shown in FIG. 12C. In a first angular quadrant of incident illumination 144, the inner configuration produces a net negative photocurrent and the outer configuration produces a net positive photocurrent. In a second illumination quadrant 146, both configurations produce a net negative photocurrent. In a third illumination quadrant 147, the inner configuration produces a net positive photocurrent and the outer configuration produces a net negative photocurrent. In a final illumination quadrant 149, both configurations produce a net positive photocurrent. As a result, four directions of illumination can be distinguished by this fiber photodetector arrangement. This example demonstrates that with selected photoconductive element and electrode arrangements, the direction of incident illumination can be discerned by a single fiber photodetector and with a desired angular resolution.

In addition to enabling directional detection, multiple electrode pairs can further be employed for enhancing the speed of photodetection. Because the electric field produced by an electrode pair is inversely proportional to the distance between the electrodes of the pair, the closer together two electrodes are placed, the stronger the electric field and the faster the corresponding charge separation and collection. With multiple electrode pairs positioned around the fiber core circumference and connected to corresponding detection circuits, increased electric field strength and faster detection response can thereby be achieved.

It is to be recognized that as the number of electrodes provided on the photoconductive core is increased, the circumferential surface area of the core that can be illuminated is reduced, given an opaque electrode metal such as Sn. This reduced illumination results in reduction of the photo-generated charge that is produced by the fiber, and thereby reduces the strength of the detection signal from the fiber. It can therefore be preferred to consider the tradeoff in signal strength required for increased detection speed and/or directional detection. To compensate for this tradeoff, the electrodes can be rendered as narrow as possible, or if possible, provided as a transparent material.

In the experimental fiber photodetector just described, a semiconducting fiber core of $As_2Se_3$ glass was employed. The electronic mobility edge of $As_2Se_3$ glass corresponds to a wavelength of 650 nm, making this fiber configuration an efficient photo-detector over the visible range as well as near IR range of illumination. Thus, in this example, the fiber core is characterized by an illumination wavelength absorption bandwidth, i.e., a bandwidth of illumination wavelengths that can be absorbed by the core for producing photo-generated electron-hole pairs. The fiber cannot discriminate between absorbed wavelengths within the absorption bandwidth, instead indicating if any of the multiple illumination wavelengths within the bandwidth have been absorbed. Illumination outside of the characteristic bandwidth cannot be absorbed and therefore cannot be detected by the fiber. Thus, in the configurations of FIGS. 8A-8C, the fiber photodetector is a broadband detector that can be employed to monitor a band of wavelengths that can be absorbed by the fiber photoconductive element.

It is recognized in accordance with the invention that the range of wavelengths to be absorbed by a fiber photodetector can be expanded through selected compositional changes to the photoconductive material. For example, chemical synthesis of a chalcogenide glass enables customized glass composition and empirical analysis of absorption wavelengths corresponding to a produced composition. In this way, a photoconductive element composition can be chemically tuned to a selected absorption bandwidth. In one example of such tuning, the absorption edge of a chalcogenide glass can be adjusted from 0.8 µm to 1.5 µm by changing the percentage of Te in the glass between 0% and 20%, respectively.

The invention further provides narrow-band fiber photodetector configurations that enable fine tuning of absorption wavelengths to a narrow band of wavelengths or substantially one wavelength. An example narrow-band fiber photodetector provided by the invention is shown in cross-section in FIG. 13A. Here a photoconductive core 102, e.g., a chalcogenide glass core, is in direct contact with two pairs of electrodes 104, 110, in the manner given above. No particular number of electrode pairs is here required. A single radial mode cylindrical-shell resonant optical cavity structure 125 is located in the optical path separating the photoconductive core from ambient illumination sources. In this example, the cavity structure 125 is provided around the entire circumference of the fiber at a selected radius, thereby surrounding the core. An insulator 106 is provided around the cavity structure and between the core and cavity structure.

With this arrangement, external illumination of a wavelength that substantially matches the wavelength of the cavity structure's resonance wavelength is transmitted through the cavity, to be absorbed by the photoconductive core, while all other wavelengths are reflected by the cavity. FIG. 13B is an example resonant optical cavity structure 125 that can be here employed. The resonant optical cavity structure 125 includes a resonant cavity 126 layered between two dielectric mirror structures 128. Each dielectric mirror structure is formed of alternating layers of a selected semiconductor 130 and a selected insulator 132 in the manner described above and shown in the configuration of FIG. 4.

The resonant cavity and dielectric mirror structures operate to reflect all wavelengths except that which corresponds to the final drawn-fiber diameter, $d_f$, of the resonant cavity, with the wavelength that is transmitted, $\lambda_t$, given as $\lambda_t = 2n_c \cdot d_f$, for a so-called $\lambda/2$ resonant cavity, where $n_c$ is the refractive index of the cavity material. The final drawn-fiber diameter of the resonant cavity is based on the resonant cavity diameter of the preform, $d_i$, and on the fiber draw-down ratio, as $d_f = d_i \cdot D_f/D_i$, where $D_f/D_i$ is the drawdown ratio of the fiber drawing process. The dielectric mirror structures can be correspondingly provided with suitable layer thicknesses for, e.g., in a $\lambda/2$ structure, employing, for example, eight pairs of semiconducting and insulating layers. With this arrangement, the resonant cavity and dielectric mirror structures can be designed to produce a selected wavelength of absorption for the fiber photodetector. This wavelength-specific photodetection enables a spectroscopic fiber photodetection response.

In accordance with the invention, there can be included a cascade of resonant cavities in a fiber photodetector to fine tune the bandwidth of illumination detection of the fiber. The resonant optical cavity structure 125 can be duplicated, with each cavity structure having distinct geometries that together provide a band of illumination that can be detected, centered around a selected wavelength, if desired.

The spectroscopic, or narrow-band fiber photodetector can be manufactured in the manner given above and shown in FIGS. 3 and 4 above, e.g., with a preform including a selected chalcogenide glass core, metal electrodes, chalcogenide and amorphous polymer resonant cavity structure layers, and an amorphous polymer cladding. The assembled preform is drawn in the manner described above to produce the spectroscopic fiber photodetector.

Figure 13A:
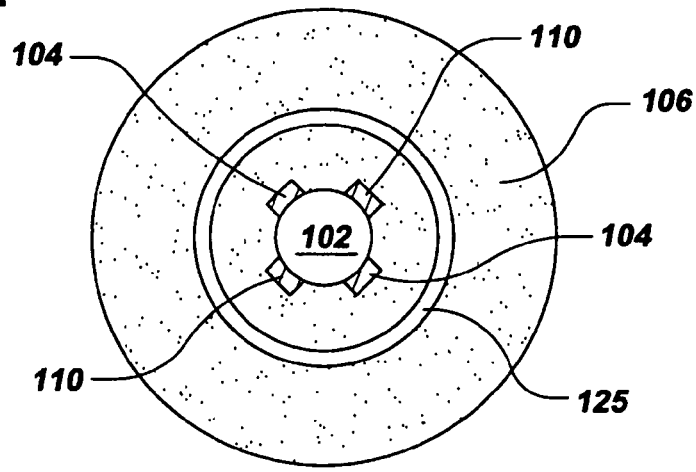
FIGS. 13A-13B are schematic cross-sectional views of a narrow-band fiber photodetector of the invention and an optical resonator included in the photodetector, respectively.
Figure 13B:
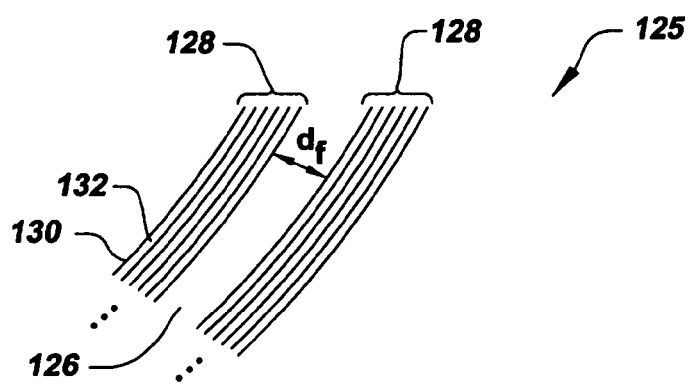

The spectroscopic fiber photodetector configuration of FIGS. 13A-13B was experimentally manufactured and tested for a number of selected wavelengths. The photodetector was provided with a 200 µm-thick solid photoconductive core of the semiconducting chalcogenide glass $As_{40}Se_{50}Te_{10}Sn_5$ (AST-Sn), which is characterized by a transparency window of between 1.2 µm and 16 µm. This glass was chemically synthesized, in the manner described previously, here employing As, Se, Te, and Sn elements in the sealed-ampoule melt-quenching technique. AST-Sn was found to be a particularly well-suited core material not only because it is characterized by a large photoconductivity across a range of wavelengths, but also because it is highly compatible with PEI in the fiber drawing process and is highly stable against crystallization during the fiber drawing process. Sn metal electrodes of 18 µm in thickness and 30 µm in width were cut and arranged in a PEI layer that was wrapped around the glass core.

Figure 14A:
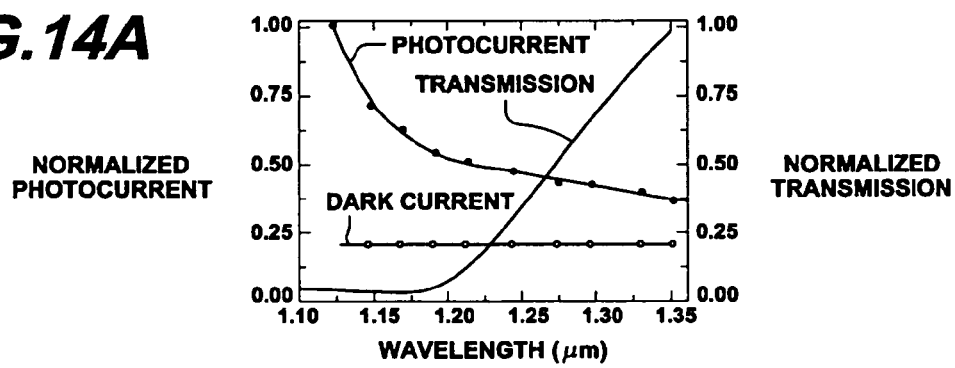
FIGS. 14A-14D are plots of measured photocurrent and reflectance data for a broad band fiber photodetector of the invention and three narrow-band fiber photodetectors of the invention, respectively.

First to confirm the fidelity of the metal electrode-semiconductor core contact and to characterize the photoconductive properties of the AST-Sn core, the broad-band photoconductive response of a two-electrode, AST-Sn core fiber photodetector of 890 µm in diameter was measured without a resonant cavity formed on the fiber, thereby having the configuration of FIG. 8A. FIG. 14A is a plot of experimentally measured photocurrent as a function of wavelength for this fiber. In making the measurements, a 50 V DC voltage was applied to the electrodes and the resulting current under illumination was measured using a Yokagawa pico-ampere meter, from Yokagawa of America, Atlanta, Ga., and a HP4140B DC voltage source from Hewlett Packard, Palo Alto, Calif. The fiber illumination was produced with a laser beam from a tunable Optical Parametric Oscillator (OPO) from Coherent, Santa Clara, Calif. Optical transmission of a bulk AST-Sn glass core of 12 mm in diameter and 5 mm in length was determined by FTIR measurement. This optical transmission characteristic is also shown in the plot of FIG. 14A. The measured spectral photoconductive response is commensurate with the optical transmission measurement.

To form spectroscopic fiber photodetectors, the AST-Sn core and electrodes were wrapped with layers of PEI and then with a resonant cavity structure bounded on each side by three pairs of λ/4 multilayers consisting of $As_2Se_3$ and PEI, with the λ/2 resonant cavity layer of PEI provided in the middle. $As_2Se_3$ is characterized by a refractive index of 2.83 and PEI is characterized by a refractive index of 1.65 at 1.5 µm. The resonant cavity structure was situated at the outer surface of the fiber for the testing. The assembled preforms were consolidated under vacuum in the manner described previously and then drawn into fibers in a three-zone vertical tube furnace at a temperature of 300° C., at speeds ranging from 0.7 m/min to 3 m/min.

Three narrow-band fiber photodetectors were produced with this process, having outer diameters of 870 µm, 890 µm, and 920 µm. Narrow-band fiber photodetectors of these diameters have absorption wavelengths of 1.26 µm, 1.29 µm, and 1.33 µm, respectively, calculated based on a transfer matrix method and with the corresponding resonant cavity dimensions; for example, the thicknesses of the $As_2Se_3$ and PEI layers for the 920 µm diameter fiber were 117 nm and 204 nm, respectively.

Figure 14B:
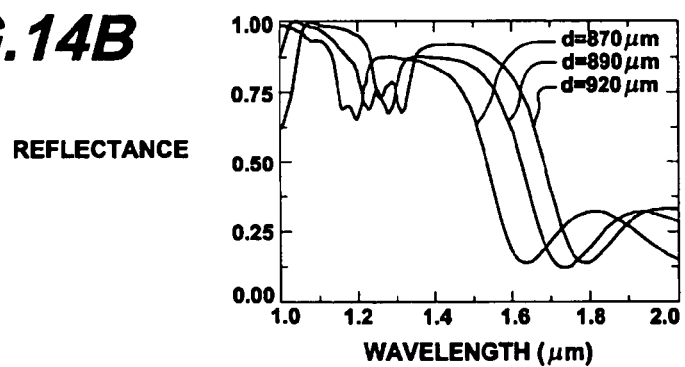

The reflectivity of the optical cavity structures of the three fibers was measured individually for each fiber with an FTIR spectrometer configured with an infrared microscope and a Fourier transform infrared spectrometer. The plot of FIG. 14B presents this measured reflectance data. The FTIR spectra agree well with the calculated spectra. Because the microscope objective admits a range of angles that vary from normal incidence to 35°, the observed dip in the reflection spectra is wider and shallower than predicted. It is further noted that the cavity resonance can shift slightly in wavelength as the angle of incidence changes. The large angular cone, as determined by the microscope objective numerical aperture (NA) of 0.58, can lead to an averaging effect that reduces the quality factor of the cavity mode.

In order to characterize the optoelectronic response of narrow-band fibers, it can be useful to measure both the electrical photocurrent and the optical reflectivity of a fiber simultaneously. To achieve this measurement, the three experimental narrow-band fiber photodetectors were illuminated with the OPO laser beam and the back-reflected light was measured through a beam splitter while the generated photocurrent was simultaneously monitored. A Verdi™ V-10 laser from Coherent, Santa Clara, Calif., was employed to pump a Mira™ 900 Ti—S femtosecond laser from Coherent, Santa Clara, Calif. The femtosecond laser beam was down-converted using a Mira™-OPO from Coherent, Santa Clara, Calif. The OPO beam was focused onto the outer surface of a fiber using a ×5 microscope objective with a NA 0.1. The optical power was maintained at 30 mW, using a variable optical attenuator, while the wavelength of the laser beam was swept.

Figure 14C:
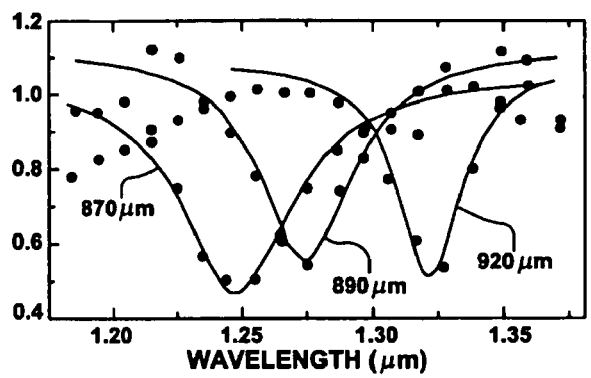
Figure 14D:
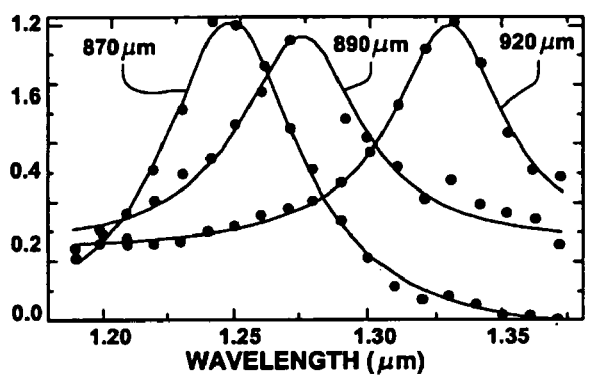

FIG. 14C is a plot of the measured back-reflected light power for the three different fibers as a function of wavelength. FIG. 14D is a plot of the photocurrent for the three fibers as measured simultaneously with the back-reflection. At the resonance wavelength of each of the fibers, the measured back-reflection is diminished because some optical power is at that wavelength admitted through the cavity and into the photoconductive core; the corresponding photocurrent is accordingly enhanced at the resonance wavelength.

These experimental results demonstrate that individual spectroscopic fiber photodetectors provided by the invention are wavelength-sensitive and, like the broad-band fiber photodetectors of the invention described above, behave in a distributed manner, with photodetection carried out along the length of the fiber. In accordance with the invention there are provided configurations of multiple fiber photodetectors that individually operate in this distributed manner but together enable detection of an illumination point. Such fiber photodetector arrangements can be implemented as an array of fibers forming a grid, mat, web, woven fabric, or other configuration. Because the fiber photodetectors of the invention are both flexible and mechanically tough, the fibers can be arranged in such configurations in a robust and secure manner.

Figure 15:
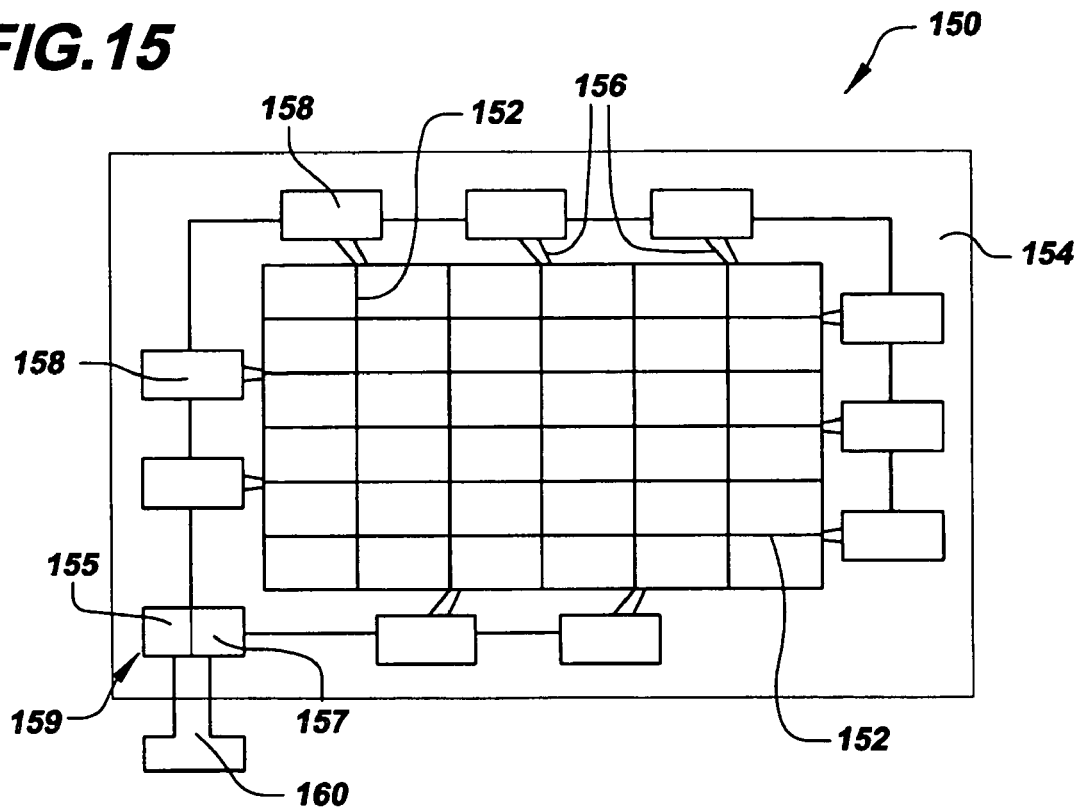
FIG. 15 is a schematic view of a fiber grid employing fiber photodetectors in accordance with the invention.

Referring to FIG. 15, there is shown a first example of such a fiber configuration, here arranged as a two-dimensional fiber photodetector array grid or web 150. The fiber grid includes a number of individual fiber photodetectors 152 arranged in rows and columns; in the example of FIG. 15 five fibers are arranged vertically and five fibers are arranged horizontally to form a 5×5 illumination point detection grid. When light is incident on any of the fibers in the grid, whether broadband or narrowband, a corresponding photocurrent is generated. As explained in detail below, a comparison of the photodetection response of each of the fibers in the grid enables a determination of the grid coordinate of incident illumination.

The integrated sensing and signal delivery functions of the fiber photodetectors enable a number, 2N, of fiber photodetector elements to produce a grid illumination point detection resolution of $N^2$. In contrast, to achieve a desired resolution of N×N pixels per unit area would require $N^2$ point detection elements in a conventional two-dimensional optical detector array. The example 5×5 fiber grid of FIG. 15 provides a 25 pixel/area resolution with only 10 fibers; that is, the grid of 10 linear, one-dimensional fibers can localize an illumination point on a surface with resolution of N×N pixels per unit area with only order N, pixels, with N here being 5. As a result, and given the mechanical strength of the fibers, large-area optoelectronic functional surfaces of fiber photodetector grids can be constructed to provide high resolution as well as large field of view. In one example construction of such a grid and frame, 16 fibers can be assembled into an 8×8 grid that is 30 cm×30 cm in area.

In a particularly elegant and efficient implementation of the illumination point detection grid, a frame 154 is provided for securing the edges of each fiber photodetector 152 to form a grid of fibers. The frame can be provided as, e.g., a printed circuit board with accommodation for electrical connection to and fastening of each fiber. The electrodes disposed along the core of each fiber can be electrically contacted using, e.g., conductive paint, to make contact with connecting wires 156 for connection with a corresponding external photodetection circuit 158 provided on the frame 154. As shown in the figure, the circuits 158 can be arranged on the circuit board in any convenient design that provides a photodetection circuit for each fiber.

In one circuit implementation, the electrodes of each fiber are connected to a high input-impedance operational amplifier, as described above, in a current-amplifier configuration. The amplified signals from each of the photodetection circuits 158 are multiplexed using, e.g., a high-speed CMOS multiplexer 155, such as the CD74HCT4067 multiplexer from Texas Instruments, Dallas, Tex., and then digitized by an 8-bit multichannel analog-to-digital converter 157 on a microchip microcontroller 159, and then converted to a universal serial bus (USB) format. All of these electronic components can be located on the printed circuit board frame 154. A USB cable 160 can then be provided to connect the fiber web to a computer for supplying power and control to the web of fibers and collection of the photodetection circuit current measurements for analysis. Thus, no power supply for biasing each fiber photodetector's electrodes is required, as power to operate the circuitry can be derived from the USB ports of the computer. This distributed circuit implementation can for many applications be preferred because it minimizes the external componentry required to operate the grid. It is recognized, however, that a remote lumped-circuit or other circuit configuration can alternatively be employed, with power delivery to the fiber photodetectors provided in a suitable manner.

Figure 16:
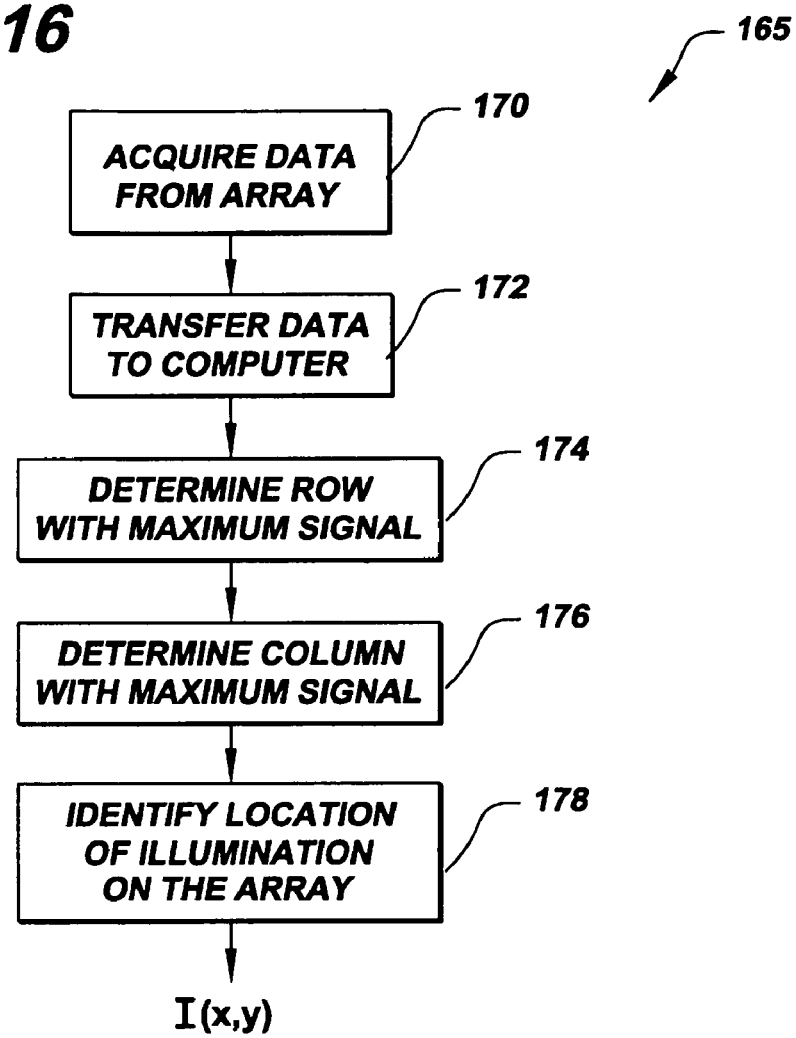
FIG. 16 is a flow chart of steps in a method for identifying the location of illumination incident on the fiber grid of FIG. 15.

In operation of the grid, referring to the flow chart of FIG. 16, a method of illumination point detection is carried out with a first step in which photodetection data from the grid of fiber photodetectors is acquired 170 by providing a selected bias voltage to the electrode pairs of each fiber and measuring the resulting current in each photodetection circuit in the manner just described. The acquired photodetection data is then transferred 172 to a computer in a next step, e.g., for processing by a data acquisition card in a PC. A software program provided in the PC, e.g., Visual Basic®, from Microsoft, Redmond, Wash., LabVIEW, from National Instruments, Austin, Tex., or MATLAB®, from The MathWorks, Natick, Mass., can then be employed for analysis of the acquired data to determine the illumination point on the detection grid. To make this determination, the measured current signal of each horizontal fiber photodetector, i.e., each fiber row, is compared and the fiber photodetector row having the maximum photogenerated current is determined 174. Similarly, the measured current signal of each vertical fiber photodetector, i.e., each fiber column, is compared and the fiber photodetector column having the maximum photogenerated current is determined 176. This knowledge of the fiber photodetector row and column having photogenerated current maxima directly indicates the corresponding horizontal and vertical grid coordinates, I(x, y), of localized illumination incident on the grid.

The photogenerated current can be continuously monitored for continuous illumination detection. The speed at which sequential, distinct illumination points can be ascertained is limited by the relaxation time of the fibers and the speed of the data acquisition electronics. Specifically, the speed at which collected charge can be fully conducted from a point of illumination to the fiber ends by the fiber electrode pairs, and the speed of photogenerated current measurement and processing, sets the speed of the photodetection grid.

In this example grid implementation, the current in each fiber photodetection circuit is measured for determining the localized illumination coordinates. But the invention is not limited to the measurement of current for this purpose. Voltage, capacitance, or other characteristic can alternatively be measured to determine grid illumination coordinates.

A particular advantage of the fiber grid of the invention is the substantial transparency of the grid. In other words, due to the micron-scale thicknesses of the fiber photodetectors in the grid, the grid does not substantially block or even perturb incident illumination. As a result, the grid can be employed to detect illumination while substantially maintaining the original illumination properties. The grid can be positioned in arrangements in which a scene behind the grid is to be viewable and/or illuminated during illumination detection. For example, the grid can be provided in a transparent medium, such as glass, polymer, or plastic, or between panes of such materials, for enabling illumination detection while preserving illumination through the grid and viewing through the grid. This characteristic holds of course for individual fiber photodetectors as well as arrays of such fibers. Whether provided as a single fiber or an array of fibers, the photodetectors of the invention therefore provide the distinct advantage of virtually invisible illumination detection.

In one example of an application for such, the two-dimensional detector grid is positioned in proximity to a computer screen for enabling touchless computer screen sensing. Here the computer is provided with a graphical user interface that is connected to the detector grid to ascertain what graphical, textual, or other object displayed on the screen is being pointed to by a beam of light. The beam of light, provided, e.g., as a pen light, flashlight, or laser pointer, is directed by the computer user to a selected object on the screen. When directed at a selected object on the screen, the spatial coordinates of the light beam are detected by the photodetection grid and communicated with the graphical user interface to indicate the selected object. The selected object is then highlighted or otherwise identified on the screen by the computer. This technique overcomes many of the disadvantages of conventional touch-screen sensing by providing a touchless, illumination-based computer user interface mechanism.

The invention further provides applications of the fiber photodetector grid that are particularly well-addressed by the flexibility and strength of the fiber photodetectors. Very large scale photodetection can be carried out with the photodetection grids; large objects such as automobiles, airplanes, or other machinery can be covered with fiber photodetector grids that are shaped to conform to the surface of the machinery. It is recognized that for such applications hollow core fiber photodetectors can be preferred; the hollow core is more flexible and lighter in weight than a solid fiber core and therefore is more amenable to shaping in a desired configuration. In addition, a hollow core fiber is in general characterized by a dark current that is lower than that of a solid core fiber and a resistance that is higher than that of a solid core fiber; as a result, hollow core fibers can be preferred for low-light applications such as those often encountered in transportation applications. Whatever fiber configuration is employed, such large area grids enable a high degree of detection resolution with substantial transparency.

Figure 17:
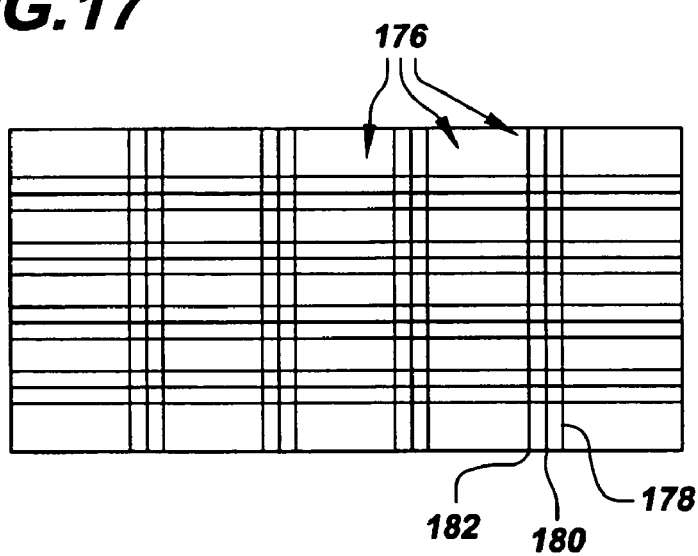
FIG. 17 is a schematic view of a fiber grid employing a plurality of fibers at each grid row and column in accordance with the invention.

The discussion of the fiber photodetector array above is applicable to both broadband fiber photodetectors as well as narrow band, spectroscopic fiber photodetectors of the invention. Each fiber in the fiber array grid or web can be provided as a broadband or narrow band photodetector. In one example implementation, shown in FIG. 17, each row and column 176 of the grid is provided as three spectroscopic fiber photodetectors 178, 180, 182, each sensitive to a distinct illumination wavelength. With three wavelength-specific spectroscopic fiber photodetectors, full color imaging can be provided in conjunction with illumination detection. If the narrow band of wavelength absorption of the three fibers slightly overlaps, then continuous wavelength detection can be enabled. Both illumination location and wavelength can therefore be ascertained with this fiber photodetector grid of the invention.

Figure 18:
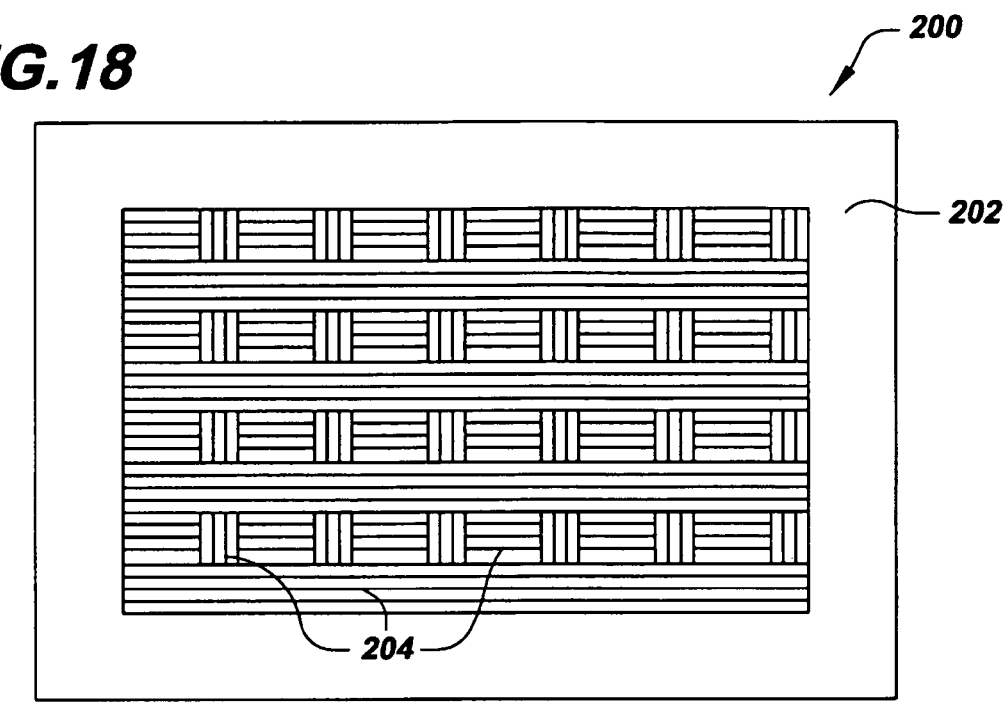
FIG. 18 is a schematic view of a fiber fabric employing woven fiber photodetectors in accordance with the invention.

The spectroscopic aspect of this grid configuration can be exploited further in accordance with the invention to produce a spectrometer from multiple spectroscopic fiber photodetectors. Referring to FIG. 18 there is schematically shown one example of an optoelectronic, spectrometric fabric 200 that is woven of multiple fiber photodetectors each characterized by a selected detection wavelength. For clarity the fabric is shown in the manner of the point detection grid of FIGS. 15 and 17, with a frame 202 provided to supply electrical connection to woven fibers of the fabric. The woven fibers 204 are interleaved in a suitable configuration of a fabric, mat, or other interleaved structure. The frame 202 can be provided in the manner of the grid frame 154 shown in FIG. 15, including individual photodetection circuits, or the electronics can be provided remotely or in another suitable configuration, with power correspondingly applied to the fabric fibers.

As explained previously, hollow core fiber photodetectors of the invention are generally characterized by a degree of mechanical flexibility greater than that of solid core fiber photodetectors. In construction of an interleaved spectrometric fabric it is particularly advantageous to make consideration for the flexibility of the fibers employed, with solid core fibers being woven less tightly than hollow core fibers. As shown in FIG. 18, the weave pattern and spacing of the fibers in the pattern can be controlled to accommodate the flexibility of the fibers.

The fibers woven into the spectrometric fabric are produced in the manner described above, with the resonant cavities of the fibers having requisite geometries for producing selected detection wavelengths. The fabric can be woven in a pattern having a selected periodicity of fibers characterized by a unique detection wavelength. It can be preferred to design the fibers' resonant cavities, following the geometric prescriptions described above, such that there is an overlap in wavelength of detection between adjacent fibers.

With these various arrangements, a fully functional spectrometer can be produced out of flexible, mechanically robust fibers in a fabric form that can conform to a selected surface, in the manner described above with respect to an illumination point detection grid. Indeed, the spectrometric fabric can be paired with the point detection grid of FIG. 15 in a further example of a dual illumination location and wavelength detection device. Given that the point detection grid is substantially transparent, the point detection grid can be located in front of the spectrometric fabric. The detection grid can here be implemented with broad band fiber detectors or with selected wavelength-specific fiber photodetectors. This arrangement provides a maximum in flexibility for detecting a range of wavelengths as well as illumination location.

It is to be recognized that the fiber fabric just described can also be implemented with broadband, rather than narrow-band, fiber photodetectors. The invention is not limited to narrow-band fiber fabric and instead can employ broadband or a combination of broadband and narrow-band fiber photodetectors.

Figure 19A:
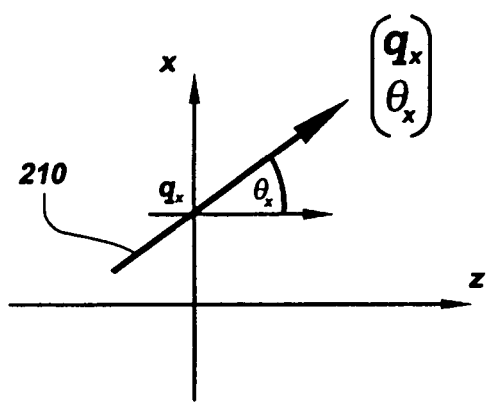
FIGS. 19A-19B are schematic representations of the geometry of ray directional determination into and out of an optical system.

The virtual transparency of the two-dimensional fiber photodetector grids of the invention enable the configuration and operation of three-dimensional (3D) fiber photodetecting arrays provided by the invention that can perform tasks beyond those capable of a single two-dimensional fiber photodetector array of the invention. The operation and capabilities of the three-dimensional fiber photodetector array of the invention can be understood by first noting that in the geometrical optics approximation, where all the dimensions of a system of interest are much larger than the wavelength of illumination incident on the system, light rays of the incident illumination are parameterized in each plane orthogonal to the direction of propagation by their intercept and angle with that plane. For example, as shown in FIG. 19A, in the one-dimensional case, a light ray 210 can be characterized by the intercept, $q_x$, and the angle, $\theta_x$, which the ray makes with the propagation axis arranged in a vector. It is understood that all angles involved are small so that the paraxial approximation here applies.

Figure 19B:
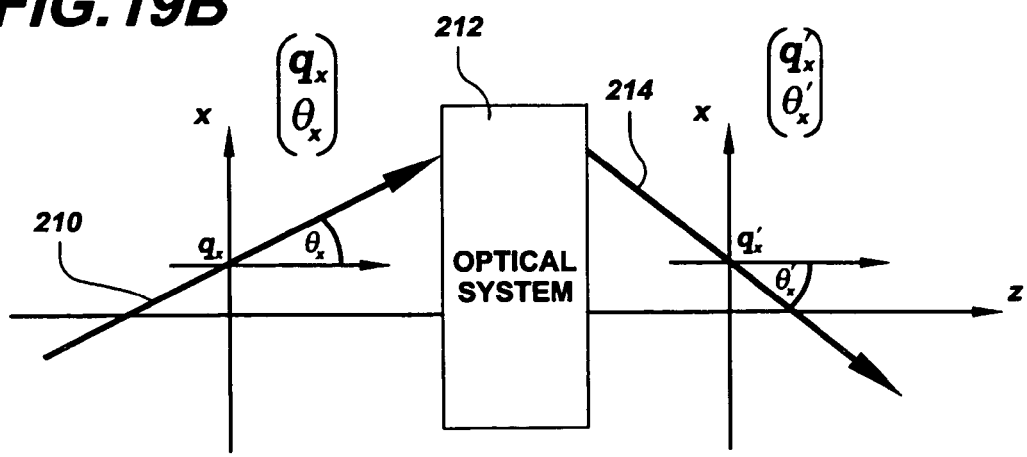

With this vector parameterization of light rays, the effect of propagation of the rays through any optical system can be correspondingly defined by a linear vector operator. Specifically, the characteristics of the light ray acquired by passage through the optical system can be determined by implementing the linear operator in the space of the ray vectors, represented by a suitable matrix. This operation is schematically represented in FIG. 19B. There is shown a light ray 210 incident on an optical system 212. The incident ray is characterized by the vector representation of the ray intercept, $q_x$, made with a selected plane and the angle, $\theta_x$, made with the ray's propagation axis. After passage through the optical system, the retreating ray 214 is characterized by a new ray intercept, $q'_x$, made with a selected plane and a new angle, $\theta'_x$, made with the retreating ray's propagation axis. The characteristics of the optical system determine the adjustments in the incident ray that result in the retreating ray's parameters.

In accordance with the invention, the optical system 212 is mathematically defined such that the system can be computationally implemented for determining the incident and retreating ray characteristics. In the geometrical optics formulation, any beam can be completely characterized by its location and angle, suitably defined. As a result, the parameters of the incident ray 210 or the retreating ray 214 output from any optical system can be determined, given knowledge about this system and one of the rays. In effect, after determining the beam parameters, the effect of propagation through any given optical system can be simulated computationally. With this formulation, the invention enables a three-dimensional vectorial photodetecting array configuration for determining the direction of propagation of a ray using two fiber photodetector grids An example of such a system 220 in accordance with the invention, termed a vectorial optical detector, is shown schematically in FIG. 20A. Two fiber photodetector grids 150 like that described above and shown in FIG. 15 are positioned with a distance of separation between the grids, d. The ray 210 incident on the grids is characterized in the two dimensions of the grids by two angles, $\theta_x$, $\theta_y$, made with the propagation axis of the ray. Each grid is configured in the manner described above to detect the grid coordinates of the ray illumination and therefore to determine the location of the ray in the two planes of the grids. Because the grids are substantially transparent, as explained above, the first grid does not perturb the path of the ray toward the second grid.

Figure 20A:
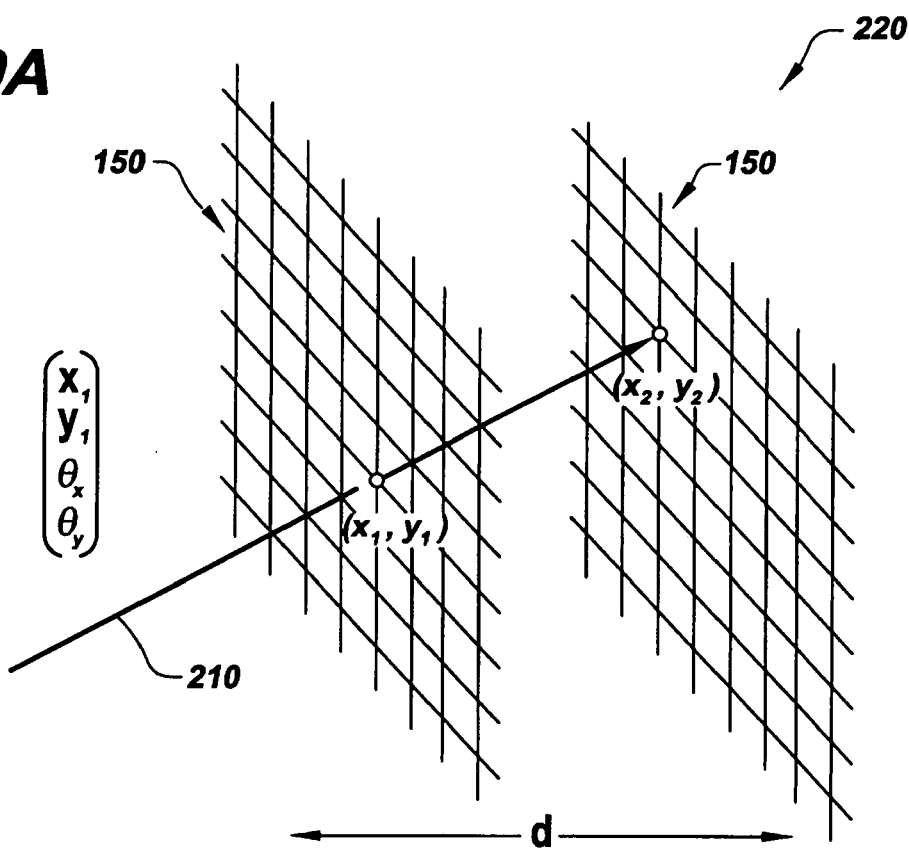
FIG. 20A is a schematic view of a two fiber grid, vectorial fiber photodetector provided by the invention.
Figure 20B:
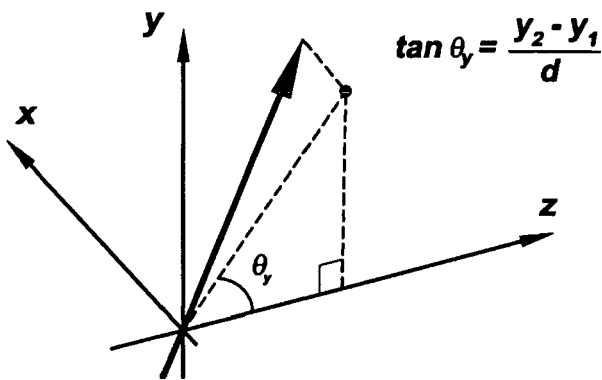
FIGS. 20B-20C are schematic representations of the geometry for determining ray directionality in the fiber photodetector of FIG. 20A.
Figure 20C:
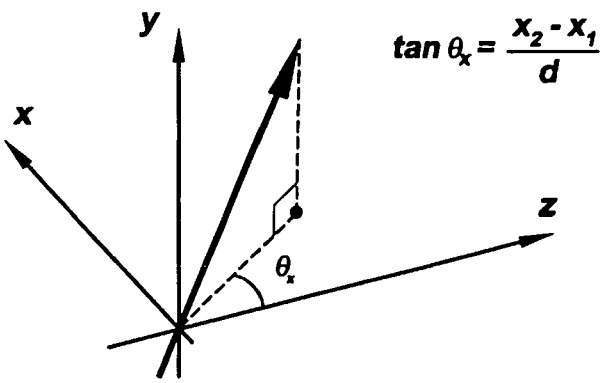

At the first grid, ray intercept coordinates $(x_1, y_1)$ are determined, and at the second grid, ray intercept coordinates $(x_2, y_2)$ are determined. With these two grid intercept coordinates and knowledge of the separation, d, between the grids, the direction of the ray in space can be determined. Referring to FIGS. 20B and 20C, the direction of the ray is determined by calculating the angles the ray makes with the x and y axes in the path the ray takes from the first fiber photodetector grid to the second fiber photodetector grid. From the geometric considerations illustrated in FIGS. 20B-20C, it is shown that $\tan \theta_x = (x_2 - x_1)/d$; and that $\tan \theta_y = (y_2 - y_1)/d$.

Figure 21:
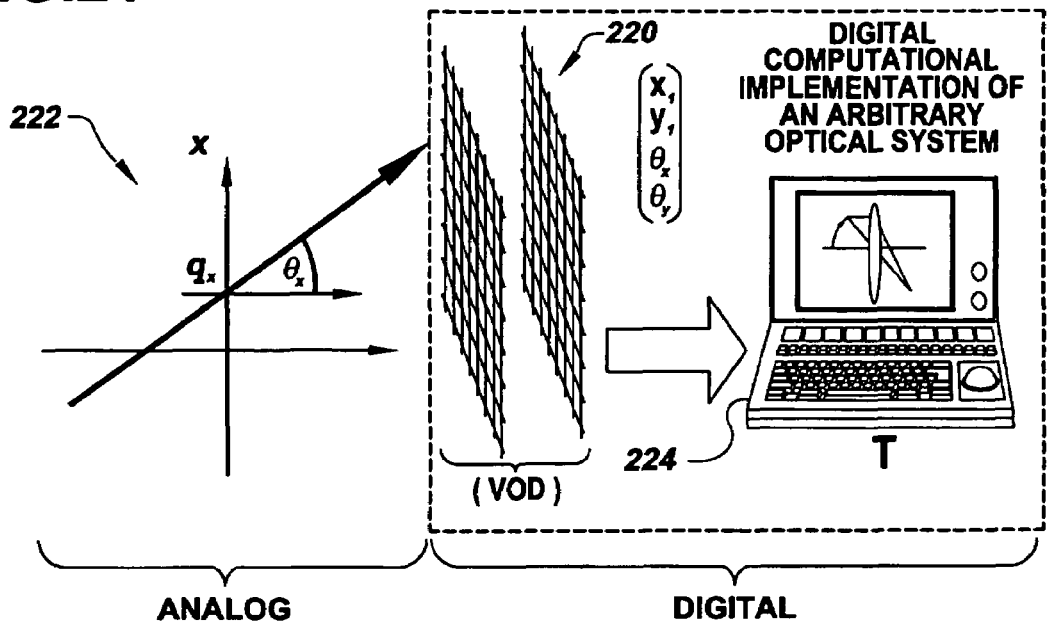
FIG. 21 is a schematic representation of the shift in paradigm from conventional analog optics to digital computational optics enabled by the invention.

Turning back to FIG. 20A, once the grid coordinates, $x_1$, $y_1$, are known for the first fiber photodetector grid and the ray angles $\theta_x$, $\theta_y$, given just above are determined, then an optical system can be computationally implemented as shown in FIG. 19B to ascertain the effects of the optical system on the ray. This approach and the computational optics paradigm it enables are shown schematically in FIG. 21. A conventional, analog optical system 222 is replaced by a digital vectorial optical detector 220 that bridges the analog world of optical systems to the digital world where any optical system can be implemented computationally, by its transformation, T, with a computer 224 or other computational apparatus or program.

Figure 22A:
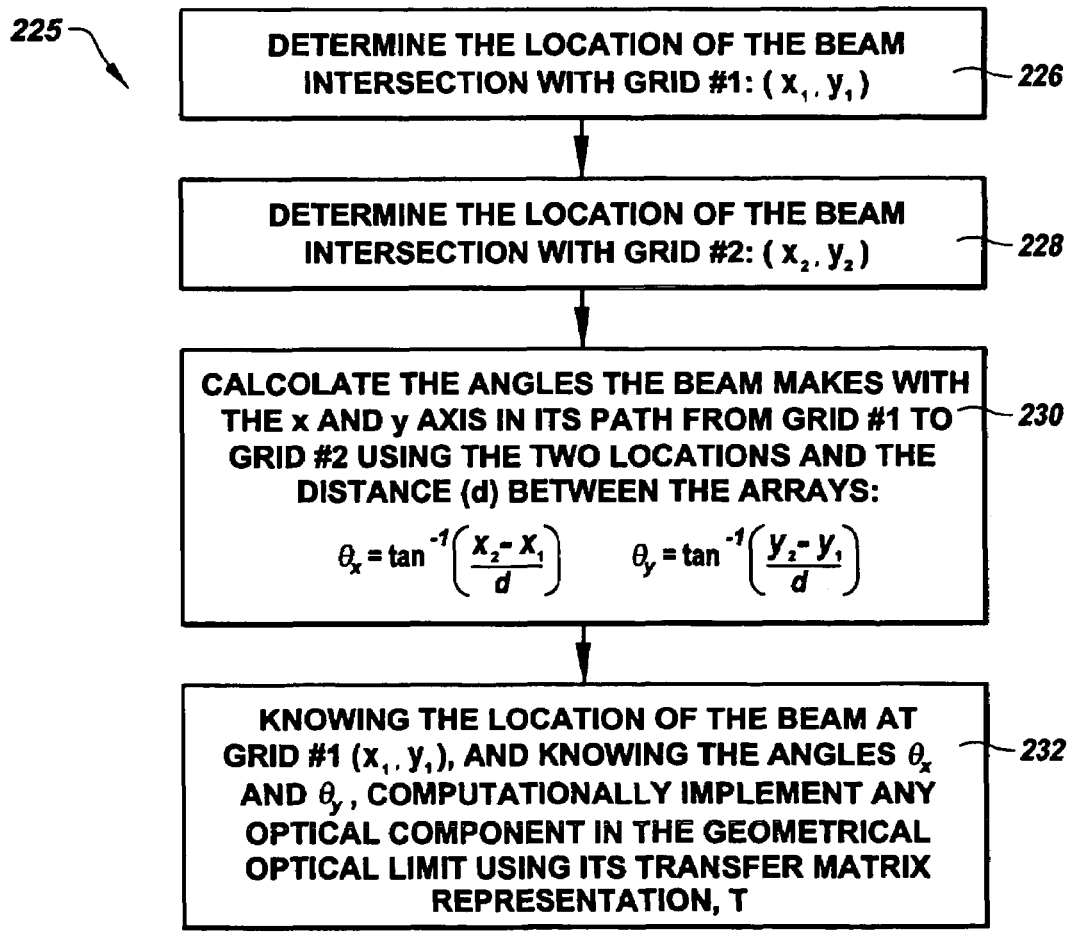
FIG. 22A is a flow chart of the steps in a method for implementing a computational optics algorithm in accordance with the invention.

FIG. 22A presents a flow chart of a method of the invention for employing computational optics with the vectorial optical detector of the invention. In the first steps of the method, a ray incident on the arrangement of two fiber photodetector grids as shown in FIG. 20A is detected by each grid; resulting in a determination 226 of the location of the beam intersection with the first fiber array, $(x_1, y_1)$, and a determination 228 of the location of the beam intersection with the second fiber array, $(x_2, y_2)$. Then in a next step the angles, $\theta_x$, $\theta_y$, that the beam makes with the x and y axes in its path between the two fiber arrays are determined as given above. With all of this information thusly determined, there can be computationally implemented 232 any optical component, in the geometrical optical limit, using the transfer matrix representation, T, for the optical component.

The computational optics of the invention, and specifically the method of FIG. 22A can be implemented on a wide range of fiber grid geometries including two-dimensional and three-dimensional geometries; the planar two-grid geometry of FIG. 20A is not the sole vectorial detector arrangement of the invention. Directional detection of incident illumination can also be carried out with a closed-surface fiber grid detector instead of two planar arrays separated with some distance. A detector having a closed, transparent, and light-sensitive surface has the added advantage of directional detection capabilities over the full $4\pi$ steradians, and thus a numerical aperture value of 1, in free space. This is facilitated by the fact that any light beam incident on the surface of the closed surface fiber grid must also leave the grid. The only exception is for a beam that is tangential to the surface, in which case only an entrance point is detected. In such a case the beam is known to lie in the plane tangential to the surface at the entrance point, but the exact direction of the beam inside this plane is ambiguous. In all other cases, the beam direction is determined with no such ambiguity.

Figure 22B:
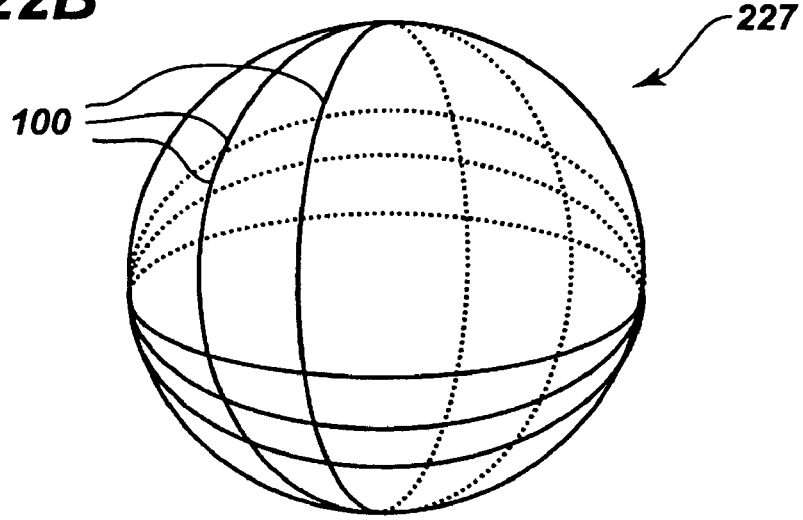
FIGS. 22B-D are schematic representations of closed-surface spherical fiber grids of the invention for which the method of the flow chart of FIG. 22A can be implemented.
Figure 22C:
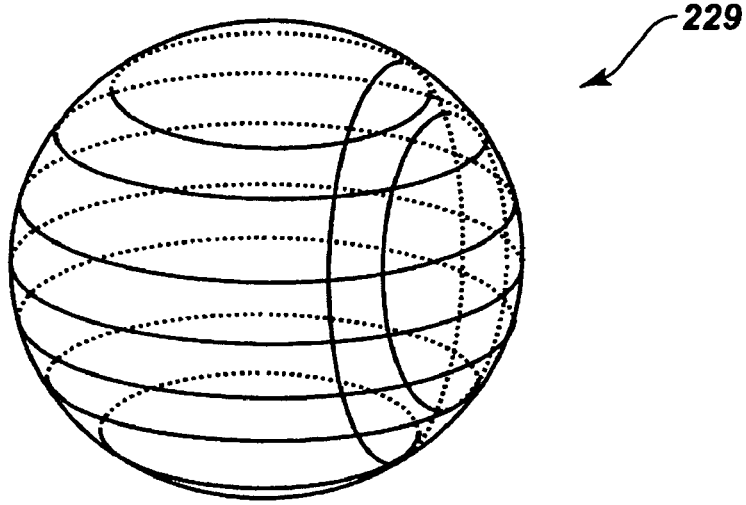
Figure 22D:
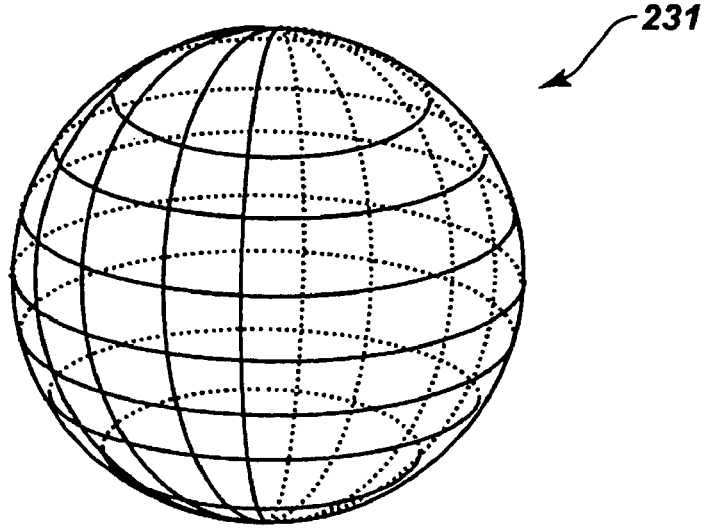

The invention contemplates a wide range of three-dimensional, closed-surface fiber grids, e.g., rectangular, spherical, and other geometries. Three examples of a closed-surface fiber grid provided by the invention, namely spherical fiber grids, are shown in FIGS. 22B-D. Referring to FIG. 22B, fiber photodetectors 100 can be arranged as a spherical grid 227 with the fibers lying on circles having a fixed diameter, such that the fibers meet at two polar points. Alternatively, as shown in FIGS. 22C-D, the fiber photodetectors 100 can be arranged as a spherical grid 229, 231 with the fibers lying on circles of varying diameters. Each full circle includes two fiber photodetectors, each in the form of a half circle. The half circles on the front of the sphere correspond to a single detection plane in the two-plane embodiment, while the half circles on the back of the sphere correspond to the second plane. All the fiber photodetectors are connected to voltage biasing and sensing circuitry like that described above.

Two illumination points are thus determined by the closed-surface grid, namely, on the front half of the sphere and the back half of the sphere. With the two detected illumination points, the directionality of the incident illumination can be determined in the method of the flow chart of FIG. 22. One ambiguity that remains in this detection is the direction of the incident ray: from the back half of the grid to the front half of the grid or from the front half of the grid to the back half of the grid. This degeneracy can be lifted by employing fiber photodetectors having selected electrode and voltage biasing arrangements that enable angular resolving capabilities as described above. With directional fiber photodetectors used on the closed-surface grid, the direction of the incident illumination is determined.

Figure 23:
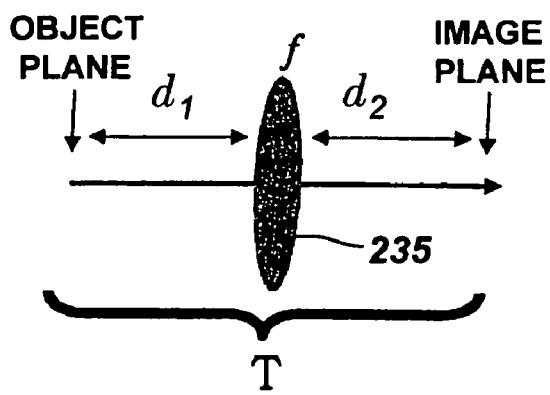
FIG. 23 is a schematic representation of the geometric parameters in an optical imaging with a lens.

One example of computational optics enabled by the invention is lensless imaging. To explain the operation of lensless imaging, it is first noted that within the limits of geometrical optics, an imaging system, consisting of a lens and suitably arranged locations of object and image planes, is represented with a specific linear transformation T that is a cascade of all the subsystems involved. Specifically, the matrix representations of a lens, of focal length f, and free space propagation, through a distance, d, are given by $$\begin{pmatrix} 1 & 0 \\ -\frac{1}{f} & 1 \end{pmatrix}, \begin{pmatrix} 1 & d \\ 0 & 1 \end{pmatrix},$$

respectively. As shown in FIG. 23, an optical system formed of free space propagation from an object plane through a first distance, $d_1$, followed by a lens 235, and then free space propagation through a second distance, $d_2$, to an image plane, can be represented by the matrix $$T = \begin{pmatrix} -M & 0 \\ -\frac{1}{f} & -\frac{1}{M} \end{pmatrix}$$

provided the condition $$\frac{1}{d_1} + \frac{1}{d_2} = \frac{1}{f}$$

is met, where $$M = \frac{d_2}{d_1}$$

is the magnification.

The operator T operates on any optical input distribution from the object plane, producing an image of this distribution at the image plane with magnification M. The feature of T that allows for this is the fact that the upper right element in the matrix T is zero. Consequently, all rays emitted from a point $q_x$ at the object plane, regardless of angle, are mapped to the location $-M \cdot q_x$ at the image plane, resulting in the expected image.

Figure 24:
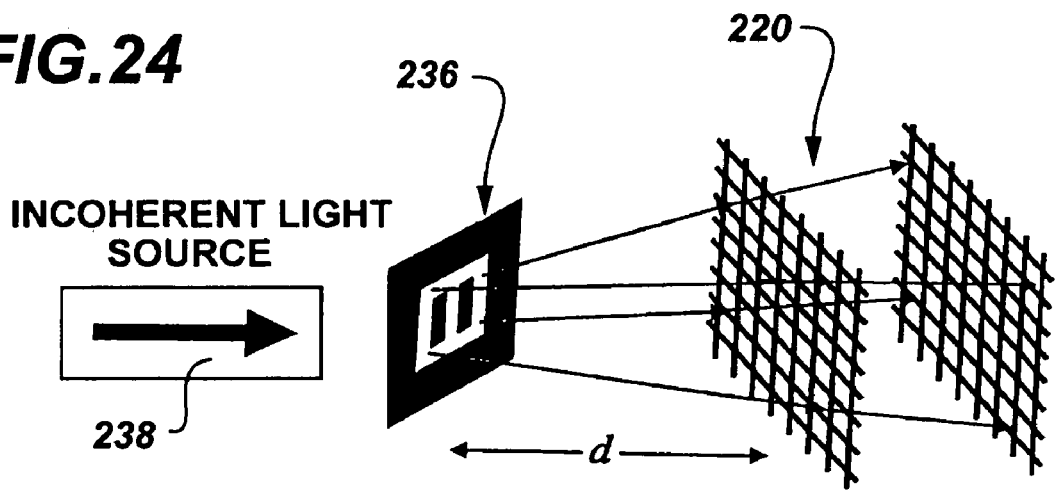
FIG. 24 is a schematic view of an object being lenslessly imaged by the vectorial fiber photodetector of the invention.

Referring to FIG. 24, based on this mapping characteristic, the vectorial optical detector of the invention can be employed for achieving lensless imaging as follows. In a first step, the vectorial light detecting fiber arrays 220 are employed to detect the locations and angles of all incident optical rays that originate from an object plane 236 that is separated from the first array by a distance, d, and is illuminated with an incoherent light source 238. As a result of diffraction, the intensity distribution at the fiber photodetector grids is different from that at the object plane.

Figure 25A:
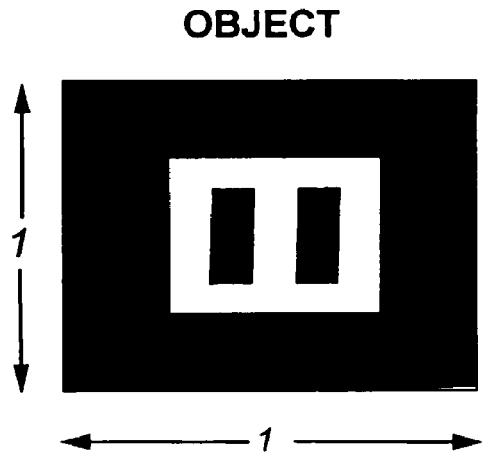
FIGS. 25A-25B are representations of an object and the intensity distribution of the object illumination at a selected vectorial fiber photodetector position, respectively.
Figure 25B:

For example, referring to FIGS. 25A-25B, diffraction causes the illumination intensity distribution of FIG. 25A to be changed at forward locations; at a distance, d=8 units, in FIG. 25B, the intensity distribution is significantly altered. The object illumination distribution of FIG. 25A has unity dimensions in each direction, and the distance, d, is equal to 8 times this unit. Note that the location of the fiber photodetector arrays with respect to the object is not restricted by a lens-imaging-like equation. Rays emitted by the object within a cone of half angle 1° are considered in the monitored intensity distribution.

Figure 26:
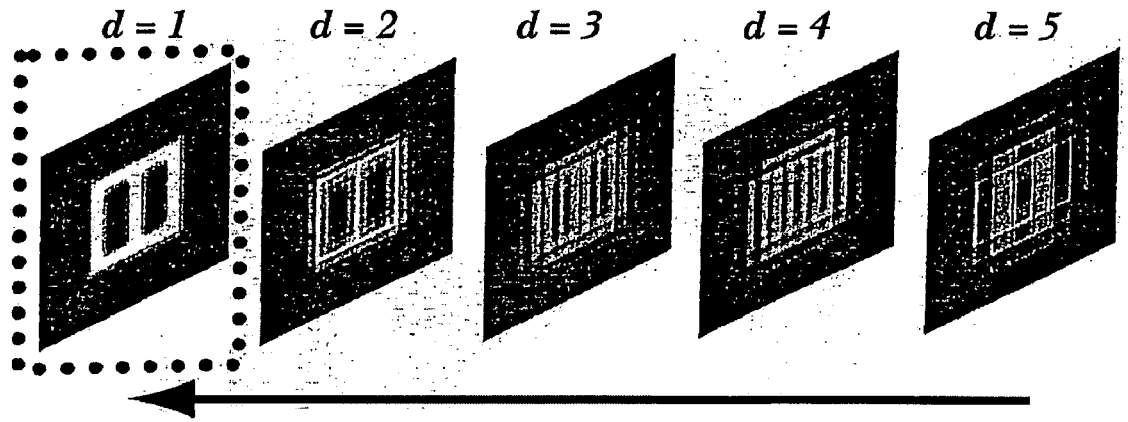
FIG. 26 is a representation of the object image of FIG. 25A as computed for selected locations between the object location and the vectorial fiber photodetector location.

Given a geometric optics approximation, then once the locations and angles of all optical rays incident on the two-grid vectorial fiber photodetector are known. The detected rays can be computationally back traced until an image is formed. In other words, data produced by the fiber photodetector grids are employed to compute the properties of the object illumination from which the detected rays were incident. This back tracing process is shown schematically in FIG. 26. In this example, the incident rays detected at distance 8 units from the object are back-traced by one unit of distance at a time until a clear image is computationally acquired, indicating the true distance separating the object from the detection plane. A 'lensless image' is thereby formed based solely on the data from the fiber photodetection arrays and without the use of a lens or other analog optical device.

Turning now to the tasks required for the lensless imaging of the invention, first is considered that of determining the intensity distribution of incident illumination on each of the vectorial fiber photodetector grids. There are two-classes of optical fields that necessitate different approaches to the processing of the data collected from the photodetecting grids for determining incident intensity distribution. The first class is that of separable optical field distributions. An important example of such a field is that of a point moving over a field of view. This is the case of a localized light beam, such as a laser, directed at a fiber photodetector grid, as described above. The fiber photodetector grid enables tracking of a moving light beam across the area of the grid. The processing of the gathered incident illumination data as the light beam moves, as described above, enables straightforward determination of the beam coordinates on the grid. The second class of optical fields addressed by the fiber photodetector grids and the vectorial photodetector of the invention is that of an arbitrary, time-varying incident illumination distribution. In this case, a more sophisticated signal-processing approach is needed to ascertain the incident illumination distribution, as detailed below.

It is instructive to consider the first case, that of a separable optical field distribution. Assume that the intensity distribution in the plane of one of the fiber photodetecting grids is I(x, y). Let $x_i$ and $y_j$ be the coordinates of the rows and columns of the grid, i.e., the physical locations of the individual fiber photodetectors of the grid, respectively. The intensity of the optical field at the intersections of the fibers is $I_{ij}=I(x_i, y_j)$. Because the measured photocurrents are proportional to line integrals of I(x, y), then, ignoring unimportant constants the photocurrent measurements from the rows (R) and columns (C) are $$R_i = \sum_j I_{ij} \text{ and } C_j = \sum_i I_{ij}.$$

The photodetector grid 150 shown in FIG. 15 exemplifies this row and column configuration of individual fiber photodetectors.

In the case that the incident optical field is separable in the separable form I(x, y)=r(x)c(y), then $R_i=Cr(x_i)$ and $C_j=Rc(y_j)$, where $$C = \sum_j c(y_j) \text{ and } R = \sum_i r(x_i).$$

The optical field distribution and corresponding intensity distribution in this case can be recovered with no ambiguity from these photocurrent measurements, $I_{ij}=R_iC_j$, provided that the number of fiber photodetectors included in the grid is sufficient to fully capture the illumination distribution. An example of such a situation is tracking and surveillance of an object whose exact shape is of no interest. The location of the object can thus be determined and tracked as it moves in real time.

Now considering the capture and determination of a two-dimensional image intensity distribution, an important observation is needed. The photocurrent measurements for each fiber photodetector row and column of a detection grid are one-dimensional. The optical power intercepted by a given fiber photodetector is a line integral of the optical intensity distribution along that fiber. Consequently, the resulting one-dimensional photocurrent data, collected from the rows, $R_i$, of the grid, for example, is isomorphic to a single projection, known as a parallel projection, of the incident intensity distribution for the grid rows. The term 'parallel projection' is here meant to refer to a process analogous to that, conventional in the literature, in which measurements performed by a linear array of point detectors are placed on one side of a two-dimensional object of interest, with a linear array of points sources, e.g., X-rays, placed on the opposite side of the object. Each point detector measures the line integral of the X-ray attenuation of the object along the line connecting it to the opposing point source. In the photodetection techniques of the invention, each fiber photodetector records the line integral of the intensity distribution of an incident optical field along the fiber length.

Figure 27:
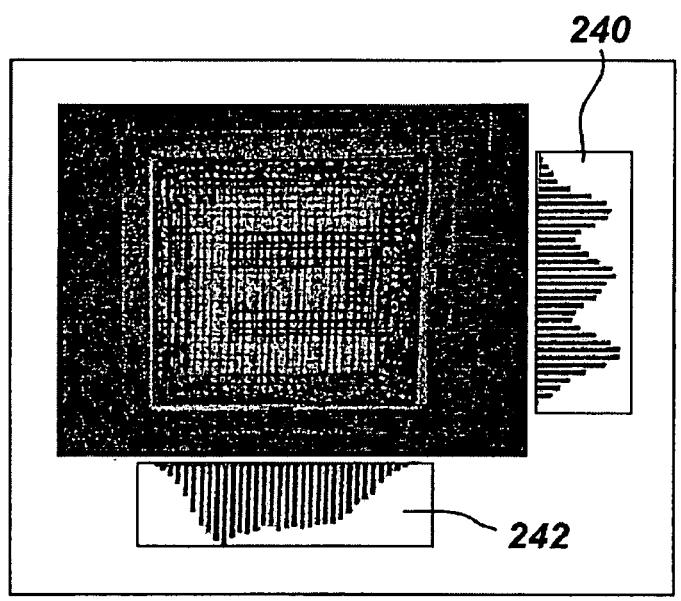
FIG. 27 is a view of an image projected on a fiber grid of the invention, showing the parallel projections of acquired photogenerated charge from the rows and columns of the grid.

FIG. 27 illustrates this condition. There is shown an image of a letter 'E' projected onto a 32×32 fiber photodetector grid of the invention, of dimensions 24×24 cm². The parallel projection of the photocurrent row measurements, $R_i$, 240 and the parallel projection of the photocurrent column measurements, $C_i$, 242 are shown corresponding to the intensity distribution for the letter 'E'. The image was produced by a white-light Xe—Hg lamp illuminating the grid, with dimensions 14×14 mm² placed at a distance of 1.2 m from the grid. The row parallel projection and the column parallel projection form two orthogonal projections of the intensity distribution of the 'E' intercepted by the grid.

In accordance with the invention, an arbitrary two-dimensional intensity distribution is determined without ambiguity, based on one-dimensional parallel projections of the distribution, like that of FIG. 27, by considering additional parallel projections, at angles distinct from the orthogonal projections of FIG. 27, until the projections unambiguously reconstruct the intensity distribution of interest. In other words, additional distinct parallel projections are considered with the two orthogonal projections of FIG. 27 until the two-dimensional distribution of the optical intensity of interest is determined with no ambiguity.

There are three approaches to achieve this: (1) the fiber photodetecting grid can be rotated in time, (2) the fiber photodetecting grid can be fabricated out of several static grid layers, each one of which is an independently operated fiber photodetecting grid that is rotated with respect to the preceding layer, or (3) the object being imaged can be rotated during the photodetection process. In the first approach, the row and column photocurrent measurement data, $R_i$ and $C_j$, of the grid are collected, and then the grid is rotated by an angle $\theta$, and new row and column photocurrent measurement data $R_i(\theta)$ and $C_j(\theta)$ are collected. The new data represent parallel projections along two additional and distinct directions. By repeating this process for a suitable number of other angles, a number of parallel projections that is sufficient for the reconstruction of the intensity distribution of the optical field is obtained. In the second approach, the photodetecting grid includes several grid layers, each being a photodetecting grid in its own right. Each layer is positioned at an angle $\theta$ with respect to the preceding layer. Each grid layer thus yields two projections of photocurrent measurements, and n grid layers yield 2 n projections along distinct directions. The number of grid layers n is chosen according to the required resolution needed in the reconstructed image, as explained in detail below.

Figure 28:
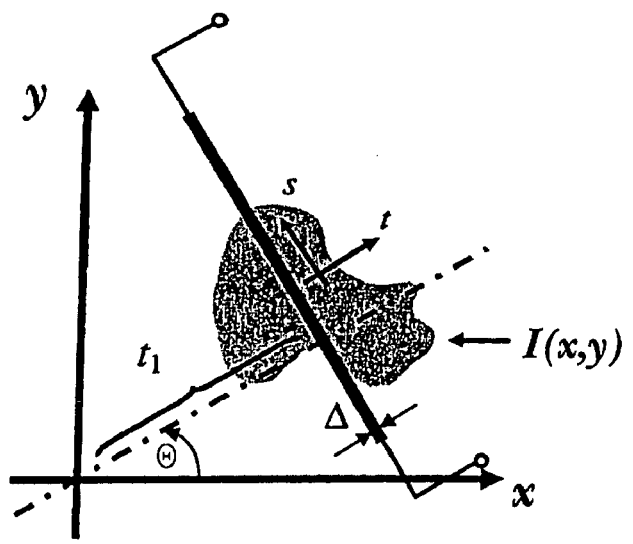
FIG. 28 is a representation of the geometry for determining the parallel projections of FIG. 27.

Consider the photocurrent measurement data collected by the rows of a fiber photodetecting grid when rotated at an angle $\theta$ with respect to the horizontal axis, which is now denoted by $R_\theta(t)$. This data represents a single parallel projection of the intensity distribution I(x, y). Referring to the geometry shown in FIG. 28, $R_\theta(t)$ can be expressed as a line integral, ignoring unimportant constant factors, given as:

$$R_\theta(t) = \int_{(\theta,t)line} I(x, y)\,ds. \tag{1}$$

Equivalently, the expression for $R_\theta(t)$ can be given in terms of a delta function, $\delta$, as $$R_\theta(t) = \int_{-\infty}^{\infty}\int_{-\infty}^{\infty} I(x, y)\delta(x\cos\theta + y\sin\theta - t)dx\,dy, \tag{2}$$

where $t=x \cos \theta+y \sin \theta$ is the equation of the straight line making an angle $\theta$ with the x axis, and thus is orthogonal to the straight lines along which the line integrals are computed. Taking the Fourier transform of $R_\theta(t)$, $$\tilde{R}_\theta(w) = \int_{-\infty}^{\infty} R_\theta(t)e^{-i2\pi wt}dt,$$

and substituting the expression for the parallel projection $R_\theta(t)$, there is obtained the expression:

$$\tilde{R}_\theta(w) = \int_{-\infty}^{\infty}\int_{-\infty}^{\infty} I(x, y)e^{-i2\pi w(x\cos\theta+y\sin\theta)}dx\,dy. \tag{3}$$

The right-hand side of this expression is the two-dimensional transform of I(x, y) computed at the spatial frequencies u=w cos $\theta$ and v=w sin $\theta$, $$\tilde{R}_\theta(w)=\tilde{I}(w\cos\theta, w\sin\theta)=\tilde{I}_p(w, \theta), \tag{4}$$

where $\tilde{I}_p$ is the spatial spectrum expressed in the polar coordinate system. This expression, known as the Fourier slice theorem, can be stated as follows: The Fourier transform of a parallel projection of a two-dimensional distribution I(x, y) taken at an angle gives a slice of the two-dimensional transform $\tilde{I}(u, v)$, subtending an angle $\theta$ with the u axis.

Now can be addressed the problem of reconstructing an original two-dimensional distribution intensity distribution I(x, y) from the parallel projections $R_\theta(t)$. The distribution I(x, y) can be expressed as a two-dimensional Fourier transform as:

$$I(x, y) = \int_{-\infty}^{\infty}\int_{-\infty}^{\infty} du dv \tilde{I}(u, v) e^{i2\pi(ux+vy)} \qquad (5)$$
$$= \int_{0}^{2\pi}\int_{0}^{\infty} d\theta dw w \tilde{I}_p(w, \theta) e^{i2\pi w(x\cos\theta + y\sin\theta)},$$

where u and v are the spatial-frequency axes, and the second equation is obtained by transforming the frequency domain to polar coordinates, $u=w \cos \theta$ and $v=w \sin \theta$. The integral over $\theta$ can be split into two intervals $[0\pi[$ and $]\pi, 2\pi[$, and the range of w may be extended to $]-\infty, \infty[$ by implementing the property that $\tilde{I}(w, \theta+\pi)=\tilde{I}(-w, \theta)$. As a result, the expression for I(x, y) can be given as follows:

$$I(x, y) = \qquad (6)$$
$$\int_{0}^{\pi}\left\{\int_{-\infty}^{\infty} \tilde{I}_p(w, \theta)|w|e^{i2\pi wt}dw\right\}d\theta = \int_{0}^{\pi}\left\{\int_{-\infty}^{\infty} \tilde{R}_\theta(w)|w|e^{i2\pi wt}dw\right\}d\theta.$$

Here $t=x \cos \theta + y \sin \theta$, and the Fourier slice theorem has been implemented in substituting for $\tilde{I}_p$. This result can be further cast in the expression:

$$I(x, y) = \int_{0}^{\pi} Q_\theta(x\cos\theta + y\sin\theta)d\theta, \qquad (7)$$

where $$Q_\theta(t) = \int_{-\infty}^{\infty} \tilde{R}_\theta(w)|w|e^{i2\pi wt}dw$$

is a filtered projection, given that the Fourier transform of the projection $R_\theta(t)$ is subjected to a filter, the frequency response of which is given by $|w|$, before the inverse Fourier transform is computed. All the filtered projections, taken at different angles $\theta$, are then added to yield an estimate of I(x, y). This process is here termed backprojection.

Figure 29B:
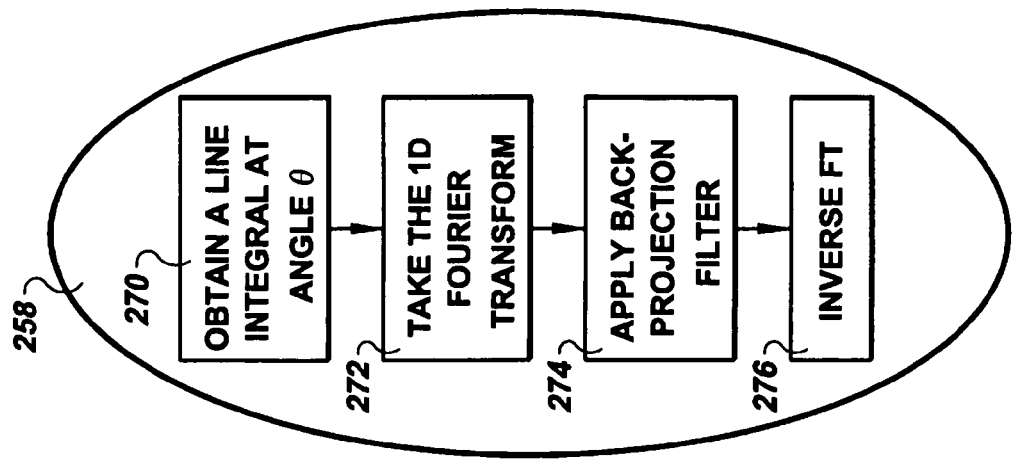
FIGS. 29A-B are flow charts of the steps in a method for determining an arbitrary intensity distribution incident on the fiber grid of the invention and the steps in a method for calculating filtered backprojections to reconstruct the intensity distribution for an object corresponding to the incident intensity distribution, respectively.
Figure 29A:
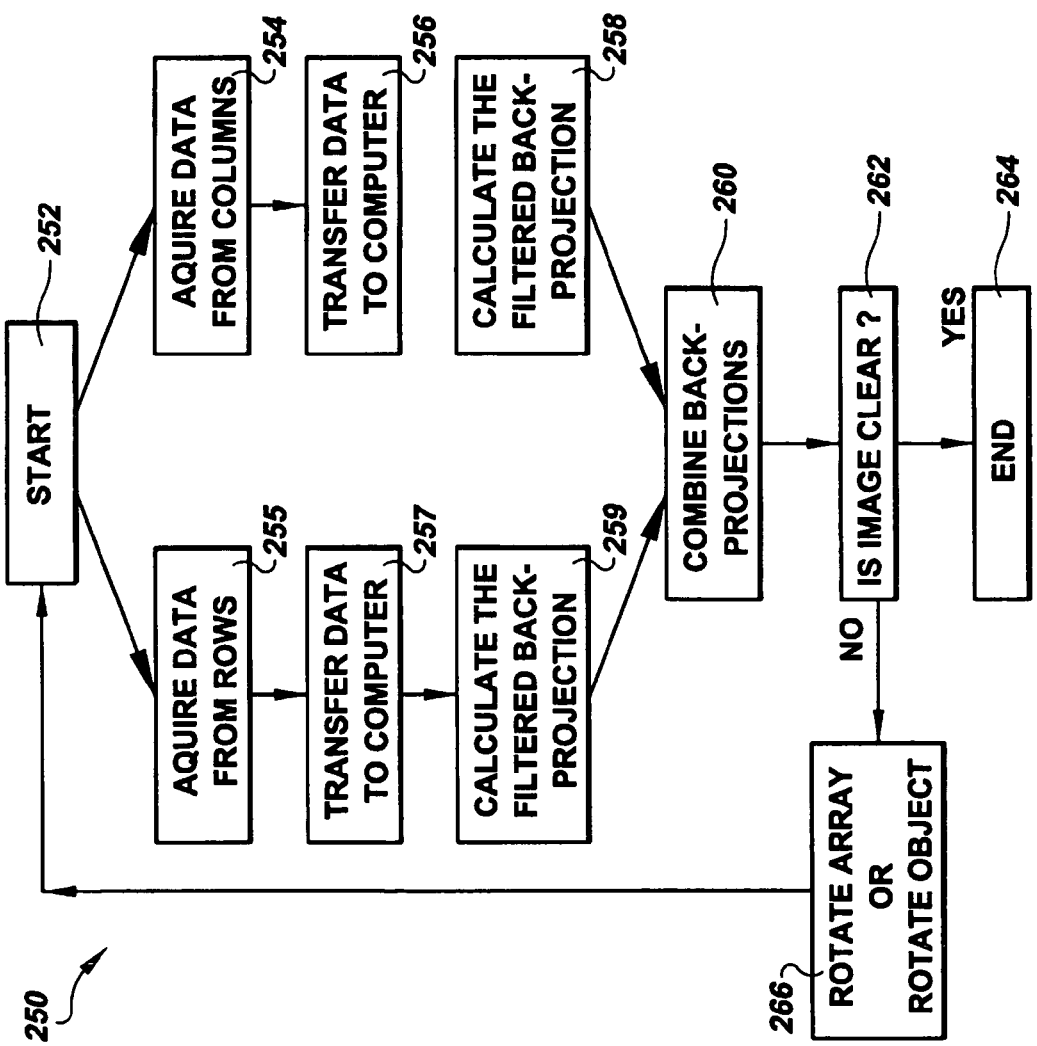

With this description of the backprojection process, the steps of the method of the invention for determining an arbitrary intensity distribution can be summarized, as shown in FIG. 29A. In the intensity distribution determination method 250, at the start 252 of the process, the fiber photodetector grid is at a selected angle with respect to the incident illumination. With this grid position, the photocurrent measurement data, from fiber photodetector columns of the fiber photodetector grid, is acquired 254. The acquired photocurrent data is transferred 256 to a computer or other computational system, and then the filtered backprojection for that data is calculated 258. This process is also carried out for the fiber photodetector rows of the photodetector grid in the selected angular position; the photocurrent measurement data from fiber rows of the grid is acquired 255 and transferred 257 to a computer, and then the filtered backprojection of the fiber row data is calculated 259.

With the backprojection from the fiber photodetector rows and columns complete, in a next step the two backprojections are combined 260 by summing to produce a full two-dimensional intensity distribution. It is then determined 262 if the resulting two-dimensional intensity distribution represents a clear image. If so, then the intensity distribution determination is complete and the process is ended 264. If the image represented by the two-dimensional intensity distribution is not clear, then the photodetector grid is rotated, 266, the object being imaged is rotated, or additional angular detection positions are otherwise suitably obtained. With the rotation complete, the process can again be started 252 to produce additional backprojections.

Referring to FIG. 29B there is shown the process flow for the step of calculating 258 the filtered backprojections. As explained above, in this backprojection process, first a line integral is obtained 270 at the grid angle, $\theta$. The one-dimensional Fourier transform of this line integral is then computed 272, and the backprojection filter is applied 274 to this result. Finally, the inverse Fourier transform (FT) is computed 276. Expressions 1-7 above provide the prescribed computations for each of these steps.

An example of application of the intensity distribution determination method of the invention is shown in FIGS. 30A-30F. In this example, a two-dimensional intensity distribution I(x, y) is provided composed of an ellipse, of intensity 2 in arbitrary units, with major and minor axis lengths of 6 and 4, respectively, and with a superimposed circle, of intensity 1, a. u., of diameter 2. The spatial dimensions of the distribution are in arbitrary units, with the overall area of interest, in these units, being an 8×8 square, assumed to be fully covered by a fiber photodetecting grid of the invention. This example intensity distribution is not separable in any two orthogonal directions, and thus is an example of an arbitrary intensity distribution that requires the determination technique provided by the invention.

Figure 30A:
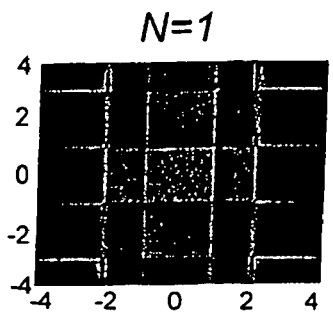
FIGS. 30A-30F are representations of reconstructed intensity distributions after selected iterations of the methods of FIGS. 29A-B.

In accordance with the invention, the intensity distribution technique of FIG. 29A-B was carried out using a 100×100 array of linear fiber photodetectors in the arrangement of FIG. 15. In a first pass of the technique, N=1, the backprojections from the horizontal fiber photodetector rows and the vertical fiber photodetector columns were determined, thereby providing projections at $\theta=0°$, and $\theta=90°$. This pass thus corresponds to implementing the backprojection algorithm with the photocurrent data collected at the rows and columns in a first orientation of the photodetection grid. The result of this first pass is shown in FIG. 30A; the result of the reconstruction is obviously separable and does not represent an accurate estimate of the distribution I(x, y).

Figure 30B:
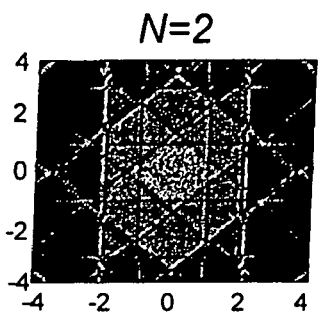
Figure 30C:
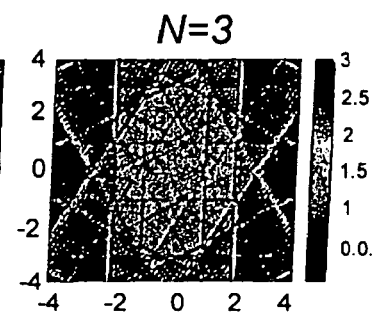
Figure 30D:
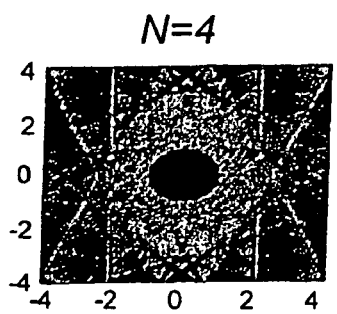
Figure 30E:
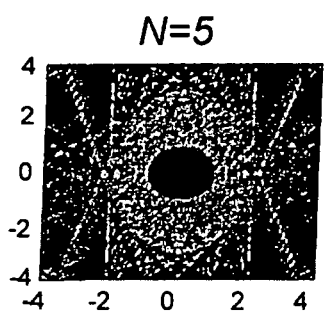
Figure 30F:
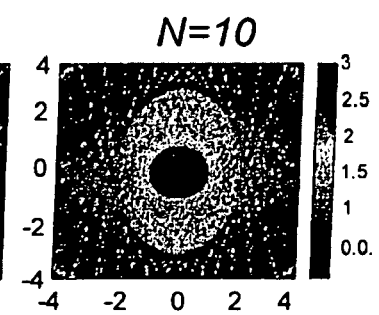

A second pass of the method, N=2, was then carried out with the additional step of rotating the grid by 45°, giving projection angles of $\theta=0°$, 45°, 90°, and 135°; this correspond to obtaining photocurrent data at the original grid orientation and with the grid rotated 45°, or equivalently using a grid comprising two layers, oriented at 45° with respect to each other. The result of the reconstructed intensity distribution is shown in FIG. 30B. This result is a more faithful reconstruction of the original intensity distribution I(x, y). By increasing the number of orientations of the grid at which photocurrent measurements are taken, a clear estimate of high fidelity is reconstructed. FIGS. 30C-30F provide the reconstructed intensity distributions that are produced after a number N, of projections from 3 to 10, respectively. It is shown that after only 3 projections the reconstructed intensity distribution starts to become clear, and that after 10 projections the original distribution is fully recovered.

This intensity distribution determination method of the invention can be employed for any application in which a two-dimensional intensity distribution is to be reconstructed from one-dimensional photocurrent signals. The method can be employed in operation of a single fiber photodetector grid or multiple grids. Time-dependent shifts in the intensity distribution can be detected, thereby addressing imaging applications for security and monitoring. It is not required that the intensity distribution determination method be employed for the lensless imaging techniques described below. The intensity distribution determination method can be employed alone for ascertaining an intensity distribution in a plane of interest as-required for a given application.

Now having described the technique of the invention for determining an arbitrary intensity distribution based on photodetection measurements from a fiber photodetector grid, the lensless imaging technique of the invention can be fully described. In accordance with the invention, lensless imaging is carried out employing a two-grid vectorial photodetector array like that of FIG. 20A. This vectorial photodetector array and the lensless imaging techniques of the invention enable the reconstruction of an object from the grids' intensity distribution measurements.

Figure 31:
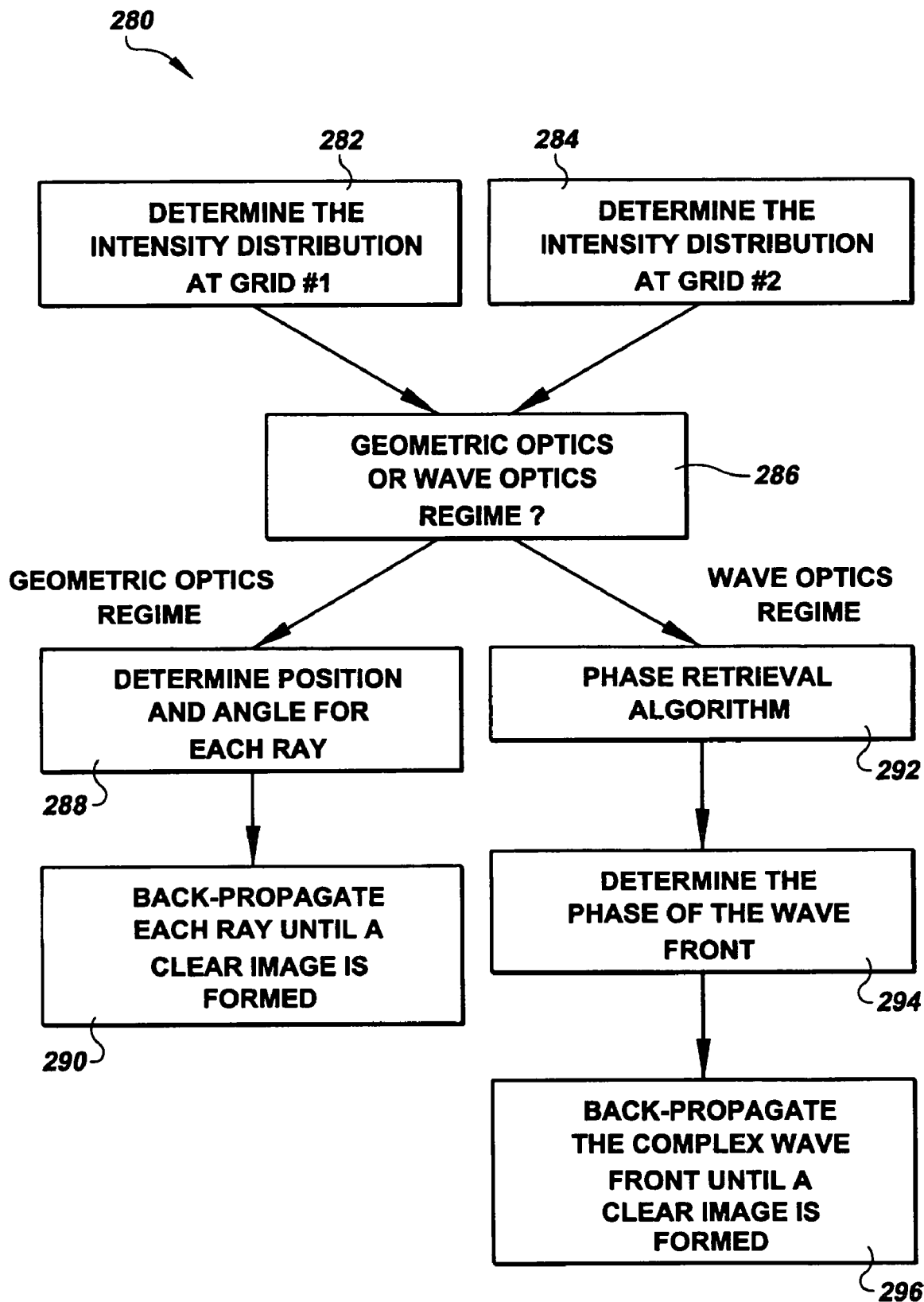
FIG. 31 is a flow chart of the steps in a method for lensless imaging provided by the invention.

Referring to FIG. 31, there are shown the steps of the lensless imaging method 280 of the invention. In a first step, the intensity distribution is determined 282 corresponding to photocurrent measurements obtained by the first grid of the two-grid system. The intensity distribution is further determined 284 corresponding to the photocurrent measurements obtained by the second grid of the two-grid system. The method described above and shown in FIGS. 29A-B is here employed for determining each intensity distribution.

With the back-projected intensity distributions for the two fiber photodetecting grids thusly determined, then in a next step the intensity distributions are compared to the illumination wavelength or wavelengths to determine if the object geometry places the system in the geometric optics regime or the wave optics regime. As explained previously, if the feature dimensions of the object being imaged are much larger than the illumination wavelength, then the intensity distributions can be analyzed in the geometric optics regime. Otherwise, the intensity distributions must be analyzed in the wave optics regime. In the geometric optics regime, the illumination distribution is not greatly changed from the first fiber photodetector grid to the second. In contrast, if there is a drastic difference between the illumination distribution from the first grid and the second, then there is indicated strong diffraction and a correspondingly small object, with illumination in the wave optics regime. It is to be recognized that wave optics analysis can be applied to a system in the geometric optics regime to produce a meaningful result, but that geometric optics analysis will not in general produce meaningful results for a system in the wave optics regime.

If it is found that the system is characterized by the geometric optics regime, then as shown in FIG. 31, to form an image there is first determined 288 the position and angle for each ray of the intensity distributions. These steps were described above and shown in the flow chart of FIG. 22. By position is here meant the intersection of a ray with a selected fiber photodetector grid, and by angle is meant the two angles a ray makes with the axes in its path between the two fiber grids. Once the position and angle are known for each ray, then in a next step each ray is back-propagated 290 until a clear image is formed, thereby to computationally image an object of interest without the use of a lens.

Given the intersection of a ray with the first fiber photodetector grid at coordinates (x, y), and angles $\theta_x$ and $\theta_y$ made by the ray and the axis of propagation, then back-propagation is carried out by conventional ray tracing with these parameters. For example, given a small-angle of propagation scenario, then at any reconstructed image plane back from the first fiber photodetector grid location, back-propagated ray coordinates are given as $x'=x-\theta_x d$, and $y'=y-\theta_y d$, where d is the distance from the first fiber photodetector grid location to the plane of back-propagation. For a large-angle scenario, then at any reconstructed image plane, back-propagated ray coordinates are given as $x'=x-\tan\theta_x \cdot d$, and $y'=y-\tan\theta_y \cdot d$. Back-propagation of all intensity distribution rays in this manner renders the image at its true distance from the fiber photodetection grids and with its true dimensions.

If it is found that the system is characterized by the wave optics regime, then as shown in FIG. 31, to form an image a phase retrieval algorithm 292 is implemented to determine 294 the phase of the illumination wavefront. The complex wavefront is then back-propagated 296 until a clear image is formed, thereby to computationally image an object of interest without the use of a lens.

Turning to the specifics of the phase retrieval algorithm, in its simplest form, this algorithm iteratively obtains the phase of a wavefront of illumination given that the amplitude of the illumination is known in two different planes. The two-grid fiber photodetector configuration of the invention, shown in FIG. 20A, provides two such planes, and the intensity distribution determination technique of the invention provides the illumination amplitudes at those planes. The lensless imaging technique exploits this amplitude-phase relationship to reconstruct an object from its diffracted intensity distributions through back-propagation.

One suitable example approach for this reconstruction of an unknown complex object, g(r), based on the amplitude information in the planes of the two fiber grids imposes an error metric that describes the distance between an estimate of the intensity distribution of the object and that measured at the two fiber photodetecting grids. A gradient-search technique can then be employed to minimize this error metric. To that end an error metric $\Delta$ can be expressed as:

$$\Delta = \int dr \sum_{n=1,2} (|G_n(r)|^2 - I_n(r))^2, \qquad (8)$$

where $G_n$ is the estimated diffracted field at the $n^{th}$ grid and $I_n$ is the measured intensity at that grid. For clarity of discussion, considering first a forward propagation process, then in the Fresnel approximation, G is given by:

$$G(r) = Ae^{ikr^2/2d} \int_S g(r')e^{ikr'^2/2d} e^{-ikr \cdot r'/d} dS \qquad (9)$$

$$= Ae^{ikr^2/2d} \mathfrak{F}\{g(r')e^{ikr'^2/2d}\},$$

where A is an amplitude, k is the wave number, d is the distance between the object and the grid, S is the object surface, and $\mathfrak{F}$ represents the Fourier transform. In practice with sampled data is employed for this analysis, and the discretized diffraction integral is instead employed, as:

$$G(u,v) = Ae^{ik(u^2+v^2)/2d} FFT\{g(n,m)e^{ik(n^2+m^2)/2d}\}, \qquad (10)$$

where n and m are discrete coordinates in the object plane, u and v are discrete coordinates in grid plane, and FFT stands for the Fast Fourier Transform. Back-propagation, rather than forward propagation, to determine the object of interest from which illumination has propagated, can correspondingly be determined by adjusting Expressions (9) and (10) for travel backwards, or at a distance −d to a plane of a fiber grid, resulting in, e.g., $$G(u,v)=Ae^{-ik(u^2+v^2)/2d}FFT\{g(n,m)e^{-ik(n^2+m^2)/2d}\}, \tag{11}$$

as the discretized diffraction integral.

With this back-propagation formulation, the minimization over the error metric, Δ, in Expression (8) is with respect to the set of two-dimensional variables {g(n,m)}, and is performed iteratively by repeating the following steps. First G is calculated for the data from both fiber grids using the previous guess of g. Then the error metric, Δ, and its partial derivatives with respect to g(n,m) are determined. The next estimate of g that reduces the error is then determined. These steps are repeated until the error metric converges to a minimal value, which ideally would be zero, but in practice is a finite number limited by the system noise. The Nyquist frequency for such a system is 1/L, where L is the size of g and the sampling rate corresponds to the fiber spacing <2πd/kL. The array size sets a cutoff for the spatial frequencies and therefore determines the sharpness and detail of the reconstructed image.

Figure 32A:
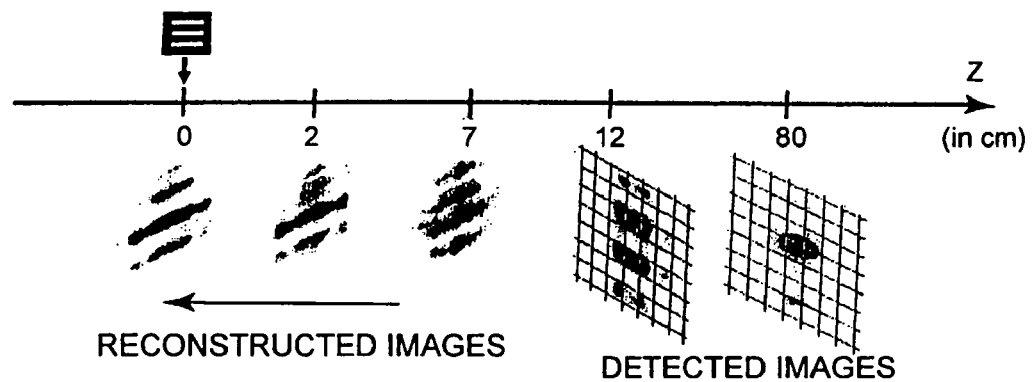
FIGS. 32A-32D are representations of reconstructed images produced by the lensless image method of FIG. 31 and the experimentally measured and calculated amplitude and phase of the optical field at three selected locations, respectively.

An example of this lensless imaging for the wave optics regime is illustrated in FIG. 32A. In this experimental example, an object was provided as a three-slit amplitude mask having slit widths of 158 μm, each separated by 158 μm. A Gaussian beam, from a Ti:Sapphire laser tuned to a wavelength of 830 nm, was incident perpendicularly on the mask, generating a Fresnel diffraction pattern 12 cm away from the mask with size of ~1 mm, and generating a Fraunhofer diffraction pattern 88 cm away from the mask with size of ~6.5 mm. The diffraction patterns here include the first order side lobes. These were patterns to match the array size. The resulting intensity pattern in the Fresnel and Fraunhofer diffraction planes were measured using the fiber photodetecting grids of the invention placed at the 12 cm and 88 cm distances. FIG. 32 depicts the detected images as determined at each of the two grids by the intensity distribution determination process of FIG. 22.

The phase retrieval algorithm and back-propagation steps of the imaging method 280 in FIG. 31 were then implemented using an optimization routine with MATLAB®, from The MathWorks, Natick, Mass., and the error function of Expression (8) above was minimized to obtain the reconstructed field at the plane of the mask. The iterative process converged after less then 20 iterations to an error of less then 1% in ~20 sec on a desktop PC with 2 GHz CPU and 1 GB of RAM. As shown in FIG. 32A, as the trial reconstruction locations approach the object plane, the image becomes more clear; all the estimates are blurred until the location of the object is approached, upon which a clear image is formed. Calculated field back-propagated beyond this object plane are blurred once again.

Figure 32B:
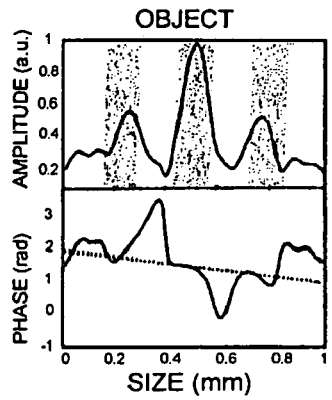
Figure 32C:
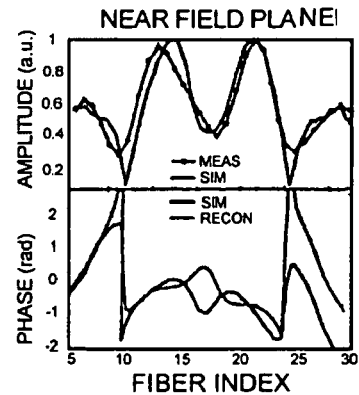
Figure 32D:
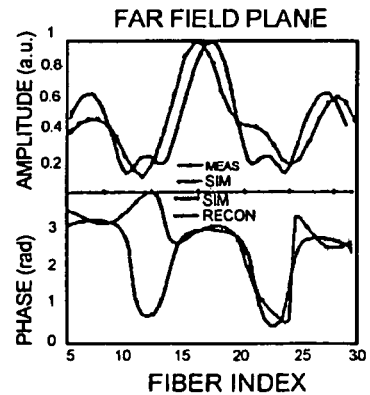

In FIGS. 32B, C, and D there are provided plots of both the measured and the calculated amplitude and phase of the optical field at three locations: the plane of the object, the plane of the near field fiber grid, and the plane of the far field fiber grid, respectively. The measured illumination amplitudes at the planes of the two fiber photodetecting grids are compared to the amplitudes calculated using the object by employing diffraction theory. The optical field was forward-propagated to the planes of the two fiber grids to determine the phase distribution there. These results are compared to a theoretical model that numerically propagates the field from a three-slit mask, modulated with a linear phase corresponding to the reconstructed slope at the object plane. The discrepancy between the reconstructed and calculated phases occurs only at those locations where the amplitude is small, and the phase is less meaningful. The reconstructed phase at the object plane reveals a linear phase distribution across the object plane instead of the expected zero phase, indicating that the plane of the slits was slightly tilted with respect to the incident beam wave front.

In accordance with the invention it is to be recognized that images of objects with more detail than the slit image just described preferably are reconstructed employing fiber photodetection grids with a correspondent number of fibers, i.e., a higher object detail requires a higher grid resolution capability. Considering other geometric parameters, the lensless imaging system of the invention has an infinite depth of focus, i.e., an image is formed of an object regardless of the distance of the object from the photodetecting grids, provided that the diffracted optical field, at the locations of the two grids, is intercepted. Furthermore, the image reproduces the object with the true physical object dimensions and also determines the physical distance of the object from the grids. The computational lensless imaging of the invention thereby provides richer image information than that achieved by conventional imaging methods. Although the experimental example described above made use of a coherent light source having an optical bandwidth of approximately 6 nm, a white light source can be used to illuminate an object of interest. In implementation of the lensless imaging method with a white light source in accordance with the invention, the phase retrieval algorithm is generalized to accommodate the characteristics of broadband light.

Once an object image is produced in accordance with the invention, then both the amplitude and phase of the object are achieved. This amplitude and phase information provides a complete representation of the object's optical field. Thus, any optical process can be computationally carried out on the image by manipulating the produced amplitude and phase data. For example, a hologram can be prepared based on the information provided by the lensless imaging technique. Further, there can be implemented object-recognition algorithms that benefit from the availability of the complex optical field instead of relying on a two-dimensional intensity image as is conventional.

Considering further aspects of the lensless imaging process of the invention, in principle, by virtue of obtaining a complete description of the electromagnetic field, lensless imaging can be employed to image three-dimensional objects that are translucent enough so that excessive occlusion does not occur. Furthermore, the fiber photodetectors of the detection grids can be designed in the manner given above to be wavelength-specific or responsive to different regions of the optical spectrum. With fiber photodetectors having optical sensitivity at different wavelengths, the lensless imaging technique produces color images.

With this discussion, it is shown that the invention provides both fiber photodetection apparatus and operational techniques for enabling a wide range of optical detection and computational imaging. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A fiber photodetector comprising:
a semiconducting element having a fiber length and being characterized as a non-composite semiconducting chalcogenide glass material selected from the group consisting of $(As_{40}Se_{60})_{1-x}Sn_x$, $As_{40}Se_{50}Te_{10}Sn_5$, and $As_2Se_3$, in at least one fiber direction;
at least one pair of conducting electrodes in contact with the semiconducting element along the fiber length; and
an insulator along the fiber length.

2. The fiber photodetector of claim 1 wherein the semiconducting element is characterized as a non-composite material along a circumferential fiber direction.

3. The fiber photodetector of claim 1 wherein the semiconducting element is characterized as a non-composite material along an axial fiber direction.

4. The fiber photodetector of claim 1 wherein the semiconducting element is continuous along a circumferential fiber direction.

5. The fiber photodetector of claim 1 wherein the semiconducting element is continuous along an axial fiber direction.

6. The fiber photodetector of claim 1 wherein the semiconducting element is homogeneous along a circumferential fiber direction.

7. The fiber photodetector of claim 1 wherein the semiconducting element is homogeneous along a circumferential fiber direction.

8. The fiber photodetector of claim 1 wherein the semiconducting element is characterized by an ability to be crystallized by at least one of optical illumination and elevated temperature.

9. The fiber photodetector of claim 1 wherein the semiconducting element includes glassy regions and crystalline regions.

10. The fiber photodetector of claim 1 wherein the semiconducting element is characterized by a bandgap that is less than about 3 eV.

11. The fiber photodetector of claim 10 wherein the semiconducting element is characterized by a bandgap that is less than about 2.5 eV.

12. The fiber photodetector of claim 11 wherein the semiconducting element is characterized by a bandgap that is less than about 2 eV.

13. The fiber photodetector of claim 1 wherein the semiconducting element comprises a solid semiconducting rod.

14. The fiber photodetector of claim 1 wherein the semiconducting element comprises a hollow semiconducting rod.

15. The fiber photodetector of claim 1 wherein the semiconducting element comprises a bulk semiconducting element.

16. The fiber photodetector of claim 1 wherein the semiconducting element comprises a solid semiconducting fiber core.

17. The fiber photodetector of claim 1 wherein the semiconducting element comprises a hollow semiconducting fiber core.

18. The fiber photodetector of claim 1 wherein the semiconducting element comprises a semiconducting layer.

19. The fiber photodetector of claim 1 wherein the semiconducting element comprises a circumferential semiconducting layer.

20. The fiber photodetector of claim 1 wherein the insulator is a circumferential protective fiber layer disposed at an outer surface of the fiber.

21. The fiber photodetector of claim 1 wherein the insulator is substantially transparent to at least one illumination wavelength.

22. The fiber photodetector of claim 1 wherein the conducting electrodes comprise metal electrodes.

23. The fiber photodetector of claim 1 wherein the conducting electrodes comprise metal alloy electrodes.

24. The fiber photodetector of claim 1 wherein the conducting electrodes comprise Sn electrodes.

25. The fiber photodetector of claim 1 wherein the conducting electrodes of each electrode pair are connected in a photodetector circuit to apply a bias voltage to the semiconducting element.

26. The fiber photodetector of claim 25 wherein the photodetector circuit is configured to measure an indication of photogenerated charge produced by the fiber photodetector.

27. The fiber photodetector of claim 26 wherein the photodetector circuit is configured to measure current as an indication of photogenerated charge produced by the fiber photodetector.

28. The fiber photodetector of claim 26 wherein the photodetector circuit is configured to measure capacitance as an indication of photogenerated charge produced by the fiber photodetector.

29. The fiber photodetector of claim 1 wherein the at least one pair of conducting electrodes comprises a plurality of pairs of conducting electrodes.

30. The fiber photodetector of claim 29 wherein the plurality of pairs of conducting electrodes are arranged at selected positions on the semiconducting element and with connections to apply corresponding bias voltages to the semiconducting element for determining incident illumination directionality.

31. The fiber photodetector of claim 1 wherein each conducting electrode is geometrically confined by the semiconducting element and the insulator.

32. The fiber photodetector of claim 1 arranged in a photodetecting fiber grid having a plurality of rows of fiber photodetectors and a plurality of columns of fiber photodetectors, each fiber photodetector including a semiconducting element having a fiber length and being continuous along at least one fiber direction, at least one pair of conducting electrodes in contact with the semiconducting element along the fiber length, and an insulator along the fiber length; wherein each fiber photodetector is connected to a sensing circuit for detecting fiber grid coordinates of illumination incident on the fiber grid.

33. The fiber photodetector of claim 32 wherein at least one fiber photodetector in the fiber grid includes an optical resonator disposed along the fiber length and along a path of illumination to the semiconducting element, the resonator being dimensioned to substantially reflect all illumination wavelengths except for a prescribed range of wavelengths transmitted to the semiconducting element.

34. The fiber photodetector of claim 1 arranged in a photodetecting fiber fabric having a plurality of fiber photodetectors woven together, each fiber photodetector including a semiconducting element having a fiber length and being continuous along at least one fiber direction, at least one pair of conducting electrodes in contact with the semiconducting element along the fiber length, and an insulator along the fiber length; wherein each fiber photodetector is connected to a sensing circuit for detecting illumination incident on the fiber fabric.

35. The fiber fabric of claim 34 wherein at least one fiber photodetector in the fiber fabric includes an optical resonator disposed along the fiber length and along a path of illumination to the semiconducting element, the resonator being dimensioned to substantially reflect all illumination wavelengths except for a prescribed range of wavelengths transmitted to the semiconducting element.

36. A photodetecting fiber grid comprising:
a plurality of rows of fiber photodetectors;
a plurality of columns of fiber photodetectors;
wherein each fiber photodetector includes a semiconducting element having a fiber length and is characterized as a non-composite semiconducting chalcogenide glass material selected from the group consisting of $(As_{40}Se_{60})_{1-x}Sn_x$, $As_{40}Se_{50}Te_{10}Sn_5$, and $As_2Se_3$, in at least one fiber direction, at least one pair of conducting electrodes in contact with the semiconducting element along the fiber length, and an insulator along the fiber length; and
wherein each fiber photodetector is connected to a sensing circuit for detecting coordinates of illumination incident on the fiber grid.

37. The photodetecting fiber grid of claim 36 wherein a number, 2N, of fiber photodetectors are included in the fiber grid and the detected fiber grid illumination coordinates are characterized by a detection resolution of $N^2$.

38. The photodetecting fiber grid of claim 36 wherein at least one fiber photodetector in the fiber grid includes an optical resonator disposed along the fiber length and along a path of illumination to the semiconducting element, the resonator being dimensioned to substantially reflect all illumination wavelengths except for a prescribed range of wavelengths transmitted to the semiconducting element.

39. The photodetecting fiber grid of claim 38 wherein each fiber grid row comprises a plurality of the fiber photodetectors, at least one fiber photodetector in the row including an optical resonator disposed along the fiber length and along a path of illumination to the semiconducting element, the resonator being dimensioned to substantially reflect all illumination wavelengths except for a prescribed range of wavelengths transmitted to the semiconducting element.

40. The photodetecting fiber grid of claim 39 wherein each fiber photodetector in a fiber grid row includes an optical resonator disposed along the fiber length and along a path of illumination to the semiconducting element, the resonator being dimensioned to substantially reflect all illumination wavelengths except for a prescribed range of wavelengths, substantially distinct to that fiber photodetector, that are transmitted to the semiconducting element.

41. The photodetecting fiber grid of claim 38 wherein each fiber grid column comprises a plurality of the fiber photodetectors, at least one fiber photodetector in the column including an optical resonator disposed along the fiber length and along a path of illumination to the semiconducting element, the resonator being dimensioned to substantially reflect all illumination wavelengths except for a prescribed range of wavelengths transmitted to the semiconducting element.

42. The photodetecting fiber grid of claim 41 wherein each fiber photodetector in a fiber grid column includes an optical resonator disposed along the fiber length and along a path of illumination to the semiconducting element, the resonator being dimensioned to substantially reflect all illumination wavelengths except for a prescribed range of wavelengths, substantially distinct to that fiber photodetector, that are transmitted to the semiconducting element.

43. The photodetecting fiber grid of claim 36 further comprising a printed circuit board frame to which each grid row and grid column is connected for acquiring photogenerated charge.

44. The photodetecting fiber grid of claim 36 wherein the sensing circuit includes an analog-to-digital converter.

45. The photodetecting fiber grid of claim 36 wherein the sensing circuit includes a signal amplifier.

46. The photodetecting fiber grid of claim 36 wherein the sensing circuit includes a multiplexer connected to multiplex photogenerated charge signals from the fiber grid rows and columns.

47. The photodetecting fiber grid of claim 36 wherein the sensing circuit includes a connection for delivering acquired photogenerated charge signals to a computer.

48. The photodetecting fiber grid of claim 47 wherein the computer is programmed to compare the acquired photogenerated charge signals and determine a grid row having a maximum charge signal and a grid column having a maximum charge signal, indicating the coordinates of illumination incident on the fiber grid.

49. The photodetecting fiber grid of claim 36 wherein the grid is disposed in a substantially transparent medium.

50. The photodetecting fiber grid of claim 49 wherein the transparent medium comprises a glass.

51. The photodetecting fiber grid of claim 49 wherein the transparent medium comprises a plastic.

52. The photodetecting fiber grid of claim 36 wherein the grid is disposed adjacent to a computer screen and connected to a computer graphical user interface programmed to control the screen display in response to illumination incident on the fiber grid.

53. The photodetecting fiber grid of claim 36 wherein the grid rows and columns are arranged in a two-dimensional structure.

54. The photodetecting fiber grid of claim 36 wherein the grid rows and columns are arranged in a three-dimensional structure.

55. The photodetecting fiber grid of claim 54 wherein the three-dimensional structure comprises a sphere.

56. The photodetecting fiber grid of claim 54 wherein the three-dimensional structure comprises a rectangular structure.

57. The photodetecting fiber grid of claim 36 wherein the grid rows and columns are arranged to generally follow surface contours of an object over which the grid is disposed.

58. A fiber photodetector comprising:
a semiconducting element having a fiber length and being characterized as a non-composite material in at least one fiber direction;
at least one pair of conducting electrodes in contact with the semiconducting element along the fiber length;
an insulator along the fiber length; and
an optical resonator disposed along the fiber length and along a path of illumination to the semiconducting element, the resonator being dimensioned to substantially reflect all illumination wavelengths except for a prescribed range of wavelengths transmitted to the semiconducting element.

59. The fiber photodetector of claim 58 wherein the optical resonator is disposed along the fiber length concentrically with the semiconducting element.

60. The fiber photodetector of claim 58 wherein the optical resonator comprises a cascade of optical resonators that together substantially reflect all illumination wavelengths except for a prescribed range of wavelengths transmitted to the semiconducting element.

61. The fiber photodetector of claim 58 wherein the optical resonator comprises a resonant cavity bound by dielectric mirror structures.

62. The fiber photodetector of claim 61 wherein the optical resonant cavity comprises an insulator.

63. The fiber photodetector of claim 61 wherein the dielectric mirror structures each comprise alternating layers of a semiconductor and an insulator.

64. The fiber photodetector of claim 61 wherein the thicknesses of the resonant cavity and dielectric mirror structures are dimensioned to transmit a prescribed range of wavelengths around a selected center wavelength.

65. A fiber photodetector comprising:
a plurality of concentric circumferential layers of semiconducting elements each having a fiber length and being characterized as a non-composite material in at least one fiber direction, and separated by an insulator, and each in contact with at least one pair of conducting electrodes along the fiber length; and
an insulator alone the fiber length.

66. The fiber photodetector of claim 65 wherein the plurality of semiconducting elements comprise bulk semiconducting elements disposed across a fiber cross section.

67. A fiber photodetector comprising:
a semiconductor element having a fiber length and being characterized as a non-composite material in at least one fiber direction;
at least one pair of conducting electrodes in contact with the semiconducting element along the fiber length; and
a polymeric insulating material selected from the group of poly-ether imide, poly-ether sulfone, and poly-methyl methacrylate, along the fiber length.

68. The fiber photodetector of claim 67 wherein the polymeric insulating material comprises a polymeric layer.

69. A fiber photodetector comprising:
a semiconducting element having a fiber length and being characterized as a non-composite material in at least one fiber direction;
at least one pair of conducting electrodes in contact with the semiconducting element along the fiber length; and
an insulating alone the fiber length;
wherein photodetection properties characteristic of the fiber photodetector are maintained at an operating temperature of at least about 150° C. and a duration of at least about 24 hours.

70. The fiber photodetector of claim 69 wherein photodetection properties characteristic of the fiber photodetector are maintained at an operating temperature of at least about 200° C. and a duration of at least about 24 hours.

71. A photodetecting fiber fabric comprising:
a plurality of fiber photodetectors woven together;
wherein each fiber photodetector includes a semiconducting element having a fiber length and is characterized as a non-composite semiconducting chalcogenide glass material selected from the group consisting of $(As_{40}Se_{60})_{1-x}Sn_x$, $As_{40}Se_{50}Te_{10}Sn_5$, and $As_2Se_3$, in at least one fiber direction, at least one pair of conducting electrodes in contact with the semiconducting element along the fiber length, and an insulator along the fiber length; and
wherein each fiber photodetector is connected to a sensing circuit for detecting illumination incident on the fiber fabric.

72. The photodetecting fiber fabric of claim 71 wherein at least a portion of the plurality of woven fiber photodetectors each includes an optical resonator disposed along the fiber length and along a path of illumination to the semiconducting element, the resonator being dimensioned to substantially reflect all illumination wavelengths except for a prescribed range of wavelengths, substantially distinct to that fiber photodetector, that are transmitted to the semiconducting element.

73. The photodetecting fiber fabric of claim 71 wherein at least one of the woven fiber photodetectors comprises a hollow-core fiber photodetector.

74. A fiber photodetector comprising:
a photoconductive element having a fiber length;
at least one pair of conducting electrodes in contact with the photoconductive element along the fiber length; and
an insulator along the fiber length;
the photoconductive element, conducting electrodes, and insulator being disposed in a geometric relationship corresponding to a drawing preform of the fiber.

75. A fiber photodetector comprising:
a photoconductive element having a fiber length;
at least one pair of conducting electrodes in contact with the photoconductive element along the fiber length; and
an insulator along the fiber length;
the photoconductive element, conducting electrodes, and insulator each being characterized by a viscosity that is less than about $10^6$ Poise, while maintaining structural material integrity, at a common fiber draw temperature.

76. The fiber photodetector of claim 75 wherein a one of the photoconductive element, electrodes, and insulator that constitutes a majority volume of material of the fiber is further characterized by a viscosity that is greater than about $10^4$ Poise.

77. A fiber photodetector comprising:
a photoconductive element having a fiber length;
at least one pair of conducting electrodes in contact with the photoconductive element along the fiber length; and
an insulator along the fiber length;
the photoconductive element, conducting electrodes, and insulator each being characterized by a viscosity that is less than about $10^6$ Poise, while maintaining material properties, at a common fiber draw temperature.

* * * * *